(12) United States Patent
Kurokawa

(10) Patent No.: US 10,674,168 B2
(45) Date of Patent: Jun. 2, 2020

(54) SEMICONDUCTOR DEVICE AND ELECTRONIC DEVICE

(71) Applicant: Semiconductor Energy Laboratory Co., Ltd., Atsugi-shi, Kanagawa-ken (JP)

(72) Inventor: Yoshiyuki Kurokawa, Sagamihara (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 16/411,663

(22) Filed: May 14, 2019

(65) Prior Publication Data

US 2019/0342565 A1 Nov. 7, 2019

Related U.S. Application Data

(63) Continuation of application No. 15/296,575, filed on Oct. 18, 2016, now abandoned.

(30) Foreign Application Priority Data

Oct. 23, 2015 (JP) .................................. 2015-208504
Nov. 24, 2015 (JP) .................................. 2015-228379

(51) Int. Cl.
*H04N 19/423* (2014.01)
*H01L 27/12* (2006.01)
(Continued)

(52) U.S. Cl.
CPC ............ *H04N 19/423* (2014.11); *G06N 3/04* (2013.01); *G06N 3/063* (2013.01); *G06N 3/08* (2013.01);
(Continued)

(58) Field of Classification Search
CPC .... H04N 19/423; H04N 19/90; H04N 19/527; H04N 19/543; H04N 19/43; G06N 3/04;
(Continued)

(56) References Cited

U.S. PATENT DOCUMENTS 5,047,655 A 9/1991 Chambost et al.
5,063,492 A * 11/1991 Yoda ........................ B25J 9/161
                                                       700/61
(Continued)

FOREIGN PATENT DOCUMENTS

EP   1737044 A   12/2006
EP   2226847 A    9/2010
(Continued)

OTHER PUBLICATIONS

Morie, T., et al., "Neural network circuit," English Translation of Japanese Patent Publication H04-216160 A, Aug. 1992.*

(Continued)

*Primary Examiner* — Xuemei G Chen
(74) *Attorney, Agent, or Firm* — Robinson Intellectual Property Law Office; Eric J. Robinson

(57) ABSTRACT

A semiconductor device with a novel structure is provided. Input neuron circuits, hidden neuron circuits, and output neuron circuits are hierarchically connected to one another through plural synapse circuits. Each synapse circuit includes an analog memory which stores data corresponding to a connection strength between the input neuron circuit and the hidden neuron circuit or between the hidden neuron circuit and the output neuron circuit, a writing circuit which changes the data in the analog memory, and a weighting circuit which outputs an output signal obtained by weighting an input signal in accordance with data in the analog memory. The analog memory is formed using a transistor including an oxide semiconductor having extremely low off-state current. It is not necessary to mount a large-scale capacitor for holding data and to recover analog data by regular refresh operation; thus, reduction in a chip area and reduction in power consumption are possible.

6 Claims, 35 Drawing Sheets

(51) Int. Cl.

| | | |
|---|---|---|
| *G11C 27/02* | (2006.01) | |
| *G06T 9/00* | (2006.01) | |
| *H04N 19/90* | (2014.01) | |
| *G06N 3/08* | (2006.01) | |
| *G06N 3/063* | (2006.01) | |
| *H04N 19/43* | (2014.01) | |
| *H04N 19/527* | (2014.01) | |
| *H04N 19/543* | (2014.01) | |
| *G06N 3/04* | (2006.01) | |
| *G11C 27/00* | (2006.01) | |
| *H01L 29/24* | (2006.01) | |
| *H01L 29/786* | (2006.01) | |

(52) U.S. Cl.
CPC ............ *G06T 9/002* (2013.01); *G11C 27/005* (2013.01); *G11C 27/024* (2013.01); *H01L 27/1225* (2013.01); *H01L 29/24* (2013.01); *H01L 29/7869* (2013.01); *H01L 29/78642* (2013.01); *H01L 29/78648* (2013.01); *H01L 29/78696* (2013.01); *H04N 19/43* (2014.11); *H04N 19/527* (2014.11); *H04N 19/543* (2014.11); *H04N 19/90* (2014.11)

(58) Field of Classification Search
CPC .......... G06N 3/063; G06N 3/08; G06T 9/002; H01L 29/7869; H01L 29/78648; H01L 29/78642; H01L 29/78696; H01L 29/24; H01L 27/1225; G11C 27/024; G11C 27/005
See application file for complete search history.

(56) References Cited

U.S. PATENT DOCUMENTS

| | | | |
|---|---|---|---|
| 5,071,171 A | 12/1991 | Perratone | |
| 5,093,803 A | 3/1992 | Howard et al. | |
| 5,155,802 A | 10/1992 | Mueller et al. | |
| 5,268,320 A | 12/1993 | Holler et al. | |
| 5,283,855 A * | 2/1994 | Motomura | G06N 3/04 706/25 |
| 5,588,091 A * | 12/1996 | Alkon | G06K 9/4628 706/31 |
| 5,592,589 A * | 1/1997 | Poon | G06N 3/08 706/25 |
| 5,604,820 A | 2/1997 | Ono | |
| 5,604,823 A | 2/1997 | Ono | |
| 5,619,593 A | 4/1997 | Ono | |
| 5,731,856 A | 3/1998 | Kim et al. | |
| 5,740,274 A | 4/1998 | Ono et al. | |
| 5,744,864 A | 4/1998 | Cillessen et al. | |
| 5,751,831 A | 5/1998 | Ono | |
| 5,822,742 A * | 10/1998 | Alkon | G06K 9/4628 706/31 |
| 5,878,165 A | 3/1999 | Ono | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,054,850 B2 * | 5/2006 | Matsugu | G06K 9/00973 706/48 |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,295,687 B2 | 11/2007 | Kee et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,707,128 B2 * | 4/2010 | Matsugu | G06N 3/049 706/18 |
| 7,732,819 B2 | 6/2010 | Akimoto et al. | |
| 7,814,038 B1 * | 10/2010 | Repici | G06N 3/08 706/25 |
| 7,958,071 B2 * | 6/2011 | Snider | G06N 3/063 706/26 |
| 8,103,606 B2 * | 1/2012 | Moussa | G06N 3/084 706/31 |
| 8,630,130 B2 * | 1/2014 | Kurokawa | H01L 27/0688 365/189.05 |
| 8,692,243 B2 * | 4/2014 | Kamata | H01L 21/76254 257/43 |
| 8,785,996 B2 | 7/2014 | Colli et al. | |
| 8,832,009 B2 * | 9/2014 | Rose | G06N 3/0635 706/25 |
| 8,921,894 B2 * | 12/2014 | Ando | H01L 29/2003 257/194 |
| 9,048,832 B2 * | 6/2015 | Kozuma | H03K 19/17748 |
| 9,245,589 B2 * | 1/2016 | Aoki | G11C 5/06 |
| 9,305,256 B2 * | 4/2016 | Sarah | G06N 3/049 |
| 9,349,454 B2 * | 5/2016 | Ikeda | G11C 16/0441 |
| 9,368,053 B2 * | 6/2016 | Koyama | G09G 3/20 |
| 9,443,190 B2 * | 9/2016 | Hunzinger | G06N 3/049 |
| 9,501,739 B2 * | 11/2016 | Matsuoka | G06N 3/08 |
| 9,654,107 B2 * | 5/2017 | Kurokawa | H03K 19/17784 |
| 9,829,946 B2 * | 11/2017 | Miwa | G06F 1/26 |
| 9,899,420 B2 * | 2/2018 | Yamazaki | H01L 27/1225 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0028705 A1 | 2/2003 | Arima | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0083193 A1 * | 4/2004 | Shi | G06N 3/063 706/26 |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |

(56) References Cited

U.S. PATENT DOCUMENTS

| | | |
|---|---|---|
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0044773 A1* | 2/2010 | Ishigaki ............ H01L 27/11521 257/320 |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0004579 A1 | 1/2011 | Snider |
| 2012/0038409 A1 | 2/2012 | Colli et al. |
| 2015/0088796 A1* | 3/2015 | Julian .................. G06N 3/0454 706/25 |
| 2015/0178619 A1 | 6/2015 | Nishitani et al. |
| 2015/0269481 A1* | 9/2015 | Annapureddy ....... G06N 3/0445 706/21 |
| 2016/0110644 A1* | 4/2016 | Huang ................ G11C 13/0007 706/25 |
| 2016/0343452 A1 | 11/2016 | Ikeda et al. |
| 2017/0017285 A1* | 1/2017 | Kurokawa ................. G06F 1/32 |
| 2017/0063351 A1 | 3/2017 | Kurokawa |
| 2017/0083469 A1 | 3/2017 | Catthoor et al. |
| 2017/0116512 A1* | 4/2017 | Kurokawa ............. G06N 3/063 |
| 2017/0134020 A1* | 5/2017 | Kurokawa ........... H03K 17/687 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 04-216160 A | 8/1992 |
| JP | 05-012466 A | 1/1993 |
| JP | 05-251705 A | 9/1993 |
| JP | 06-187472 A | 7/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2009-296353 A | 12/2009 |
| WO | WO-2004/114391 | 12/2004 |

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue", PHYS. REV. A (Physical Review. A), May 1, 1984, vol. 29, No. 5, pp. 2957-2959.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", APPL. PHYS. LETT. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Display", AM-FPD '08 Digest of Technical Papers, Jul. 2, 2008, pp. 251-252, The Japan Society of Applied Physics.

Godo.H et al., "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Hayashi.R et al., "42.1: Invited Paper: Improved Amorphous In—Ga—Zn—O TFTS", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTS) for AMLCDS", J. SOC. INF. Display (Journal of the Society for Information Display), 2007, vol. 15, No. 1, pp. 17-22.

Hosono.H et al., "Working hypothesis to explore novel wide band gap electrically conducting amorphous oxides and examples", J. Non-CRYST. Solids (Journal of Non-Crystalline Solids), 1996, vol. 198-200, pp. 165-169.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

(56) References Cited

OTHER PUBLICATIONS

Janotti.A et al., "Native Point Defects in ZnO", PHYS. REV. B (Physical Review. B), Oct. 4, 2007, vol. 76, No. 16, pp. 165202-1-165202-22.
Janotti.A et al., "Oxygen Vacancies in ZnO", APPL. PHYS. LETT. (Applied Physics Letters), 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5″) Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Emploing MoO3 as a Charge-Generation Layer", ADV. MATER. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.
Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga or Al; B: Mg, Mn, Fe, Ni, Cu, OR, Zn] at Temperatures over 1000° C", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", PHYS. REV. LETT. (Physical Review Letters), Jan. 26, 2007, vol. 98, pp. 045501-1-045501-4.
Lee.H et al., "Current Status of, Challenges to, and Perspective View of AM-OLED ", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. APPL. PHYS. (Journal of Applied Physics), Feb. 1, 2003, vol. 93, No. 3, pp. 1624-1630.
Meiboom.S et al., "Theory of the Blue Phase of Cholesteric Liquid Crystals", PHYS. REV. LETT. (Physical Review Letters), May 4, 1981, vol. 46, No. 18, pp. 1216-1219.
Miyasaka.M, "Suftla Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M et al., "The phase relations in the In2O3—Ga2ZnO4—ZnO system at 1350° C", Journal of Solid State Chemistry, Aug. 1, 1991, vol. 93, No. 2, pp. 298-315.
Nakamura.M, "Synthesis of Homologous Compound with New Long-Period Structure", NIRIM Newsletter, Mar. 1, 1995, vol. 150, pp. 1-4.
Nomura.K et al., "Amorphous Oxide Semiconductors for High-Performance Flexible Thin-Film Transistors", JPN. J. APPL. PHYS. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", APPL. PHYS. LETT. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.
Oba.F et al., "Defect energetics in ZnO: A hybrid Hartree-Fock density functional study", PHYS. REV. B (Physical Review. B), 2008, vol. 77, pp. 245202-1-245202-6.
Oh.M et al., "Improving the Gate Stability of ZnO Thin-Film Transistors With Aluminum Oxide Dielectric Layers", J. ELECTROCHEM. SOC. (Journal of the Electrochemical Society), 2008, vol. 155, No. 12, pp. H1009-H1014.
Ohara.H et al., "21.3:4.0 In. QVGA AMOLED Display Using In—Ga—Zn-Oxide TFTS With a Novel Passivation Layer", SID Digest '09 : SID International Symposium Digest of Technical Papers, May 31, 2009. pp. 284-287.
Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.
Orita.M et al., "Amorphous transparent conductive oxide InGaO3(ZnO)m (m<4):a Zn4s conductor", Philosophical Magazine, 2011, vol. 81, No. 5, pp. 501-515.
Orita.M et al., "Mechanism of Electrical Conductivity of Transparent InGaZnO4", PHYS. REV. B (Physical Review. B), Jan. 15, 2000, vol. 61, No. 3, pp. 1811-1816.
Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.
Osada.T et al., "Development of Driver-Integrated Panel Using Amorphous In—Ga—Zn-Oxide TFT", AM-FPD '09 Digest of Technical Papers, Jul. 1, 2009, pp. 33-36.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Park.J et al., "Dry etching of ZnO films and plasma-induced damage to optical properties", J. VAC. SCI. TECHNOL. B (Journal of Vacuum Science & Technology B), Mar. 1, 2003, vol. 21, No. 2, pp. 800-803.
Park.J et al., "Electronic Transport Properties of Amorphous Indium-Gallium-Zinc Oxide Semiconductor Upon Exposure to Water", APPL. PHYS. LETT. (Applied Physics Letters) , 2008, vol. 92, pp. 072104-1-072104-3.
Park.J et al., "High performance amorphous oxide thin film transistors with self-aligned top-gate structure", IEDM 09: Technical Digest of International Electron Devices Meeting, Dec. 7, 2009, pp. 191-194.

(56) References Cited

OTHER PUBLICATIONS

Park.J et al., "Improvements in the Device Characteristics of Amorphous Indium Gallium Zinc Oxide Thin-Film Transistors by Ar Plasma Treatment", APPL. PHYS. LETT. (Applied Physics Letters), Jun. 26, 2007, vol. 90, No. 26, pp. 262106-1-262106-3.
Park.S et al., "Challenge to Future Displays: Transparent AM-OLED Driven by PEALD Grown ZnO TFT", IMID '07 Digest, 2007, pp. 1249-1252.
Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.
Prins.M et al., "A Ferroelectric Transparent Thin-Film Transistor", APPL. PHYS. LETT. (Applied Physics Letters), Jun. 17, 1996, vol. 68, No. 25, pp. 3650-3652.
Sakata.J et al., "Development of 4.0-In. AMOLED Display With Driver Circuit Using Amorphous In—Ga—Zn-Oxide TFTS", IDW '9 : Proceedings of the 16th International Display Workshops, 2009, pp. 689-692.
Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Ueno.K et al., "Field-Effect Transistor on SrTiO3 With Sputtered Al2O3 Gate Insulator", APPL. PHYS. LETT. (Applied Physics Letters), Sep. 1, 2003, vol. 83, No. 9, pp. 1755-1757.
Van de Walle.C, "Hydrogen as a Cause of Doping in Zinc Oxide", PHYS. REV. LETT. (Physical Review Letters), Jul. 31, 200, vol. 85, No. 5, pp. 1012-1015.
Arima.Y et al., "A Self-Learning Neural Network Chip with 125 Neurons and 10K Self-Organization Synapses", IEEE Journal of Solid-State Circuits, Apr. 1, 1991, vol. 26, No. 4, pp. 607-611.
Arima.Y et al., "A 336-Neuron, 28K-Synapse, Self-Learning Neural Network Chip with Branch-Neuron-Unit Architecture", IEEE Journal of Solid-State Circuits, Nov. 1, 1991, vol. 26, No. 11, pp. 1637-1644.
Arima.Y et al., "A Refreshable Analog VLSI Neural Network Chip with 400 Neurons and 40K Synapses", IEEE Journal of Solid-State Circuits, Dec. 1, 1992, vol. 27, No. 12, pp. 1854-1861.
Katayama.E et al., "A Method for Peak Position Estimation of Cross Correlation Functions Using Neural Network", ITE Technical Report, Mar. 2, 2001, vol. 25, No. 22, pp. 21-24.
Morie.T et al., "Analog VLSI Implementation of Adaptive Algorithms by an Extended Hebbian Synapse Circuit", IEICE TRANS. ELECTRON. (IEICE Transactions on Electronics), Mar. 1, 1992, vol. E75-C, No. 3, pp. 303-311.
International Search Report (Application No. PCT/IB2016/056240) dated Dec. 13, 2016.
Written Opinion (Application No. PCT/IB2016/056240) dated Dec. 13, 2016.
Kawashima.S et al., "13.3-in. 8K × 4K 664-ppi OLED Display Using CAAC-OS FETs", SID Digest '14 : SID International Symposium Digest of Technical Papers, Jun. 3, 2014, pp. 627-630.

\* cited by examiner

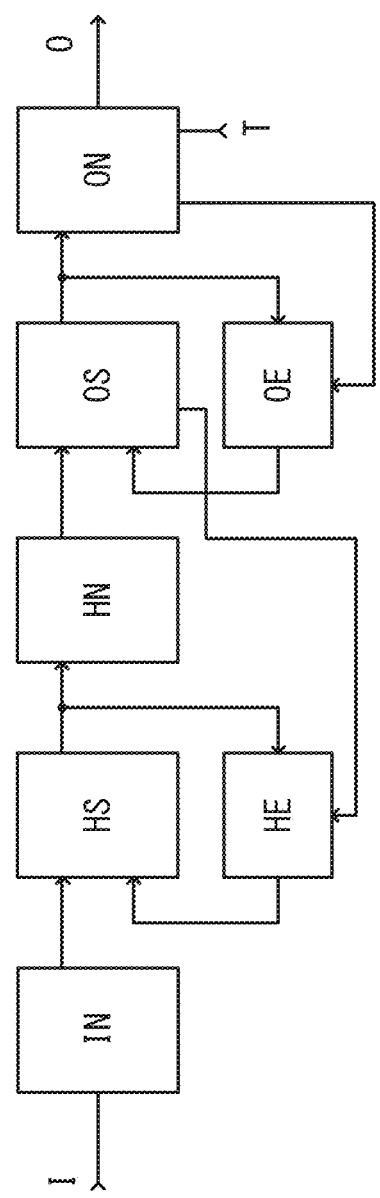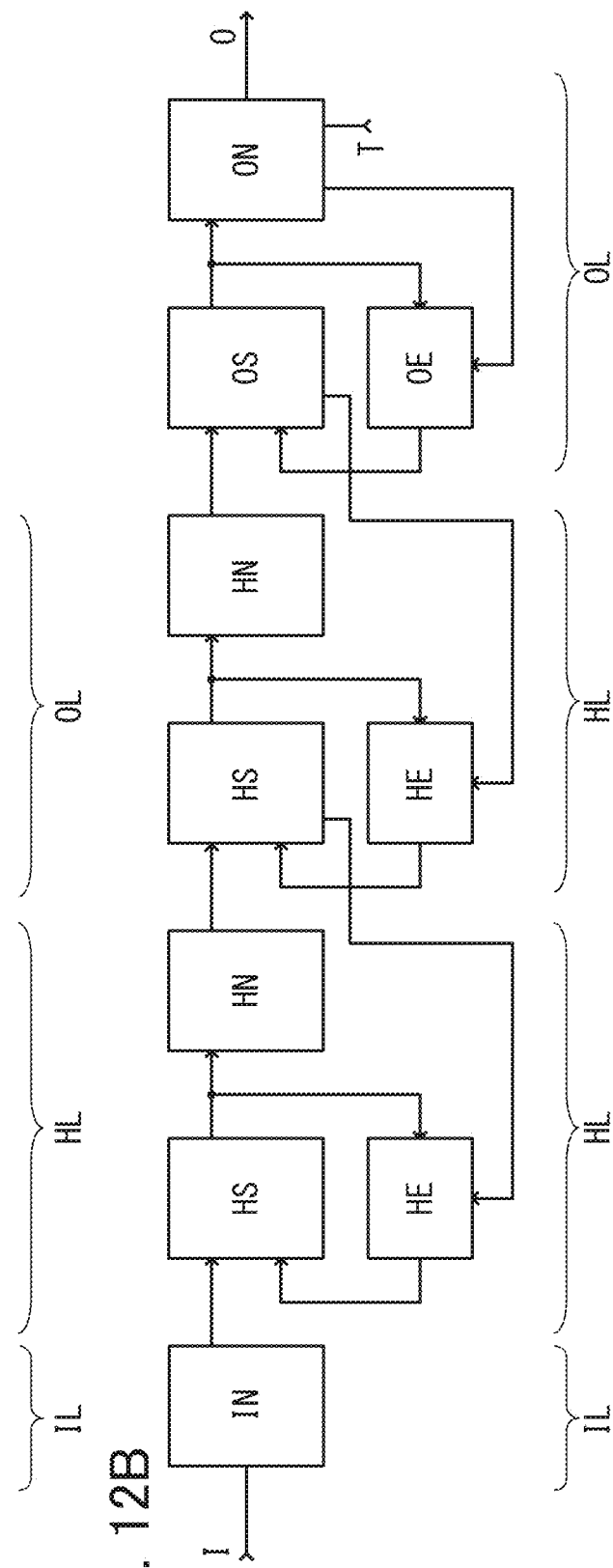
FIG. 12A
FIG. 12B

FIG. 15A
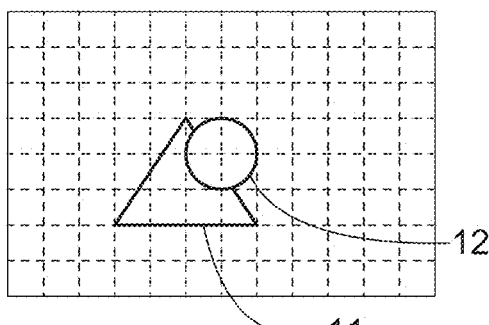
FIG. 15B
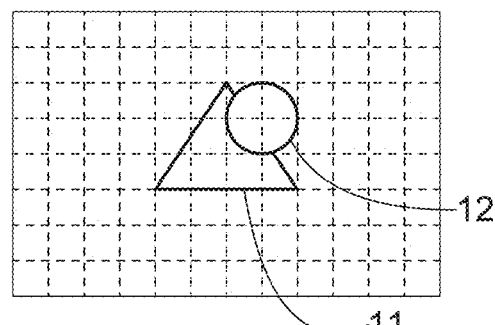
FIG. 15C
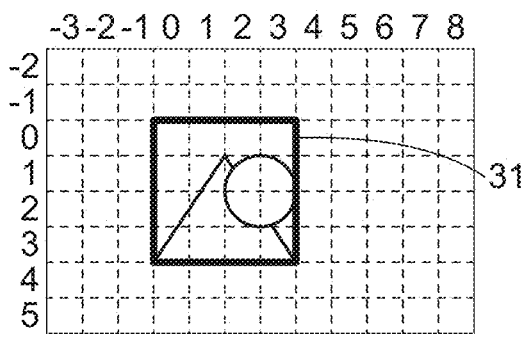
FIG. 15D
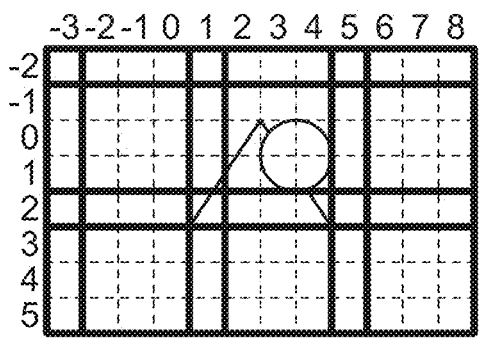
FIG. 15E
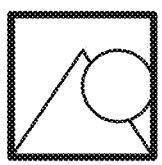
FIG. 15F
(-3,-2) 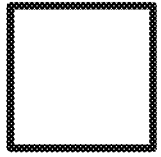   (-2,-2) 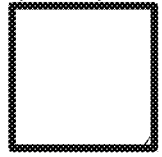   (1,-2) 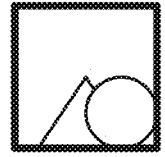   (5,-2) 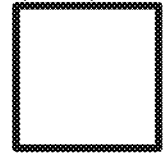
(-3,-1) 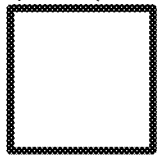   (-2,-1) 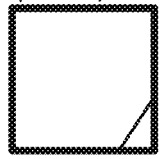   (1,-1) 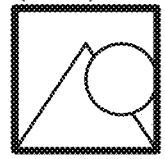   (5,-1) 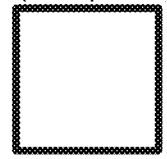
(-3,2) 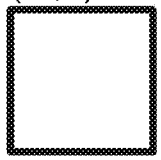   (-2,2) 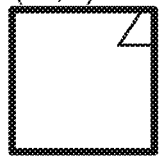   (1,2) 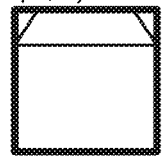   (5,2) 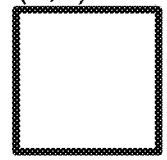

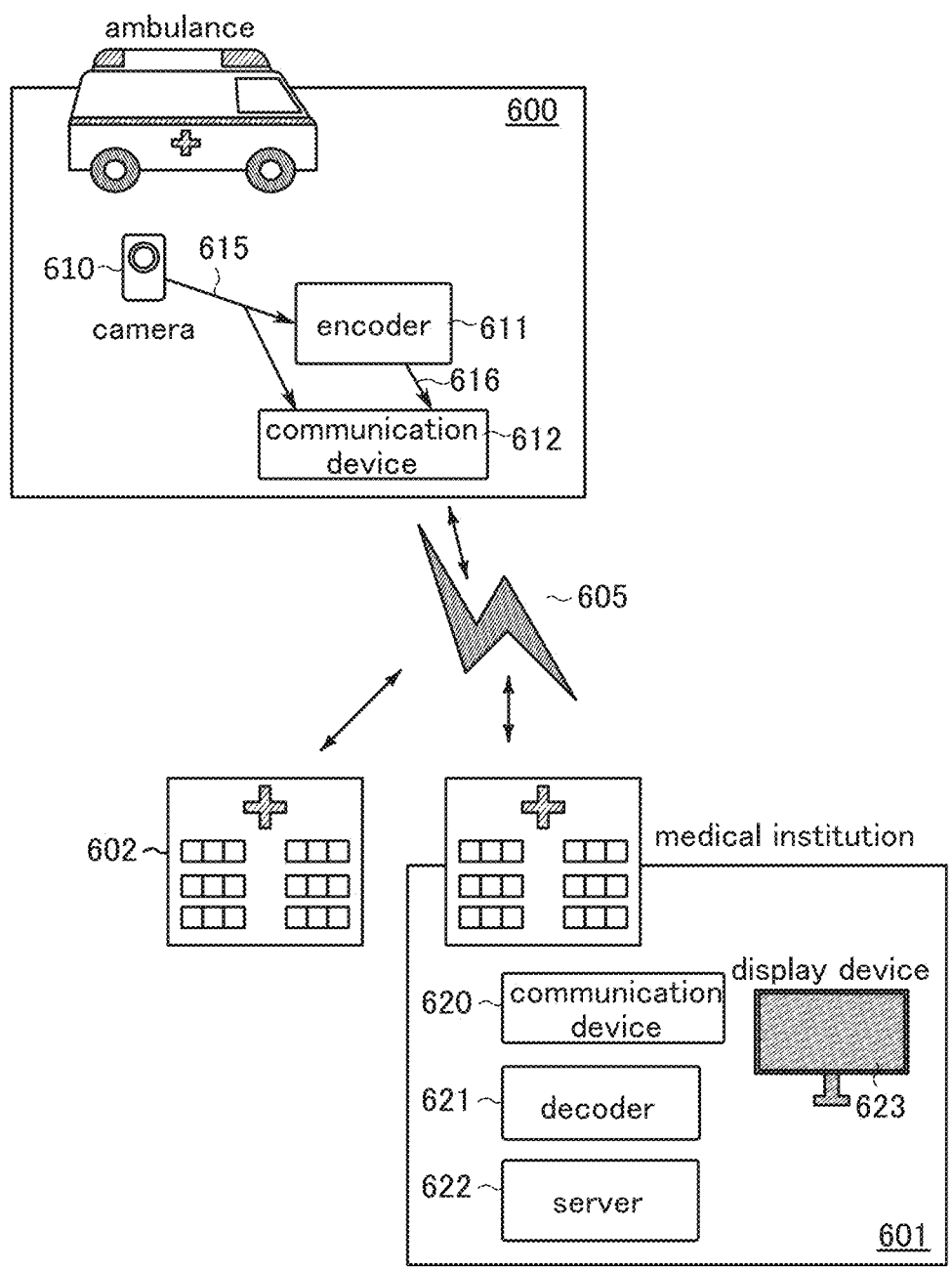

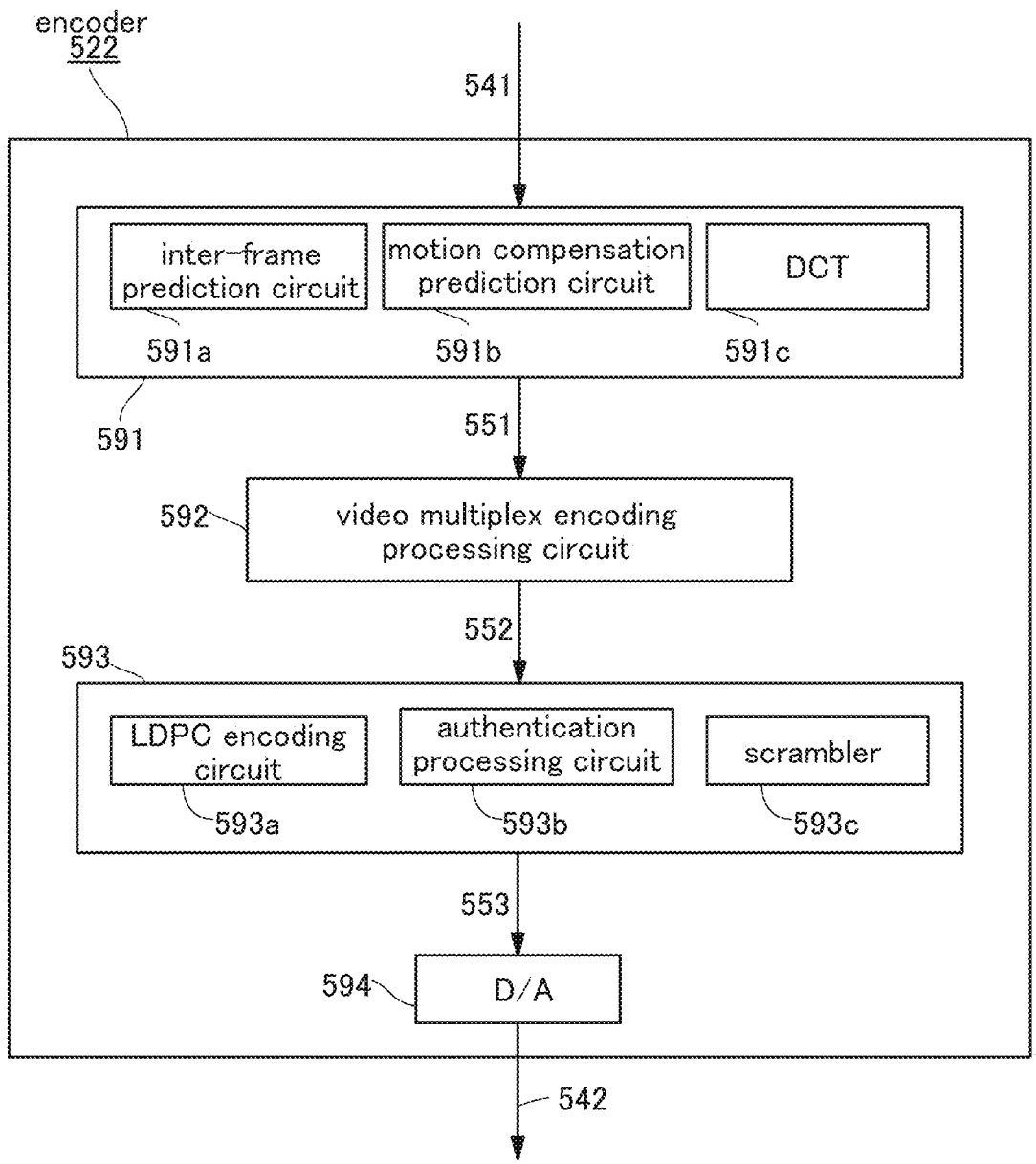

FIG. 29A
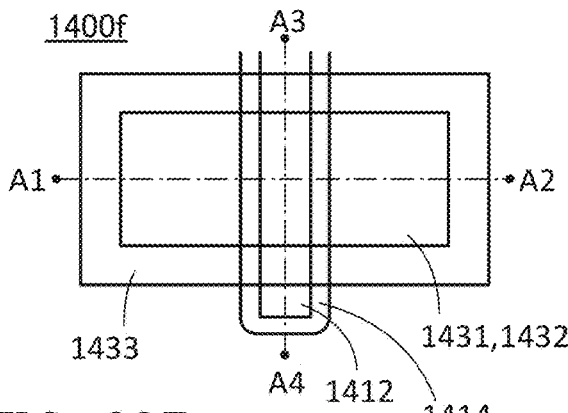
FIG. 29B
FIG. 29C
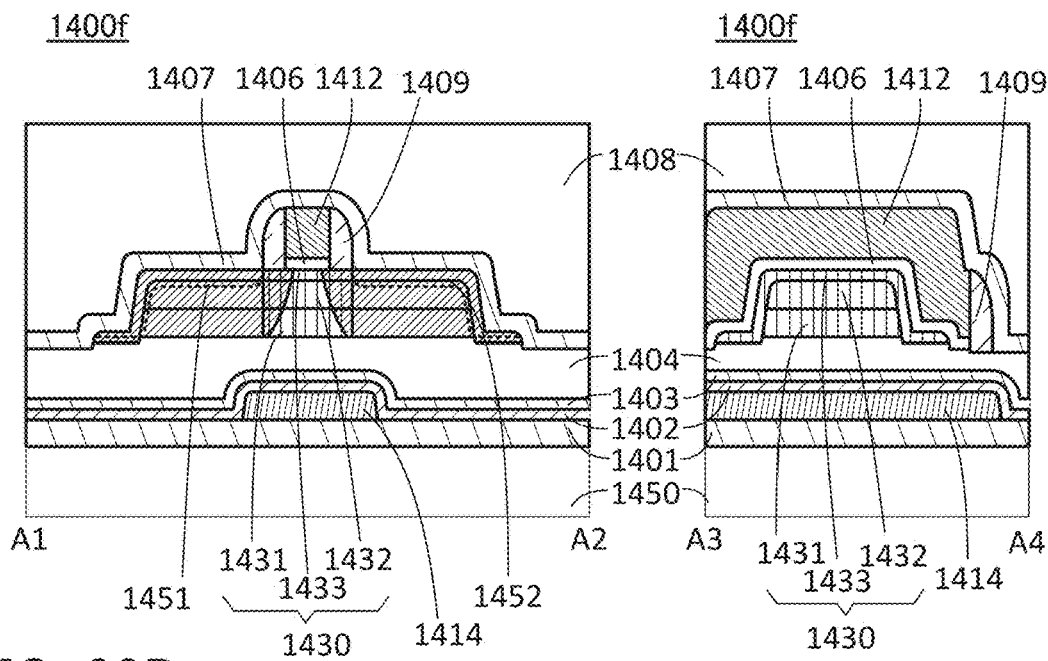
FIG. 29D
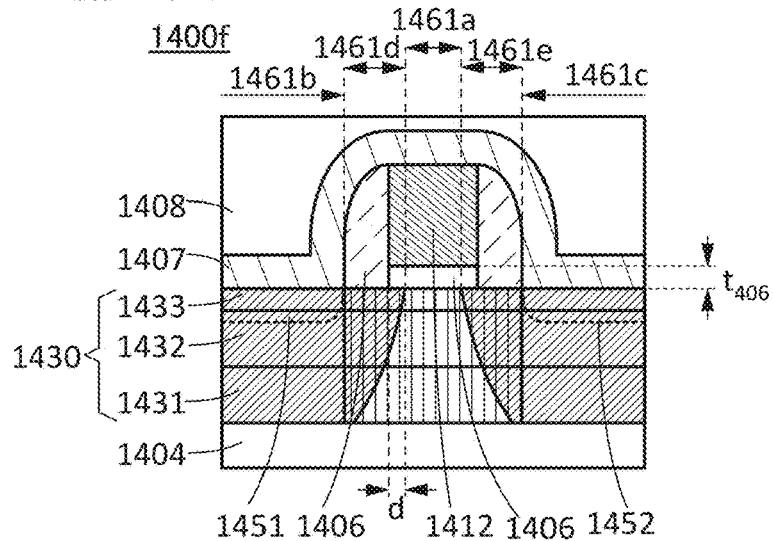

SEMICONDUCTOR DEVICE AND ELECTRONIC DEVICE

TECHNICAL FIELD

One embodiment of the present invention relates to a semiconductor device or an electronic device which includes the semiconductor device.

Note that one embodiment of the present invention is not limited to the above technical field. The technical field of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

In this specification and the like, a semiconductor device refers to an element, a circuit, a device, or the like that can function by utilizing semiconductor characteristics. An example of the semiconductor device is a semiconductor element such as a transistor or a diode. Another example of the semiconductor device is a circuit including a semiconductor element. Another example of the semiconductor device is a device provided with a circuit including a semiconductor element.

BACKGROUND ART

Computers having higher performance than conventional so-called Neumann computers are expected to be provided by utilizing neural networks modeled on biological neural networks, and research and development on neural networks have been actively conducted (e.g., Non-patent Document 1).

In a neural network, units which imitate neurons are connected to each other through synapses. By changing the connection strength by learning, pattern recognition, associative storage, or the like can be performed at high speed to a variety of input patterns.

The following method is effective for pattern recognition: utilizing units which imitate a hierarchical perceptron neural network, after patterns of a mobile unit to be an object are learned as teacher data, image data is given as input data so that the coincidence of the teacher data and the input data is determined, so that whether or not the mobile unit is included is extracted. The hierarchical perceptron neural network includes a neuron circuit that is a unit which imitates neurons and a synapse circuit that is a unit which imitates synapses.

A synapse circuit needs to have a function of storing a connection strength between neuron circuits, a function of multiplying an output of the neuron circuits by the connection strength, and a function of adding the results of the multiplication. Thus, the synapse circuit needs to have a memory for storing the connection strength, a multiplier circuit which has a multiplication function, and an adder circuit which has an addition function.

As a screen of a television (TV) becomes larger, it is desired to be able to watch a high-definition image. For this reason, ultra-high definition TV (UHDTV, 4K, 8K) broadcast has been increasingly put into practical use. Japan, which has promoted UHDTV broadcast, started 4K broadcast services utilizing a communication satellite (CS) and an optical line in 2015. The test broadcast of UHDTV (4K and 8K) by a broadcast satellite (BS) will start in the future. Therefore, various electronic devices which correspond to 8K broadcast are developed (see Non-Patent Document 2). In practical 8K broadcasts, 4K broadcasts and 2K broadcasts (full-high vision broadcast) will be also employed.

Imaging elements are provided in a wide variety of electronic devices such as digital cameras or mobile phones. As described above, UHDTV broadcast has been put into practical use, and accordingly, in recent years, the number of pixels in imaging elements has been increased. In recent years, the number of pixels in imaging elements has been increased; consequently, the amount of data obtained by imaging also has been increased. Therefore, higher speed of reading or transfer of data has been required. A technique in which image data is compressed in order to deal with the increase in volume of image data in accordance with the increase in number of pixels in imaging elements has been known. Patent Document 1 discloses an imaging element module in which differential data between captured image data of the previous period and captured image data of the present period is calculated in taking a moving image or in continuous shooting and data is compressed.

REFERENCE

Patent Document

[Patent Document 1] Japanese Published Patent Application No. 2009-296353

Non-Patent Document

[Non-Patent Document 1] Yutaka Arima et al., "A Self-Learning Neural Network Chip with 125 Neurons and 10K Self-Organization Synapses," *IEEE Journal of Solid-State Circuits*, Vol. 26, No. 4, April 1991, pp. 607-611

[Non-Patent Document 2] S. Kawashima et al., "13.3-In. 8K×4K 664-ppi OLED Display Using CAAC-OS FETs," *SID 2014 DIGEST*, pp. 627-630

DISCLOSURE OF INVENTION

However, in the case where the memory, the multiplier circuit, and the adder circuit are formed using digital circuits, a memory for storing multi-bit data, and a multiplier circuit and an adder circuit for performing multi-bit arithmetic operation are needed. That is, a large-scale circuit configuration which relies on fine processing is needed.

Meanwhile, in the case where the memory, the multiplier circuit, and the adder circuit are formed using analog circuits, although the number of circuit elements can be reduced, it is extremely difficult to configure an ideal analog memory, that is, an analog memory capable of holding an analog value, as the memory. In the case of using a dynamic random access memory (DRAM) type analog memory, data holding is extremely short. To solve the problem, a configuration in which a large-scale capacitor for holding data is provided in an analog memory, a configuration in which analog data is recovered by regular refresh operation, and the like are proposed. However, these configurations cause an increase in a chip area and an increase in power consumption.

In view of the above, an object of one embodiment of the present invention is to provide a novel semiconductor device or the like that has a structure different from that of an existing semiconductor device or the like.

Alternatively, an object of one embodiment of the present invention is to provide a semiconductor device or the like with a novel structure and a small chip area. Alternatively, an object of one embodiment of the present invention is to provide a semiconductor device or the like with a novel structure, in which power consumption is reduced.

Note that the objects of one embodiment of the present invention are not limited to the above objects. The objects described above do not disturb the existence of other objects. The other objects are the ones that are not described above and will be described below. The other objects will be apparent from and can be derived from the description of the specification, the drawings, and the like by those skilled in the art. One embodiment of the present invention is to solve at least one of the aforementioned objects and the other objects.

One embodiment of the present invention is a semiconductor device including a first circuit, a second circuit, a third circuit, a fourth circuit, and a fifth circuit. The first circuit is configured to amplify a first signal input from the outside to output the amplified first signal to the second circuit. The second circuit includes a first multiplier circuit that changes first data corresponding a first connection strength, a first analog memory that stores the first data, and a second multiplier circuit that outputs a second signal obtained by weighting the amplified first signal in accordance with the first data. The third circuit is configured to convert the second signal from current to voltage to output the converted signal to the fourth circuit. The fourth circuit includes a third multiplier circuit that changes second data corresponding to a second connection strength, a second analog memory that stores the second data, and a fourth multiplier circuit that outputs a third signal obtained by weighting the second signal in accordance with the second data. The fifth circuit is configured to convert the third signal from current to voltage to output the converted third signal to the outside. The fifth circuit is configured to generate a fifth signal from a difference between the converted third signal converted from current to voltage and a fourth signal input from the outside. The first analog memory and the second analog memory each include a transistor including an oxide semiconductor in a channel formation region.

In the semiconductor device of one embodiment of the present invention, it is preferable that the third multiplier circuit be configured to change the second data in accordance with the second signal and the fifth signal.

In the semiconductor device of one embodiment of the present invention, it is preferable that the first multiplier circuit be configured to change the first data in accordance with the first signal and the third signal.

Another embodiment of the present invention is an electronic device including an encoder configured to encode image data with the semiconductor device. The image data includes first image data and second image data. When the first image data and the second image data are input to the semiconductor device, the semiconductor device compares the first image data and the second image data. In the case where the first data and the second data match, a motion vector from the first data to the second data is obtained.

Note that other embodiments of the present invention will be described in the following embodiments with reference to the drawings.

One embodiment of the present invention can provide a novel semiconductor device, a novel display device, a novel electronic device, or the like.

Alternatively, one embodiment of the present invention can provide a semiconductor device or the like with a novel structure and a small chip area. Alternatively, one embodiment of the present invention can provide a semiconductor device or the like with a novel structure and lower power consumption.

Note that the effects of one embodiment of the present invention are not limited to the above effects. The effects described above do not disturb the existence of other effects. The other effects are the ones that are not described above and will be described below. The other effects will be apparent from and can be derived from the description of the specification, the drawings, and the like by those skilled in the art. One embodiment of the present invention has at least one of the above effects and the other effects. Accordingly, one embodiment of the present invention does not have the aforementioned effects in some cases.

BRIEF DESCRIPTION OF THE DRAWINGS

In the accompanying drawings:

FIGS. 12A and 12B each illustrate an example of a block diagram;

FIGS. 15A to 15F each illustrate an operation example;

FIG. 19 illustrates an example of an image distribution system;

FIG. 21 is an example of a block diagram;

FIGS. 29A to 29D illustrate examples of a top view and cross-sectional views;

BEST MODE FOR CARRYING OUT THE INVENTION

Figure 1:
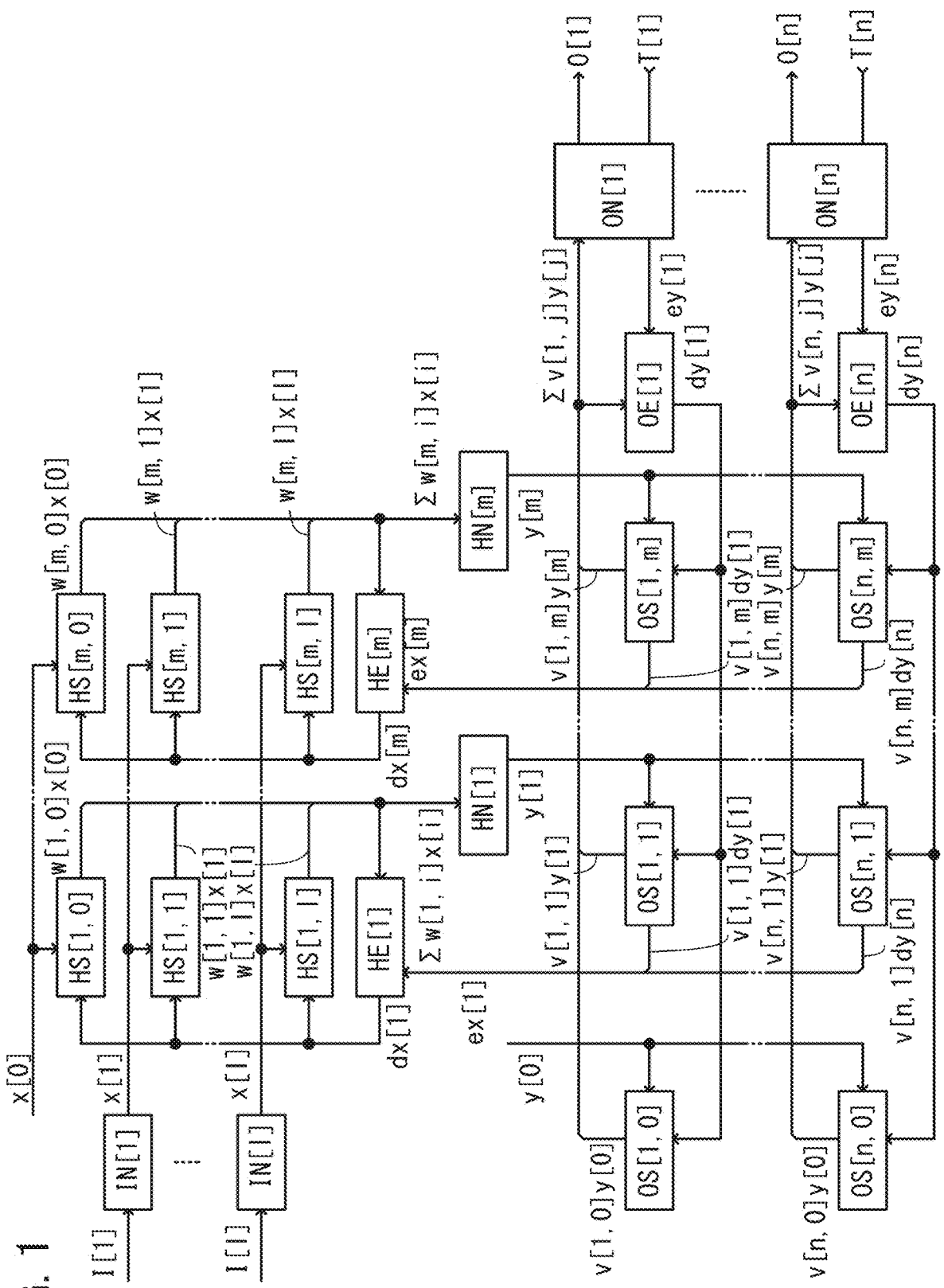
FIG. 1 illustrates an example of a block diagram.

Hereinafter, embodiments will be described with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In this specification and the like, ordinal numbers such as first, second, and third are used in order to avoid confusion among components. Thus, the terms do not limit the number or order of components.

The same elements or elements having similar functions, elements formed using the same material, elements formed at the same time, or the like in the drawings are denoted by the same reference numerals, and the description thereof is not repeated in some cases.

(Embodiment 1)

Embodiments of the present invention are described with reference to FIG. 1, FIGS. 2A to 2D, FIG. 3, FIGS. 4A to 4E, FIG. 5, FIGS. 6A to 6E, FIGS. 7A to 7D, FIGS. 8A to 8D, FIG. 9. FIG. 10, FIG. 11, and FIGS. 12A and 12B.

FIG. 1 is a block diagram of a semiconductor device. FIG. 1 shows the semiconductor device including l input neuron circuits IN (l is a natural number), m hidden neuron circuits HN (m is a natural number), n output neuron circuits ON (n is a natural number), (l+1)×m hidden synapse circuits HS, (m+1)×n output synapse circuits OS, m hidden error circuits HE, and n output error circuits OE.

The block diagram in FIG. 1 is described below.

Figure 2A:
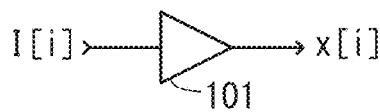
FIGS. 2A to 2D each illustrate an example of a circuit diagram.
Figure 2B:
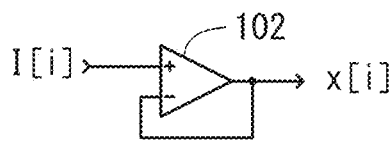
Figure 2C:
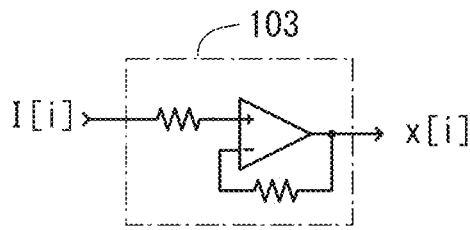
Figure 2D:
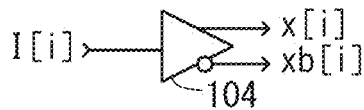

FIG. 2A shows a configuration of an input neuron circuit IN[i]. The input neuron circuit IN[i] includes an amplifier 101 which amplifies an input signal I[i] from the outside of the semiconductor device to generate an output signal x[i]. Note that as shown in FIG. 2B, a unity gain buffer 102 may be used instead of the amplifier 101. As shown in FIG. 2C, an amplifier circuit 103 may be used so as to have a function of changing a reference signal level of an output signal x[i]. As shown in FIG. 2D, a buffer 104 which generates a differential signal may be used so as to generate a pair of differential signals (x[i] and xb[i]) as an output signal. Note that the input neuron circuit IN is simply referred to as a circuit in some cases.

Figure 3:
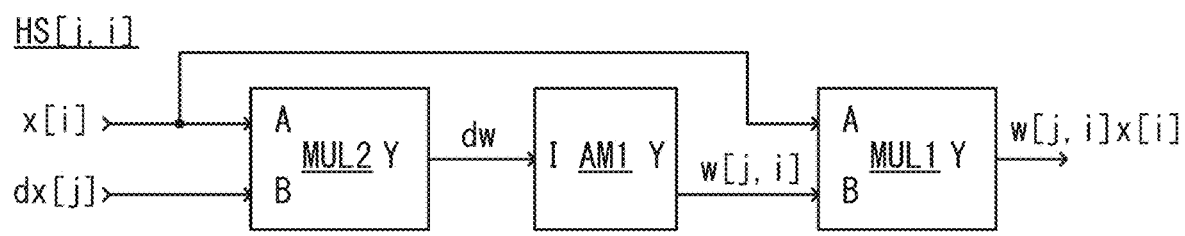
FIG. 3 illustrates an example of a block diagram.

FIG. 3 shows a configuration of a hidden synapse circuit HS[j,i] and i are each a natural number). The hidden synapse circuit HS[j,i] includes an analog memory AM1, a multiplier circuit MUL1, and a multiplier circuit MUL2. The analog memory AM1 is configured to store data corresponding to a weight coefficient w[j,i] and output corresponding voltage. The multiplier circuit MUL1 is configured to multiply an output signal x[i] of the input neuron circuit IN by the weight coefficient w[j,i] stored in the analog memory AM1 to produce an output signal w[j,i]x[i]. Note that as the output signal w[j,i]x[i], current corresponding to the multiplication result is supplied. The multiplier circuit MUL2 is configured to multiply the output signal x[i] of the input neuron circuit IN by an output signal dx[j] of a hidden error circuit HE[j] to produce a signal dw. As the signal dw, current corresponding to the multiplication result is supplied. The signal dw is supplied as current corresponding to the amount of change in the weight coefficient w[j, i] stored in the analog memory AM1. That is, multiplier circuit MUL2 corresponds to a writing circuit which changes data in the analog memory AM1. Note that in hidden synapse circuits HS[1,0] to HS[m,0], an input signal x[0] is supplied with −1, and the weight coefficients w[1,0] to w[m,0] are supplied with $\theta_H[1]$ to $\theta_H[m]$; thus, current corresponding to $-\theta_H[1]$ to $\theta_H[m]$ are supplied as output signals w[1,0]x[0] to w[m,0]x[0]. Note that the hidden synapse circuit HS is simply referred to as a circuit, in some cases.

Figure 4A:
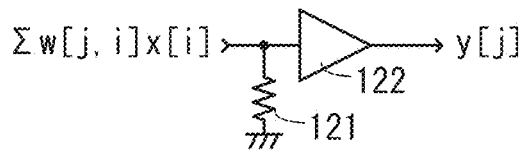
FIGS. 4A to 4E each illustrate an example of a circuit diagram.

FIG. 4A shows a configuration of a hidden neuron circuit HN[j]. The hidden neuron circuit HN[j] generates an output signal y[j] using $\Sigma_{i=0\sim l}w[j,i]x[i]$ that is the sum of the output signals w[j,i]x[i] (current) of the hidden synapse circuits HS[j,i] as an input signal. The hidden neuron circuit HN[j] includes a resistance 121 which converts the input signal into voltage, and an amplifier 122 which generates the output signal y[j]. The output signal of the amplifier 122 has characteristics of $f_H(X)$ in Formula 1 or characteristics approximated thereto when an input signal X is a variable.

[Formula 1]

$$f_H(X) = \frac{1}{(1+e^{-\alpha_H X})} \qquad (1)$$

In Formula 1, $\alpha_H$ is an arbitrary constant, which corresponds to the change rate of the output signal when X is 0.

The output signal y[j] of the hidden neuron circuit HN[j] has characteristics represented by Formula 2.

[Formula 2]

$$y(j) = \frac{1}{\left(1+e^{-\alpha_H \Sigma_{i=0\sim l}w[j,i]x[i]}\right)} \qquad (2)$$

Here, in the case where $\Sigma_{i=0\sim l}w[j,i]x[i]$ exceeds 0, that is, $\Sigma_{i=0\sim l}w[j,i]x[i]$ exceeds the threshold value $\theta_H[j]$, the output signal y[j] comes close to 1, that is, becomes "H" (referred to as a high level or H level). Such a state is expressed as firing of the hidden neuron circuit HN[j]. That is, the threshold value $\theta_H$ corresponds to a threshold value at which the hidden neuron circuit HN[j] fires.

Figure 4B:
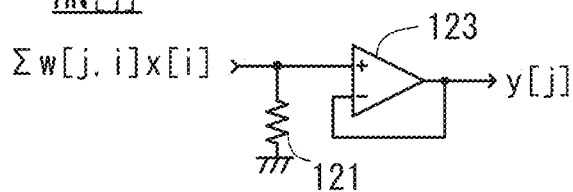
Figure 4C:
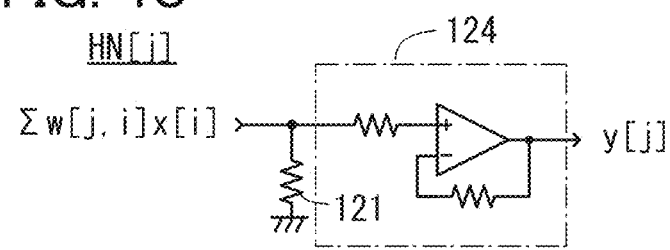
Figure 4D:
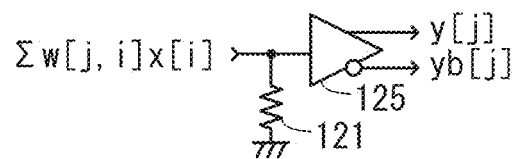
Figure 4E:
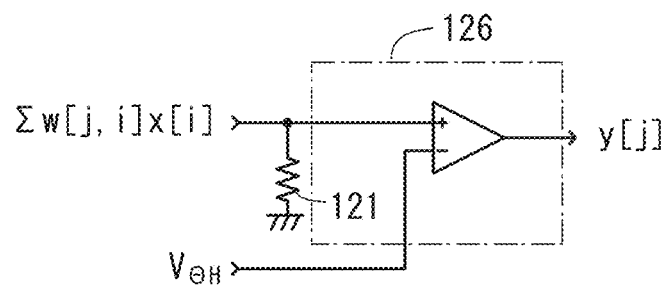

Note that as shown in FIG. 4B, a unity gain buffer 123 may be used instead of the amplifier 122. Alternatively, as shown in FIG. 4C, an amplifier circuit 124 may be used so that a reference signal level of the output signal y[j] is changed. Alternatively, as shown in FIG. 4D, a buffer 125 which generates a differential signal may be used to generate a pair of differential signals (y[j] and yb[j]) as an output signal. Alternatively, as shown in FIG. 4E, an operational amplifier 126 in which voltage obtained by converting $\Sigma_{i=0\sim l}w[j,i]x[i]$ into voltage by the resistance 121 is used as a non-inverting input signal and voltage V $\theta_H[j]$ corresponding the threshold voltage OH [i] is used as an inverting input signal, can be used. In that case, the hidden synapse circuits HS[1,0] to HS[m, 0] are not necessary. Note that the hidden synapse circuit I-IN is simply referred to as a circuit in some cases.

Figure 5:
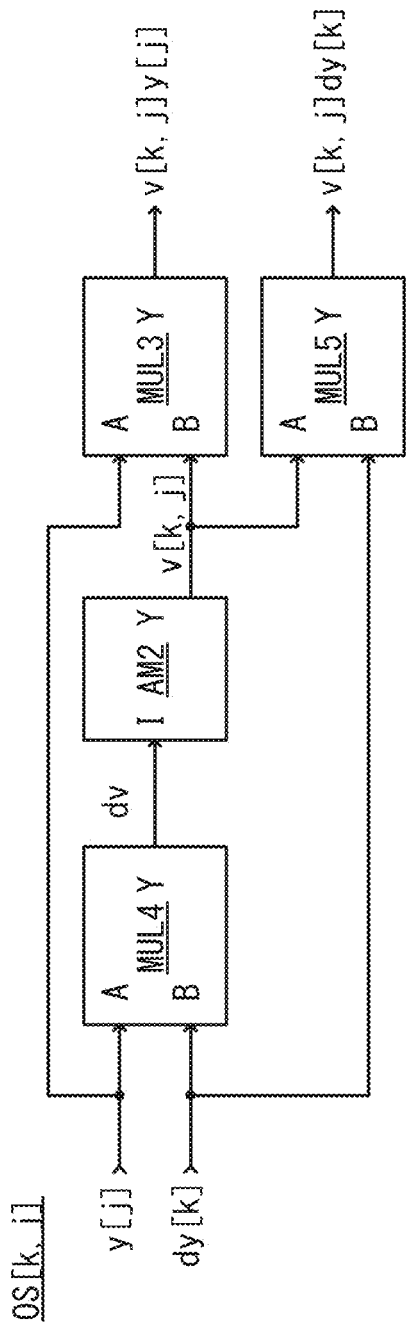
FIG. 5 illustrates an example of a block diagram.

FIG. 5 shows a configuration of an output synapse circuit OS[k, j]. The output synapse circuit OS[k, j] includes an analog memory AM2, a multiplier circuit MUL3, a multiplier circuit MUL4, and a multiplier circuit MUL5. The analog memory AM2 is configured to store data corresponding to a weight coefficient v[k,j] to output corresponding voltage. The multiplier circuit MUL3 is configured to multiply an output signal y[j] of the hidden neuron circuit HN[j] by a weight coefficient v[k,j] stored in the analog memory AM2 so that current corresponding to the multiplication result is output as an output signal v[k,j]y[i]. The multiplier circuit MUL4 is configured to multiply the output signal y[j] of the hidden neuron circuit HN[j] by an output signal dy[k] of an output error circuit OE[k] so that current corresponding to the multiplication result is supplied to the analog memory AM2 as a signal dv. The signal dv is supplied as current corresponding to the amount of change in the weight coefficient w[k,j] stored in the analog memory AM2. The multiplier circuit MUL5 is configured to multiply the output signal dy[k] of the output error circuit OE[k] by the weight coefficient v[k,j] stored in the analog memory AM2 so that current corresponding to the multiplication result is supplied as an output signal v[k,j]dy[k]. Note that in output synapse circuits OS[1,0] to OS[n,0], an input signal y[0] is supplied with −1, and weight coefficients v[1,0] to v[n,0] are supplied with $\theta_o[1]$ to $\theta_o[n]$; thus, current corresponding to $-\theta_o[1]$ to $-\theta_o[n]$ are supplied as output signals v[1,0]y[0] to v[n,0]y[0]. Note that the output synapse circuit OS is simply referred to as a circuit, in some cases.

Figure 6A:
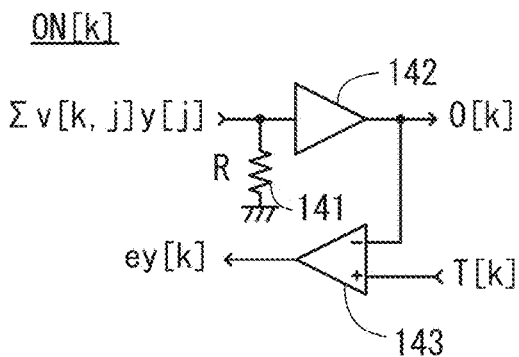
FIGS. 6A to 6E each illustrate an example of a circuit diagram.

FIG. 6A shows a configuration of an output neuron circuit ON[k]. The output neuron circuit ON[k] generates an output signal O[k] using $\Sigma_{j=0 \sim m} V[k,j]y[j]$ that is the sum of the output signals v[k,j]y[j] (current) of the output synapse circuits OS[k,j] as an input signal. The output neuron circuit ON[k] includes a resistance 141 which converts the input signal into voltage and an amplifier 142 which generates the output signal O[k]. The output signal of the amplifier 142 has characteristics of $f_o(Y)$ in Formula 3 or characteristics approximated thereto when an input signal Y is a variable.

[Formula 3]

$$f_O(Y) = \frac{1}{(1 + e^{-\alpha_O Y})} \quad (3)$$

In Formula 3, $\alpha_0$ is an arbitrary constant, which corresponds to the change rate of the output signal when Y is 0.

The output signal O[k] of the output neuron circuit ON[k] has characteristics represented by Formula 4.

[Formula 4]

$$O(k) = \frac{1}{\left(1 + e^{-\alpha_O \Sigma_{j=0 \sim m} v[k,j]y[j]}\right)} \quad (4)$$

Here, in the case where $\Sigma_{j=0 \sim m} V[k,j]y[j]$ exceeds 0, that is, $\Sigma_{j=1 \sim m} V[k,j]y[j]$ exceeds the threshold value $\theta_o[k]$, the output signal O[k] comes close to 1, that is, becomes "H". Such a state is expressed as firing of the output neuron circuit ON[k]. That is, the threshold value $\theta_o[k]$ corresponds to a threshold value at which the output neuron circuit ON[k] fires.

Figure 6B:
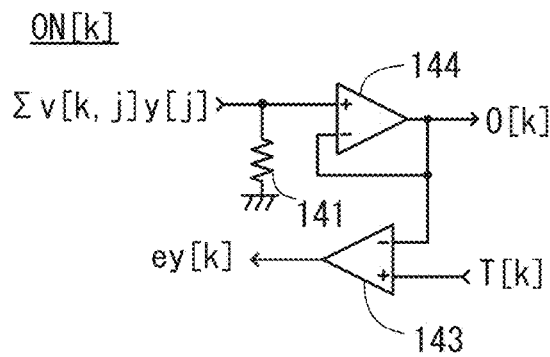
Figure 6C:
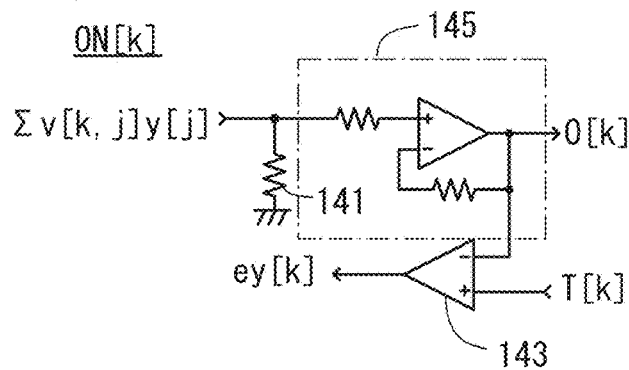
Figure 6D:
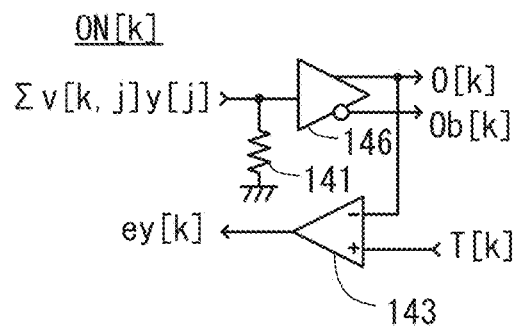
Figure 6E:
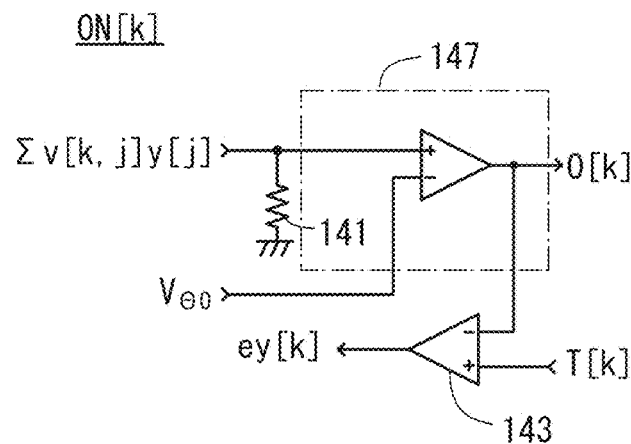

Note that as shown in FIG. 6B, a unity gain buffer 144 may be used instead of the amplifier 142. Alternatively, as shown in FIG. 6C, an amplifier circuit 145 may be used so that a reference signal level of the output signal O[k] is changed. Alternatively, as shown in FIG. 6D, a buffer 146 which generates a differential signal may be used to generate a pair of differential signals (O[k] and Ob[k]) as an output signal. Alternatively, as shown in FIG. 6E, an operational amplifier 147 in which voltage obtained by converting $\Sigma_{j=0 \sim m} V[k,j]y[k]$ into voltage by the resistance 141 is used as a non-inverting input signal and voltage V $\theta_o[k]$ corresponding the threshold voltage $\theta_o[k]$ is used as an inverting input signal, can be used. In that case, the output synapse circuits OS[1,0] to OS[n,0] are not necessary. Note that the output neuron circuit ON is simply referred to as a circuit in some cases.

In the semiconductor device, storing data corresponding the weight coefficients w[j,i] and v[k,j] in the analog memories AM1 and AM2 in order to obtain output signals O[1] to O[n] with respect to input signals I[1] to I[l] corresponds to learning. More specifically, learning means the following: arbitrary values are given to the weight coefficients w[j,i] and v[k,j] as initial values; input data used for the learning is given to the input signals I[1] to I[l] of the input neuron circuits; teacher signals are given to input signals T[1] to T[n] of the output neuron circuits as output expected values; and the weight coefficients w[j,i] and v[k, j] are converged so that the sum of squared errors between the output signals O[1] to O[n] and the input signals T[1] to T[n] of the output neuron circuits becomes a minimum.

The sum of squared errors between the output signals O[1] to O[n] and the input signals T[1] to T[n] of the output neuron circuits is expressed by Formula 5.

[Formula 5]

$$E = 1/2 \Sigma (T[k] - O[k])^2 \quad (5)$$

Formula 5 can be expressed by Formula 6 in the case of ey[k]=T[k]−O[k].

[Formula 6]

$$E = 1/2 \Sigma (ey[k])^2 \quad (6)$$

Obtaining the minimum of the sum of squared errors corresponds to obtaining local minimum values of the weight coefficients w[j,i] and v[k,j] by a gradient method, that is, corresponds to obtaining the weight coefficients w[j,i] and v[k, j] satisfying Formulae 7 and 8.

[Formula 7]

$$\frac{\partial E}{\partial w[j, i]} = 0 \quad (7)$$

[Formula 8]

$$\frac{\partial E}{\partial v[k, j]} = 0 \quad (8)$$

That is, the weight coefficients w[j,i] and v[k,j] are updated corresponding to the left side values in Formulae 7 and 8.

As for the weight coefficient v[k, j], the relationship in Formula 9 is satisfied.

[Formula 9]

$$\frac{\partial E}{\partial v[k,j]} = \qquad (9)$$
$$\frac{\partial E}{\partial ey[k]} \cdot \frac{\partial ey[k]}{\partial O[k]} \cdot \frac{\partial O[k]}{\partial Y} \cdot \frac{\partial Y}{\partial v[k,j]} = ey[k] \cdot (-1) \cdot f'_O(Y) \cdot \alpha_0 y(j)$$

In Formula 9, Y is expressed as $Y=\alpha_0\Sigma_{j=0\sim m}V[k,j]y[j]$. Thus, as for the weight coefficient $v[k,j]$, only a value corresponding to $\eta_v \cdot ey[k] \cdot f'_O(Y) \cdot y[j]$ is changed. Note that $\eta_v$ is a constant value.

Now, as for the weight coefficient $w[j, i]$, the relationship in Formula 10 is satisfied.

[Formula 10]

$$\frac{\partial E}{\partial w[j,i]} = \sum \frac{\partial E}{\partial ey[k]} \cdot \frac{\partial ey[k]}{\partial O[k]} \cdot \frac{\partial O[k]}{\partial Y} \cdot \frac{\partial Y}{\partial y[j]} \cdot \frac{\partial y[j]}{\partial X} \cdot \frac{\partial X}{\partial w[j,i]} = \qquad (10)$$
$$\sum ey[k] \cdot (-1) \cdot f'_O(Y) \cdot \alpha_0 v[k,j] \cdot f'_H(X) \cdot \alpha_H x(i)$$

In Formula 10, X is expressed as $X=\alpha_H\Sigma_{j=0\sim m}W[j,i]x[i]$ and Y is expressed as $Y=\alpha_0\Sigma_v[k,j]y[j]$. The weight coefficient $w[j,i]$ is changed by the amount corresponding to a value $\eta_w \cdot (\Sigma_{j=0\sim m}ey[k] \cdot f'_O(Y) \cdot v[k,j]) \cdot f'_H(X) \cdot x[i]$. In the output neuron circuit ON[k] in each of FIGS. 6A to 6E, a difference between the teacher signal T[k] and the output signal O[k] is acquired by an amplifier 143, thereby outputting the difference as a differential signal ey[k]. Note that $\eta_w$ is a constant value. The output neuron circuit ON is simply referred to as a circuit in some cases.

Figure 7A:
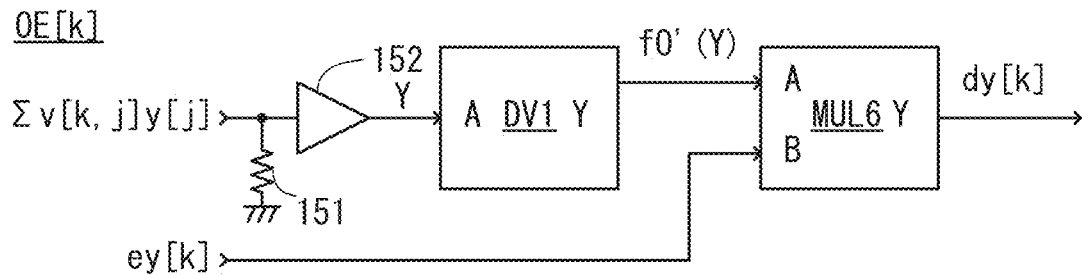
FIGS. 7A to 7D each illustrate an example of a circuit diagram.
Figure 7B:
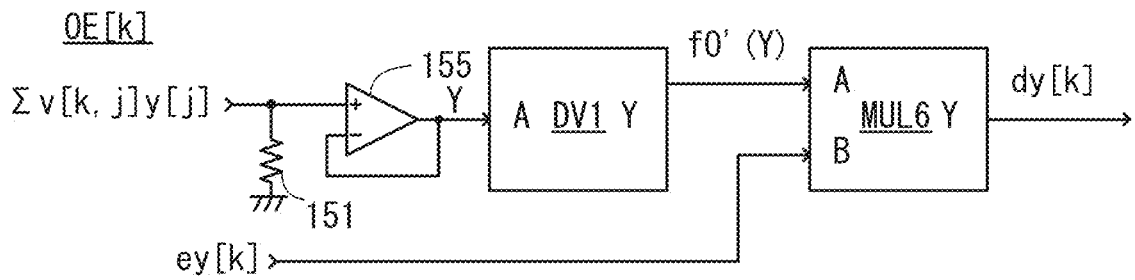
Figure 7C:
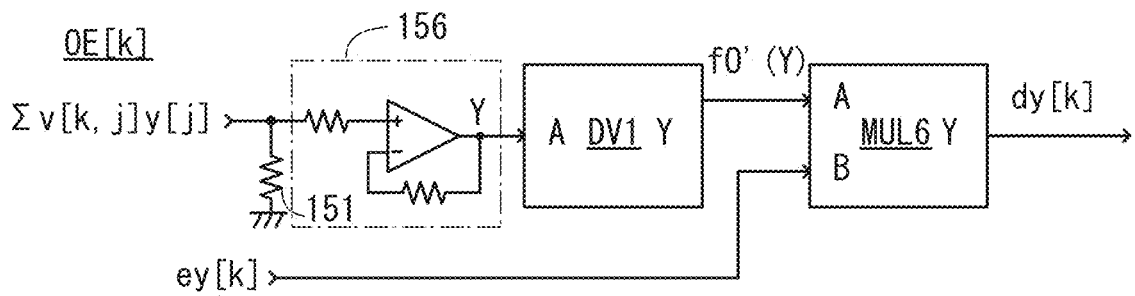
Figure 7D:
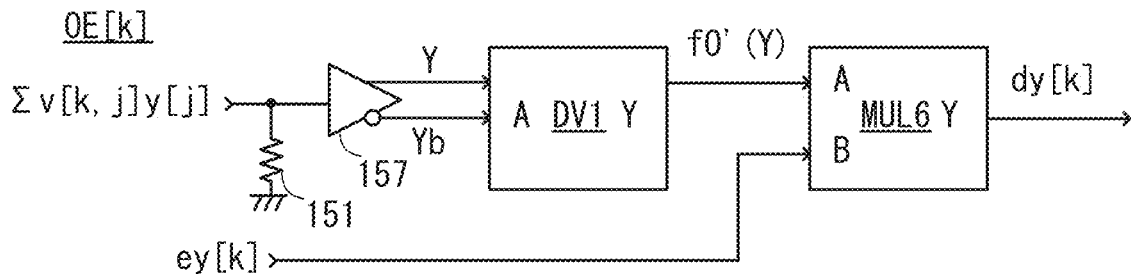

FIG. 7A is a configuration of an output error circuit OE[k]. The output error circuit OE[k] generates a signal Y using $\Sigma_{j=0\sim m}V[k,j]y[j]$ that is the sum of the output signals v[k,j]y[j] (current) of the output synapse circuits OS[k,j] and the differential signal ey[k] that is the output signal of the output neuron circuit ON[k] as input signals. The output error circuit OE[k] includes a resistance 151 which converts the input signal $\Sigma_{j=0\sim m}V[k,j]y[j]$ into voltage, and an amplifier 152 which generates the signal Y. As shown in FIG. 7B, a unity gain buffer 155 may be used instead of the amplifier 152. Alternatively, as shown in FIG. 7C, an amplifier circuit 156 may be used so that a reference signal level of the signal Y is changed. Alternatively, as shown in FIG. 7D, a buffer 157 which generates a differential signal may be used to generate a pair of differential signals (Y and Yb) as the signal Y. Note that the output error circuit OE is simply referred to as a circuit, in some cases.

As shown in FIGS. 7A to 7D, the output error circuit OE[k] includes a differentiating circuit DV1 for generating an output signal $f'_O(Y)$ with respect to the signal Y and a multiplier circuit MUL6 to which the output signal $f'_O(Y)$ and the differential signal ey[k] are input as signals. The result of the multiplication by the multiplier circuit MUL6, $dy[k]=ey[k] \cdot f'_O(Y)$, is the output signal. As mentioned above, the signal dy[k] is an input signal of the output synapse circuit OS[k,j], and data in the analog memory AM2 is changed by the amount corresponding to $dv=dy[k] \cdot y[j] =ey[k] \cdot f'_O(Y) \cdot y[j]$, $(\eta_v \cdot dv=\eta_v \cdot ey[k] \ f'_O(Y) \cdot y[j])$. Note that the output signal v[k,j]dy[k] of the output synapse circuit OS[k,j] is expressed as $v[k,j]dy[k]=ey[k] \cdot f'_O(Y) \cdot v[k,j]$.

Figure 8A:
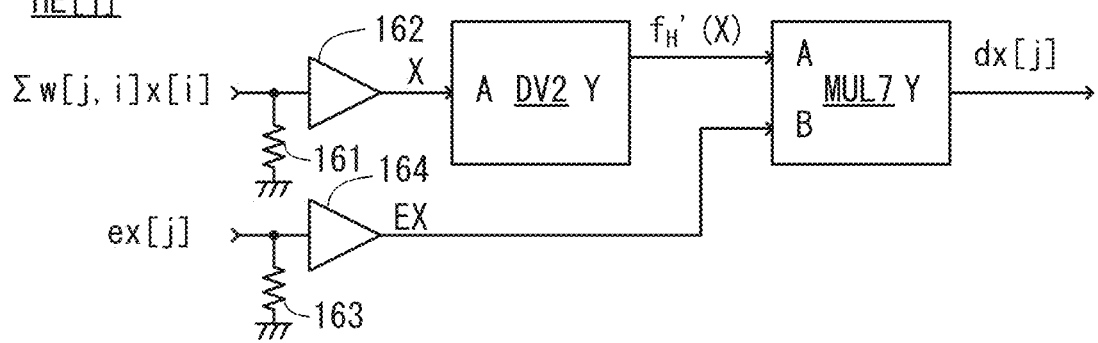
FIGS. 8A to 8D each illustrate an example of a circuit diagram.
Figure 8B:
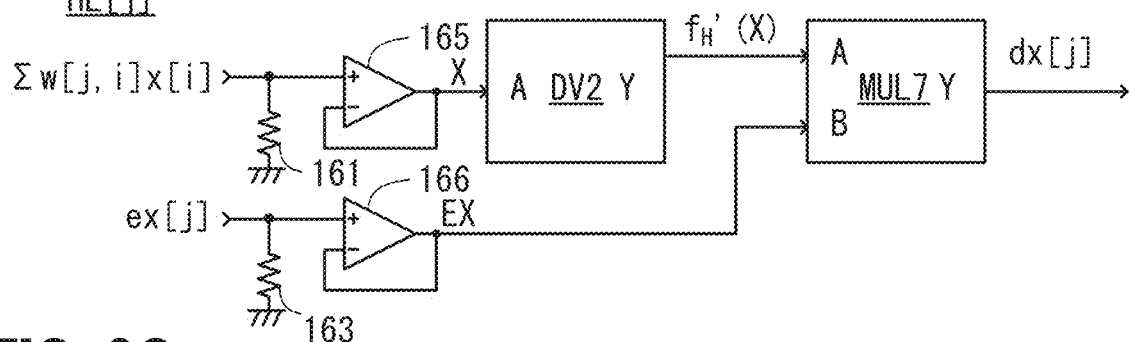
Figure 8C:
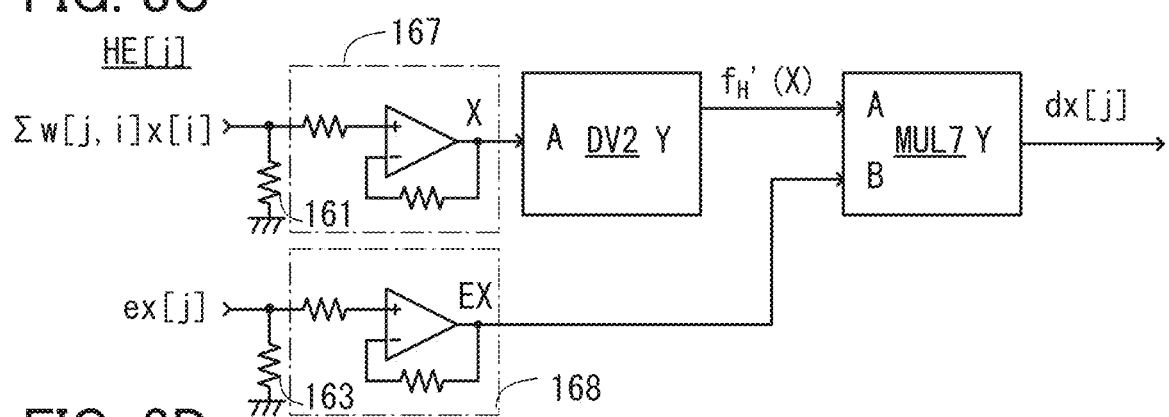
Figure 8D:
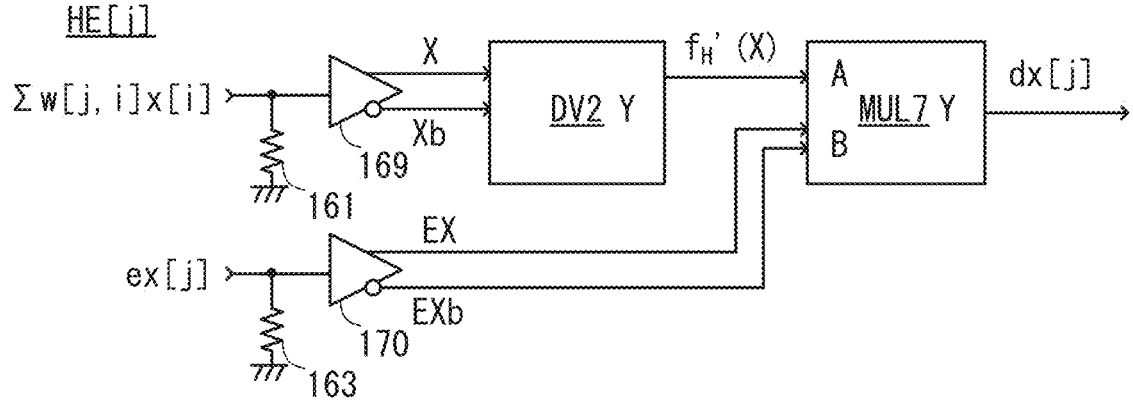

FIG. 8A is a configuration of a hidden error circuit HE[j]. The hidden error circuit HE[j] generates a signal EX using $\Sigma_{i=0\sim l}w[j,i]x[i]$ that is the sum of the output signals w[j,i]x[i] (current) of the hidden synapse circuits HS[j,i], and an output signal v[k,j]dy[k] of the output synapse circuit OS[k, j]; that is, a signal $\Sigma_{k=1\sim 1}V[k,j]dy[k]=\Sigma_{k=1\sim 1}ey[k]dy[k] \cdot f'_O(Y) \cdot v[k,j]=ex[j]$ that is the sum of currents of ey[k] $f'_O(Y) \cdot v[k,j]$ as the input signals. The hidden error circuit HE[j] includes a resistance that converts the input signal $\Sigma_{i=0\sim 1}w[j,i]x[i]$ into voltage and an amplifier 164 which generates the signal EX. As shown in FIG. 8B, unity gain buffers 165 and 166 may be used instead of the amplifiers 162 and 164. As shown in FIG. 8C, amplifier circuits 167 and 168 may be used so that reference signal levels of the signal X and the signal EX are changed. As shown in FIG. 8D, buffers 169 and 170 each of which generates a differential signal may be used to generate a pair of differential signals (X and Xb and Ex and EXb) from the signals X and EX.

As shown in FIGS. 8A to 8D, the hidden error circuit HE[j] includes a differentiating circuit DV2 for generating an output signal $f'_H(X)$ with respect to the signal X and a multiplier circuit MUL7 to which the output signal $f'_H(X)$ and the signal EX are input as signals. The result of the multiplication by the multiplier circuit MUL7, $dx[j]=ex[j] \cdot f'_H(X)=\Sigma_{k=1\sim 1}ey[k] \cdot f'_O(Y) \cdot v[k,j] \cdot f'_H(X)$, is an output signal. As mentioned above, the signal dx[j] is an input signal of the hidden synapse circuit HS[j,i], and data in the analog memory AM1 (the weight coefficient w[j,i]) is changed by the amount corresponding to $dw=dx[j] \cdot x[i]=\Sigma_{k=1\sim 1}ey[k] \cdot f'_O(Y) \cdot v[k,j] \cdot f'_H(X) \cdot x[i]$, $(\eta_w \cdot dw=\eta_w \cdot \Sigma_{k=1\sim 1}ey[k] \cdot f'_O(Y) \cdot v[k,j] \cdot f'_H(X) \cdot x[i])$. Note that the hidden error circuit HE is simply referred to as a circuit in some cases.

As described above, in the semiconductor device, the weight coefficients w[j,i] and v[k, j] can be updated, and data corresponding to the weight coefficients w[j,i] and v[k, j] with which desired output signals O[1] to O[n] are obtained with respect to the input signal I[1] to I[l], can be stored in each of the analog memories. That is, learning of the semiconductor device is possible.

Figure 9:
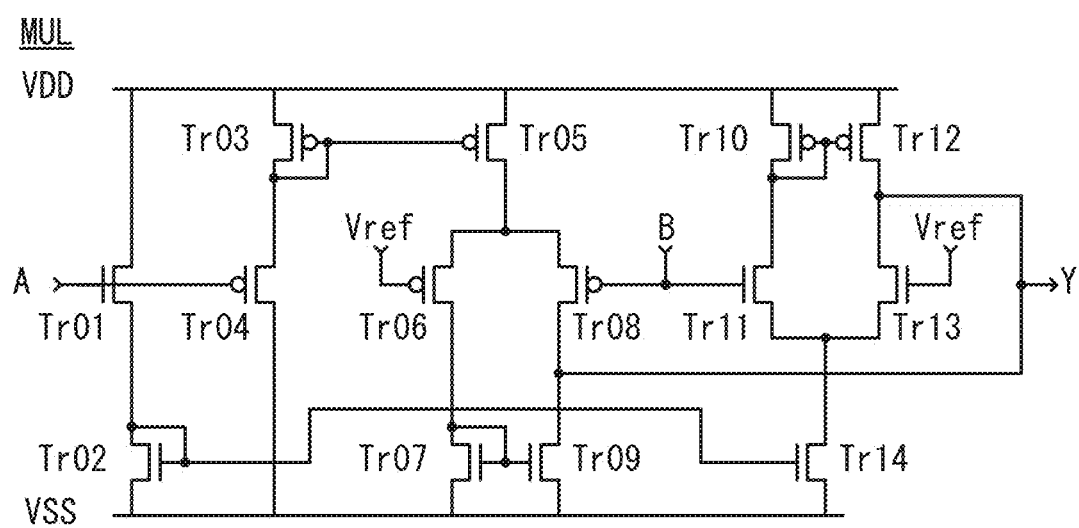
FIG. 9 illustrates an example of a circuit diagram.

FIG. 9 shows a configuration of a multiplier circuit MUL applicable to the multiplier circuits MUL1 to MUL7 in the hidden synapse circuit HS[j, i], the output synapse circuit OS[k,j], the output error circuit OE[k], and the hidden error circuit HE[j]. The multiplier circuit MUL includes a first transistor Tr01 to a fourteenth transistor Tr14. The multiplier circuit has a configuration to which a multiplier circuit of Chible is applied. With the multiplier circuit, current which is proportional to the product of the potential of an input signal A and the potential of an input signal B is obtained as an output signal Y.

Figure 10:
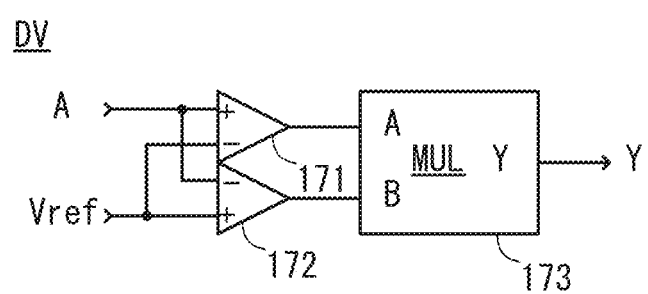
FIG. 10 illustrates an example of a circuit diagram.

FIG. 10 shows a differentiating circuit DV applicable to any of the differentiating circuits DV1 and DV2 in the output error circuit OE[k] and the hidden error circuit HE[j]. The differentiating circuit DV includes an operational amplifier 171, an operational amplifier 172, and a multiplier circuit 173. Here, the operational amplifier 171 has a characteristic of an output signal $Y1=f(X)=1/(1+e^{-\alpha X})$ with respect to a difference between a non-inverting input signal A and an inverting input signal Vref, $X=A-Vref$, or a characteristic approximated thereto. Furthermore, the operational amplifier 172 has a characteristic of an output signal $Y_2=f(X_2)=1/(1+e^{-\alpha X})$ with respect to a difference between a non-inverting input signal Vref and an inverting input signal A, $X_2=Vref-A=-X$, or a characteristic approximated thereto. Here, the following formula is satisfied: $Y_2=f(-X)=1/(1+e^{+\alpha x})=e^{-\alpha X}/(e^{-\alpha X}+1)=1-1/(1+e^{-\alpha X})=1-f(X)$. Thus, the output Y of the multiplier circuit 173 is expressed as $Y=Y_1 \cdot Y_2=f(X)(1-f(X))=f'(X)(=df(X)/dX)$. That is, the differentiating circuit f(X) is realized.

Figure 11:
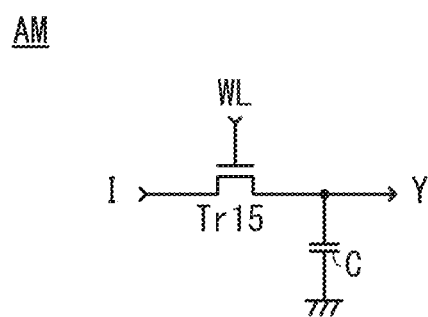
FIG. 11 illustrates an example of a circuit diagram.

FIG. 11 shows a configuration of an analog memory AM applicable to any of the analog memories AM1 and AM2 in the hidden synapse circuit HS[j,i] and the output synapse circuit OS [k,j]. The analog memory AM includes a transistor Tr15 and a capacitor C. The transistor Tr15 is formed using an oxide semiconductor having extremely low off-state current; so that an ideal analog memory can be formed. Thus, because it is not necessary to mount a large scale capacitor for holding data and to recover analog data by regular refresh operation, reduction in a chip area and reduction in power consumption are possible. Note that in updating data, current corresponding to the amount of change is supplied; thus, $\eta_v$ or $\eta_w$ (constant) can be changed by adjustment of a period during which a signal WL is set to "H".

FIG. 12A shows a simplified block diagram of the configuration of the semiconductor device in FIG. 1. FIG. 12A shows the input neuron circuit IN, the hidden neuron circuit HN, the output neuron circuit ON, the hidden synapse circuit HS, the output synapse circuit OS, the hidden error circuit HE, and the output error circuit OE. In the configuration of FIG. 12A, the input neuron circuit IN corresponds to an input layer IL. Furthermore, the hidden neuron circuit HN, the hidden synapse circuit HS, and the hidden error circuit HE correspond to a hidden layer HL. The output error circuit OE, the output neuron circuit ON, and the output synapse circuit OS correspond to an output layer. Note that a signal I corresponds to an input signal, a signal T corresponds to a teacher signal T, and a signal O corresponds to an output signal.

Note that the hidden layer HL in FIG. 12A may have two layers as shown in FIG. 12B. With such a structure, deeper learning can be achieved.

In the semiconductor device, learning is performed in such a manner that learning data is provided as an input signal of the input neuron circuit, a teacher signal corresponding to the learning data is provided as an input signal of the output neuron circuit, and analog memory data is updated in accordance with a differential signal. By the learning, when object data is provided as an input signal of the input neuron circuit, judgement whether object data and learning data match, or are similar can be made. Here, when data of an object (a mobile unit) in image data is used as learning data, the object can be detected in the image data. That is, pattern of the mobile unit can be effectively extracted from the image data, and motion compensation prediction can be effectively performed.

With such a configuration, a semiconductor device utilizing a neural network, which includes an analog circuit with small circuit size and which does not need refresh operation in data holding of the analog memory, can be provided.

[Embodiment 2]

In this embodiment, an operation example of the semiconductor device in FIG. 1 is described.

<Operation Example>

Figure 13:
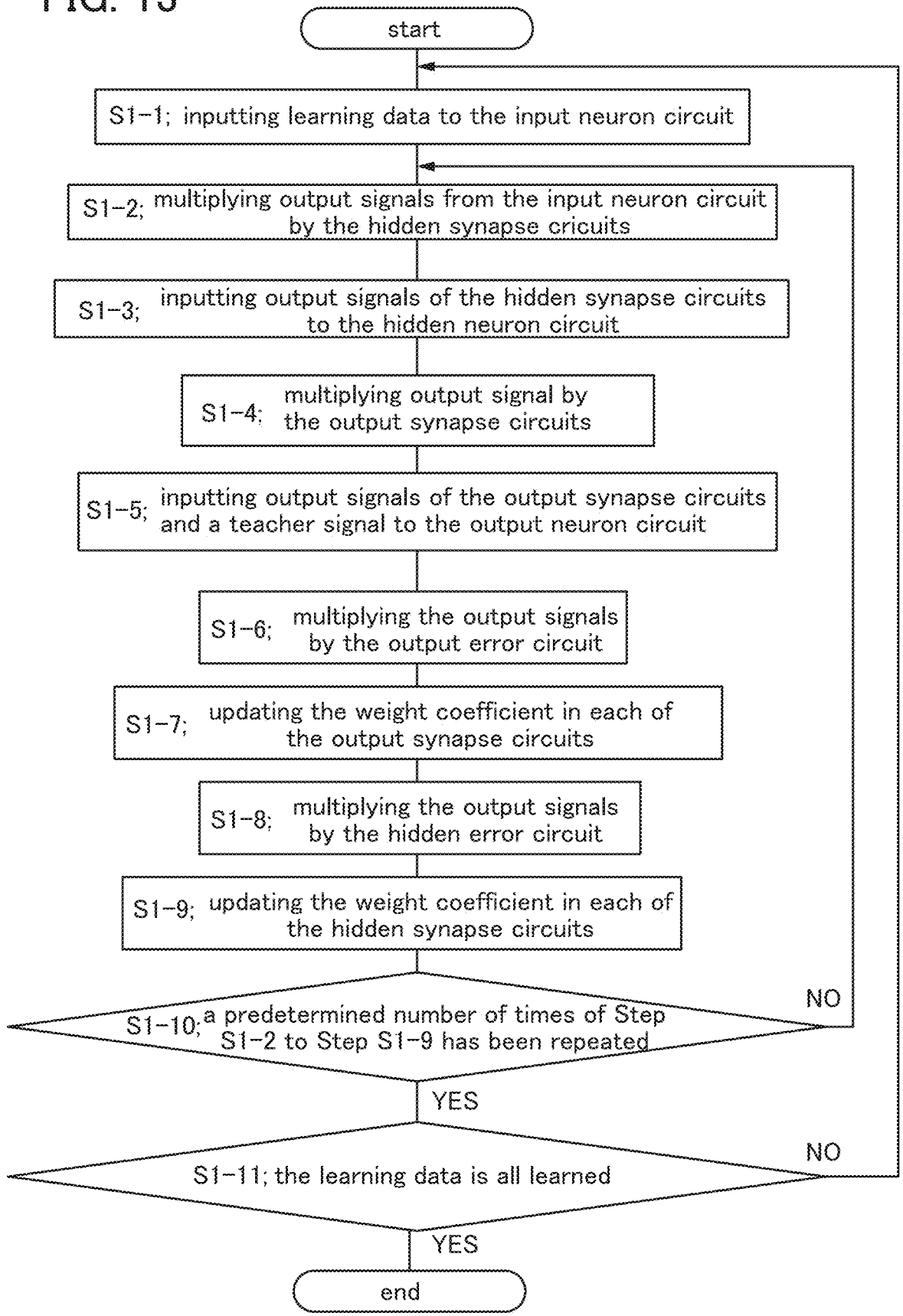
FIG. 13 illustrates an example of a flowchart.
Figure 14:
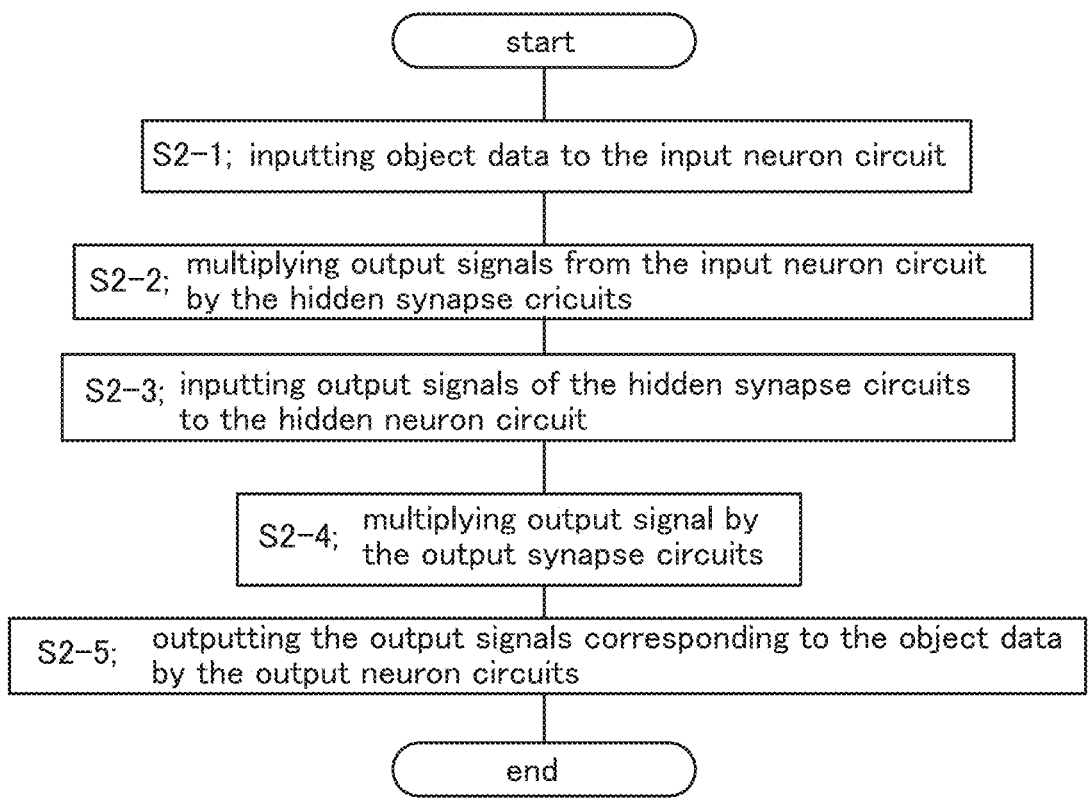
FIG. 14 illustrates an example of a flowchart.

The operation of the semiconductor device refers to operation in which learning data is input to the semiconductor device described in Embodiment 1 in FIG. 1 so that the semiconductor device learns the learning data, object data is input to the semiconductor device, and judgment whether the learning data and the object data match, are similar, or mismatch is made. FIG. 13 and FIG. 14 are flowcharts of the operation of the semiconductor device. The operation of the semiconductor device in FIG. 1 is described as an example below.

«Learning»

First, operation where the semiconductor device learns data is described with reference to FIG. 1 and FIG. 13.

[Step S1-1]

In Step S1-1, learning data is input from the outside to the neuron circuit IN. Note that learning data correspond to input signals I[1] to I[l] in FIG. 1. Note that leaning data is represented in binary here, and the number of input neuron circuits IN to which learning data is input is determined in accordance with the number of bits of the learning data. The semiconductor device preferably has a configuration in which data which makes an output signal x a fixed value is input to an input neuron circuit IN for which input of learning is not necessary. Moreover, the semiconductor device preferably has a configuration in which supply of power to such input neuron circuit IN is stopped. Here, there is one kind of learning data and the value of an i-th bit of learning data is denoted by learning data I[i]. Learning data I[1] to I[l] are input to the input neuron circuits IN[1] to IN[l], respectively.

[Step S1-2]

In Step S1-2, output signals x[1] to x[l] are input from the input neuron circuit IN [1] to IN[l] to hidden synapse circuits HS[1,1] to IN[1, l]. In Step S1-2, a signal x[0] with a constant value is input to hidden synapse circuits HS[1,0] to HS[m, 0]. The hidden synapse circuits HS[1,0] to HS[1, l] each output a signal w[1,i]x[i] obtained by multiplying the output signal x[i] by a weight coefficient w[1,i] held in the analog memory AM1, to a hidden error circuit HE[1] and a hidden neuron circuit HN[1].

The above operation is also performed in hidden synapse circuits HS[m, 0] to HS[m, l], and an output signal w[m, i]x[i] is output to a hidden error circuit HE[m] and a hidden neuron circuit HN[m].

[Step S1-3]

In Step S1-3, $\Sigma w[1,i]x[i]$ that is the sum of the output signals of the hidden synapse circuits HS[1, 0] to HS[1, l] is input to the hidden neuron circuit HN[1]. Similarly, $\Sigma w[m, i]x[i]$ that is the sum of the output signals of the hidden synapse circuits HS[m, 0] to HS[m, l] is input to the hidden neuron circuit HN[m].

Note that the number of the hidden neuron circuits HN[1] to HN[m] can be changed corresponding to learning data. It is preferable that data which makes an output signal y a fixed value be input to a hidden neuron circuit HN for which input of learning is not necessary. Moreover, it is preferable that supply of power to such a hidden neuron circuit HN be stopped. Here, the number of the hidden neuron circuits HN is m, and an input value of a j-th hidden neuron circuit HN is expressed as $\Sigma w[j, i]x[i]$.

[Step S1-4]

In Step S1-4, output signals y[1] to y[m] are input from the hidden neuron circuits HN[1] to HN[m] to output synapse circuits OS[1,1] to OS[1,m]. In Step S1-4, a signal y[0] that is a constant value is input to the output synapse circuits OS[1,0] to OS[n, 0]. The output synapse circuits OS[1, 0] to OS[1, m] each output an output signal v[1,j]y[j] obtained by multiplying the output signal y[j] by the weight coefficient v[1,j] held in the analog memory AM2, to output error circuits OE [1] and OE[n].

The above operation is also performed in the output synapse circuits OS[n, 0] to OS[n, m], and an output signal v[n, j]y[j] is output to the output neuron circuits ON[1] and ON[n].

[Step S1-5]

In Step S1-5, $\Sigma v[1, j]y[j]$ that is the sum of the output signals of the output synapse circuits OS[1, 0] to OS[1, m] is input to the output neuron circuit ON[1]. Similarly, $\Sigma v[n,$ j]y[j] that is the sum of the output signals of the output synapse circuits OS[n, 0] to OS[n, m] is input to the output neuron circuit ON[n]. The output neuron circuits ON[1] to ON[n] output the output signals O[1] to O[n].

The output neuron circuit ON[1] outputs a differential signal ey[1] to the output error circuit OE[1] based on Σv[1,j]y[j] that is the sum of the output signals of the output synapse circuits OS[1, 0] to OS[1, m] and a teacher signal T[1] from the outside. Similarly, the output neuron circuit ON[n] outputs a differential signal ey[n] to the output error circuit OE[n] based on Σv[n,j]y[j] that is the sum of the output signals of the output synapse circuits OS[n, 0] to OS[n, m] and the teacher signal T[n] from the outside.

[Step S1-6]

In Step S1-6, a differential signal ey[1] and Σv[1,j]y[j] that is the sum of the output signals of the output synapse circuits OS[1, 0] to OS[1, m] are input from the output neuron circuit ON[1] to the output error circuit OE[1]. The output error circuit OE[1] outputs an output signal dy[1] obtained by multiplying the differential signal ey[1] by a signal obtained by differentiating Σv[1, j]y[j], to the output synapse circuits OS[1,0] to OS[1,m].

Similarly, in Step S1-6, the differential signal ey[n] and Σv[n, j]y[j] that is the sum of the output signals of the output synapse circuits OS[n, 0] to OS[n, m] are input from the output neuron circuit ON[n] to the output error circuit OE[n]. The output error circuit OE[n] outputs an output signal dy[n] obtained by multiplying the differential signal ey[n] by a signal obtained by differentiating Σv[n, j]y[j], to the hidden synapse circuits OS[n, 0] to OS[n, m].

[Step S1-7]

In Step S1-7, based on the output signal dy[1], the weight coefficient v[1, j] held in the analog memory AM2 in each of the output synapse circuits OS[1, 0] to [1, m] is updated. Similarly, in Step S1-7, based on the output signal dy[n], a weight coefficient v[n, j] held in the analog memory AM2 in each of the output synapse circuits OS[n, 0] to OS[n, m] is updated. In addition, in output synapse circuits OS[1, 1] to OS[n, 1], output signals v[1, 1]dy[1] to v[n, 1]dy[n] obtained by multiplying the updated coefficients v[1, 1] to v[n, 1] by the output signals dy[1] to dy[n] are input to the hidden error circuit HE[1]. Similarly, in the output synapse circuits OS[1, m] to OS[n, m], output signals v[1, m]dy[1] to v[n, 1]dy[n] obtained by multiplying the updated coefficients v[1, m] to v[n, m] by the output signals dy[1] to dy[n] are input to the hidden error circuit HE[m].

[Step S1-8]

In Step S1-8, Σw[1,i]x[i] that is the sum of the output signals of the hidden synapse circuits HS[1, 0] to HS[1, l], and ex[1] that is the sum of the output signals of the output synapse circuits OS[1, 1] to OS[n, 1] are input to the hidden error circuit HE[1]. The hidden error circuit HE[1] outputs an output signal dx[1] obtained by multiplying the signal ex[1] by a signal obtained by differentiating Σw[1,i]x[i], to the hidden synapse circuits HS[1, 0] to HS[1, l].

Similarly, in Step S1-8, Σw[m, i]x[i] that is the sum of the output signals of the hidden synapse circuits HS[m, 0] to HS[m, 1], and ex[m] that is the sum of the output signals of the output synapse circuits OS[1, m] to OS[n, m] are input to the hidden error circuit HE[m]. The hidden error circuit HE[m] outputs an output signal dx[m] obtained by multiplying the signal ex[m] by a signal obtained by differentiating Σw[m, i]x[i], to the hidden synapse circuits HS[m,0] to HS[m, 1].

[Step S1-9]

In Step S1-9, based on the output signal dx[1], the weight coefficient w[1, i] held in the analog memory AM1 in each of the hidden synapse circuits HS[1,0] to HS[1,l] is updated to a weight coefficient dw[1, i]. Similarly, in Step S1-9, based on the output signal dx[m], the weight coefficient w[m, i] held in the analog memory AM1 in each of the hidden synapse circuits HS[m, 0] to HS[m, 1] is updated to a weight coefficient dw[m, i]

Hereafter, Step S1-2 to Step S1-9 are repeated for a predetermined number of times based on the updated weight coefficients dw[1, i] to dw[m, i].

[Step S1-10]

In Step S1-10, judgement whether a predetermined number of times of Step S1-2 to Step S1-9 has been repeated is made. When the number of times has reached the predetermined number of times, learning of learning data is completed.

Ideally, the predetermined number of times is preferably set such that the error between the output signals O[1] to O[n] and the teacher signals T[1] to T[n] falls within a control value; however, it may be an arbitrary number of times empirically determined.

[Step S1-11]

In Step S1-11, whether the learning data is all learned is determined. When learning of learning data has not been completed, Steps S1-1 to S1-10 are repeated. When learning of all the learning data has completed, it is completed. A configuration may be employed in which after learning of all the learning data is finished once, leaning is performed again.

In the hierarchical perceptron neural network, it is preferable that there be multiple hidden layers, that is, a multilayer hidden synapse circuit and a multilayer hidden neuron circuit. When the multilayer hidden synapse circuit and the multilayer hidden neuron circuit are provided, update of the weight coefficients can be repeatedly performed, so that learning efficiency can be improved.

«Comparison»

Next, operation in which object data is input to the semiconductor device in FIG. 1 where data has been learned in advance and a result is output is described with reference to FIG. 14. Among a plurality of data learned here, data expected to be the nearest to the object data is output as a result.

[Step S2-1]

In Step S2-1, object data is input from the outside to the input neuron circuit IN. Note that the object data here is represented in binary and is 1-bit which is the same number of bits as the learning data input in Step S1-1 in FIG. 10, and is input to the input neuron circuits IN[1] to IN[l].

[Step S2-2]

In Step S2-2, the output signals x[1] to x[l] corresponding to object data are input from the input neuron circuit IN[1] to IN[l] to the hidden synapse circuits HS[1, 1] to IN[1, 1]. In Step S2-2, the signal x[0] that is a constant value is input to the hidden synapse circuits HS[1, 0] to HS[m, 0]. The hidden synapse circuits HS[1, 0] to HS[1,l] output an output signal w[1, i]x[i] obtained by multiplying the output signal x[i] by the weight coefficient w[1, i] held in learning Step S1-9, to the hidden neuron circuit HN[1].

The above operation is also performed in the hidden synapse circuits HS[m, 0] to HS[m, 1], and the output signal w[m, i]x[i] is output to the hidden neuron circuit HN[m].

[Step S2-3]

In Step S2-3, Σw[1,i]x[i] that is the sum of the output signals of the hidden synapse circuits HS[1, 0] to HS[1, l] is input to the hidden neuron circuit HN[1]. Similarly, Σw[m, i]x[i] that is the sum of the output signals of the hidden synapse circuit HS[m, 0] to HS[m, l] is input to the hidden neuron circuit HN[m].
[Step S2-4]

In Step S2-4, the output signals y[1] to y[m] are input from the hidden neuron circuits HN[1] to HN[m] to the output synapse circuits OS[1, 1] to OS[n, 1]. In Step S2-4, a signal y[0] that is a constant value is input to the output synapse circuits OS[1, 0] to OS[n, 0]. The output synapse circuits OS[1, 0] to OS[1, m] output the output signal v[1, j]y[j] obtained by multiplying the output signal y[j] by the weight coefficient v[1, j] held in the analog memory AM2, to the output neuron circuit ON[1].

The above operation is also performed in the output synapse circuits OS[n, 0] to OS[n, m], and the output signal v[n, j]y[j] is output to the output neuron circuit ON[n].
[Step S2-5]

In Step S2-5, Σv[1, j]y[j] that is the sum of the output signals of the output synapse circuits OS[1, 0] to OS[1, m] are input to the output neuron circuit ON[1]. Similarly, Σv[n, j]y[j] that is the sum of the output signals of the output synapse circuits OS[n, 0] to OS[n, m] are input to the output neuron circuit ON[n]. The output neuron circuits ON[1] to ON[n] output the output signals O[1] to O[n].

Here, in the case where any of the output signals O[1] to O[n] match or is extremely close to any of a plurality of learning data, it is data given as a teacher signal when learning data is learned. In other words, judgement whether learning data and object data match, are similar, or mismatch can be made.

Through Step S1-1 to Step S1-10 and Step S2-1 to Step S2-5 which are described above, the semiconductor device in FIG. 1 is made to learn learning data, and then can output a signal corresponding to data which matches or mismatches learning data by receiving object data. Thus, the semiconductor device in FIG. 1 can perform processing such as pattern recognition or associative storage.

(Embodiment 3)

In this embodiment, an operation example of the case where the semiconductor device in FIG. 1 described in Embodiment 1 is used as an encoder is described.

«Example of Object Motion Detection»

First, an example of a method for detecting an object motion is described. FIGS. 15A to 15F illustrate an algorithm for detecting an object motion in image data with an encoder.

FIG. 15A shows image data 10 that has a triangle 11 and a circle 12. FIG. 15B shows image data 20 where the triangle 11 and the circle 12 of the image data 10 are moved to the upper right.

Image data 30 in FIG. 15C shows operation by which a region 31 including the triangle 11 and the circle 12 is extracted from the image data 10. In the image data 30, a cell at the upper left corner of the extracted region 31 is regarded as a reference point (0, 0), and numbers indicating positions in the right/left direction and the upper/lower direction are added to the image data 10. The extracted region 31 of FIG. 15C is shown in FIG. 15E.

Image data 40 in FIG. 15D shows operation by which a plurality of regions 41 are extracted from the image data 20. The numbers indicating positions in the right/left direction and the upper/lower direction given to the image data 30 are added to the image data 20, which is the image data 40. On the basis of the image data 30 and 40, which position the region 31 moves to can be expressed by a displacement (a motion vector). FIG. 15F shows some of the extracted regions 41.

After the operation of extracting the plurality of regions 41, the regions 41 are sequentially compared with the region 31 to detect a motion of the objects. This comparing operation determines that the region 41 with a motion vector (1, −1) corresponds to the region 31, and that the regions 41 except the one with the motion vector (1, −1) do not correspond to the region 31. Accordingly, the motion vector (1, −1) from the region 31 to the region 41 can be obtained.

In this specification, the data of the region 31 is described as learning data in some cases, and the data of one of the plurality of regions 41 is described as object data in some cases.

Although the extraction, comparison, and detection are performed based on the regions each formed of 4×4 cells in FIGS. 15A to 15F, the size of the regions in the present operation example is not limited thereto. The size of the regions may be changed as appropriate in accordance with the size of image data to be extracted. For example, extraction, comparison, and detection may be performed based on the regions each formed of 3×5 cells. There is no limitation on the number of pixels forming a cell; for example, one cell used for forming a region may be formed of 10×10 pixels, or be one pixel. Alternatively, one cell used for forming a region may be formed of 5×10 pixels.

Depending on the video content, image data contained in the region 31 may be changed. For example, the triangle 11 or the circle 12 in the region 31 may be scaled in the image data 40. Alternatively, the triangle 11 or the circle 12 in the region 31 may be rotated in the image data 40. In that case, it is effective to obtain how much degree each of the plurality of regions 41 corresponds to the region 31. Specifically, external output signals of the region 31 and the plurality of regions 41 are calculated and then, a displacement (motion vector) of the region 41 with the minimum difference between the external output signals is obtained. To achieve this, it is preferable that whether or not the region 31 and any of the plurality of regions 41 are identical be determined by characteristics extraction or the like. Motion-compensated prediction becomes possible when image data where the region 31 moves in the motion vector direction is generated from the image data of the region 31 and a difference between the generated data and the plurality of regions 41 is obtained. When the moving amount of the image data of the region 31 is not coincident with an integral multiple of the pixel pitch, the external output signals may be calculated on the basis of comparison between the region 31 and the plurality of regions 41 so that a displacement with the minimum difference between the external output signals is predicted and detected as a displacement (motion vector) of the objects.

<Judgement of Match, Similarity, or Mismatch of Image Data>

Figure 16:
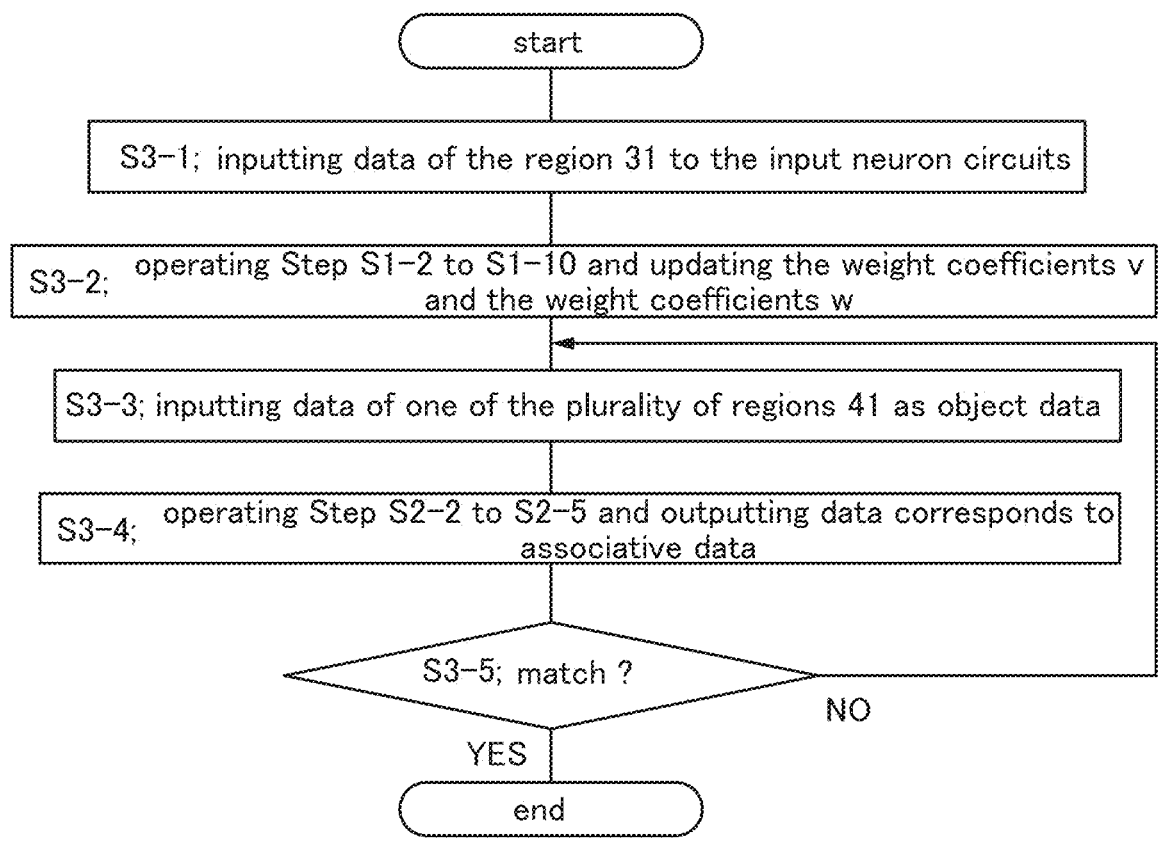
FIG. 16 illustrates an example of a flowchart.

Next, a motion compensation prediction method using the encoder is described with reference to FIG. 16.
[Step S3-1]

In Step S3-1, data of the region 31 is input to the input neuron circuits IN[1] to IN[l] in the semiconductor device in FIG. 1 as learning data. Note that the learning data is data of the region 31 represented in binary, and is of l-bits.
[Step S3-2]

In Step S3-2, input of data of the region 31 is performed in operation similar to Step S1-2 to Step S1-10. In other words, in all the hidden synapse circuits HS and the output synapse circuits OS, the weight coefficients v and the weight coefficients w are updated repeatedly, and the weight coefficients v and weight coefficients w of the hidden synapse circuits HS and the output synapse circuits OS corresponding to the data of the region 31 are updated.

[Step S3-3]

In Step S3-3, as object data, data of one of the plurality of regions 41 is input to the semiconductor device in FIG. 1 having the updated weight coefficients v and weight coefficients w in Step S3-2. Note that the object data is data of one of the regions 41 represented in binary, and is of l-bits.

[Step S3-4]

In Step S3-4, input of data of one of the plurality of regions 41 is performed in operation similar to Step S2-2 to Step S2-5. In other words, by input of data of one of the plurality of regions 41, the semiconductor device 100 which has learned data of the region 31 outputs data corresponding to associative data.

Here, judgement whether the data of the region 31 and the data of one of the plurality of regions 41 match, or mismatch is made.

[Step S3-5]

In Step S3-5, in accordance with the above judgement results, the step to which the process proceeds is determined.

When the judgement result shows a mismatch of the data of the region 31 and the one of the plurality of regions 41, the region 41 different from the one of the plurality of regions 41 is subjected to the operation in Step S3-3 and Step S3-4 again as the object data.

When the judgement result shows a match of the data of the region 31 and data of the one of the plurality of regions 41, a motion vector of one of the plurality of regions 41 using the region 31 as a reference is obtained, so that the operation is terminated. By obtaining the motion vector, motion compensation prediction using the motion vector as a difference can be performed. The motion compensation prediction enables efficient compression of image data.

In the case where the data of the region 31 and the data of the one of the plurality of regions 41 are similar, the judgement result shows a match. Note that in the case where the data of the region 31 and the data of the plurality of regions 41 are similar, the judgement result shows a match for the plurality of the regions 41. In that case, the correspondence degree between the data of the region 31 and each of the plurality of regions 41 is judged, so that displacements of objects are predicted and detected as motion vector of the objects. Then, the operation is terminated.

When comparison is performed using data of all of the regions 41 as the object data and the judgement result shows a mismatch or non-similarity of the learning data and all of the object data, it is judged that a motion vector for motion compensation prediction cannot be obtained from the data of the region 31 and data of the plurality of regions 41, and then, the operation is terminated.

Through the above operation, the hierarchical perceptron neural network can be used as an encoder which compresses image data. Thus, an encoder with high efficiency which can compress a large volume of image data can be provided.

(Embodiment 3)

In this embodiment, a broadcast system according to the disclosed invention will be described.

<Broadcast System>

Figure 17:
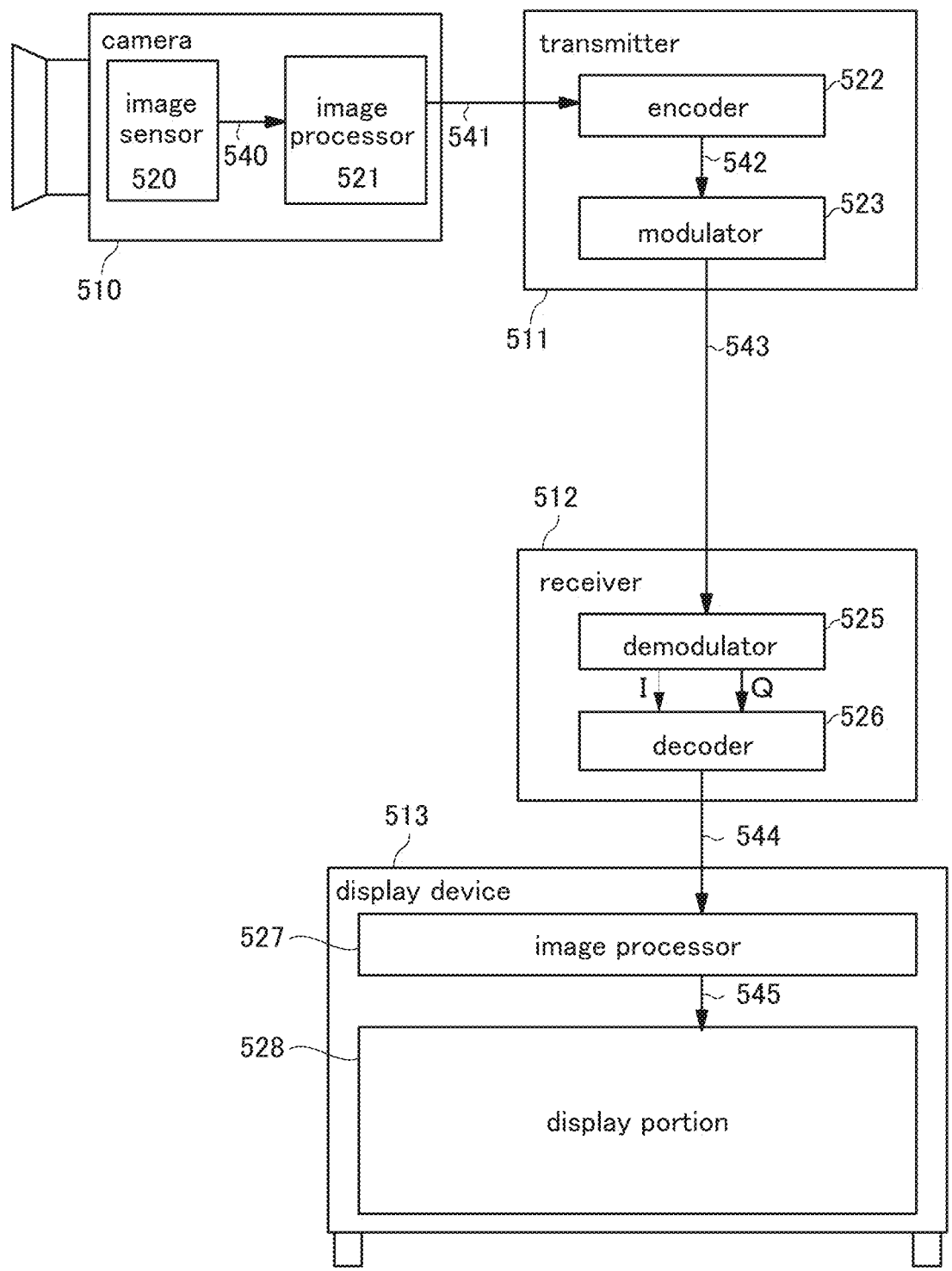
FIG. 17 illustrates an example of a block diagram.

FIG. 17 is a block diagram schematically illustrating a configuration example of a broadcast system. A broadcast system 500 includes a camera 510, a transmitter 511, a receiver 512, and a display device 513. The camera 510 includes an image sensor 520 and an image processor 521. The transmitter 511 includes an encoder 522 and a modulator 523. The receiver 512 includes a demodulator 525 and a decoder 526. The display device 513 includes an image processor 527 and a display portion 528.

When the camera 510 is capable of taking an 8K video, the image sensor 520 includes a sufficient number of pixels to capture an 8K color image. For example, when one red (R) subpixel, two green (G) subpixels, and one blue (B) subpixel are included in one pixel, the image sensor 520 with an 8K camera needs at least 7680×4320×4 [R, G+G, and B] pixels, the image sensor 520 with a 4K camera needs at least 3840×2160×4 pixels, and the image sensor 520 with a 2K camera needs at least 1920×1080×4 pixels.

The image sensor 520 generates Raw data 540 which is not processed. The image processor 521 performs image processing (such as noise removal or interpolation processing) on the Raw data 540 and generates image data 541. The image data 541 is output to the transmitter 511.

The transmitter 511 processes the image data 541 and generates a broadcast signal (carrier wave) 543 that accords with a broadcast band. The encoder 522 processes the image data 541 and generates encoded data 542. The encoder 522 performs processing such as encoding of the image data 541, addition of broadcast control data (e.g., authentication data) to the image data 541, encryption, or scrambling (data rearrangement for spread spectrum).

The modulator 523 performs IQ modulation (orthogonal amplitude modulation) on the encoded data 542 to generate and output the broadcast signal 543. The broadcast signal 543 is a composite signal including data on components of I (identical phase) and Q (quadrature phase). A TV broadcast station takes a role in obtaining the image data 541 and supplying the broadcast signal 543.

The receiver 512 receives the broadcast signal 543. The receiver 512 has a function of converting the broadcast signal 543 into image data 544 that can be displayed on the display device 513. The demodulator 525 demodulates the broadcast signal 543 and decomposes it into two analog signals: an I signal and a Q signal.

The decoder 526 performs processing of converting the I signal and the Q signal into a digital signal. Moreover, the decoder 526 performs various processing on the digital signal and generates a data stream. This processing includes frame separation, decryption of a low density parity check (LDPC) code, separation of broadcast control data, descramble processing, and the like. The decoder 526 decodes the data stream and generates the image data 544. The processing for decoding includes orthogonal transform such as discrete cosine transform (DCT) and discrete sine transform (DST), intra-frame prediction processing, motion-compensated prediction processing, and the like.

The image data 544 is input to the image processor 527 of the display device 513. The image processor 527 processes the image data 544 and generates a data signal 545 that can be input to the display portion 528. Examples of the processing by the image processor 527 include image processing (gamma processing) and digital-analog conversion. When receiving the data signal 545, the display portion 528 displays an image.

Figure 18:
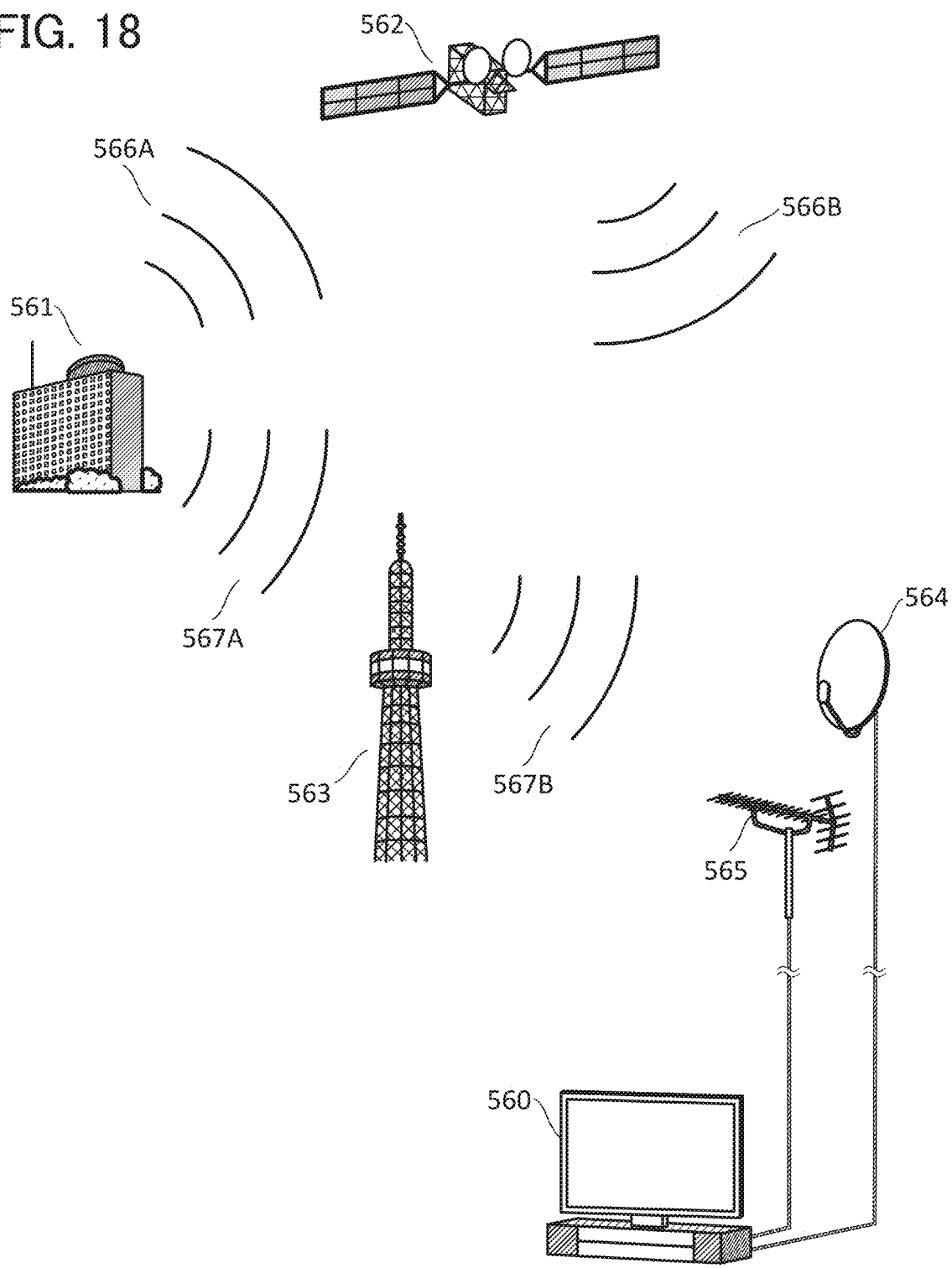
FIG. 18 illustrates examples of schematic diagrams.

FIG. 18 schematically illustrates data transmission in the broadcast system. FIG. 18 illustrates a path in which a radio wave (a broadcast signal) transmitted from a broadcast station 561 is delivered to a television receiver (TV) 560 of every household. The TV 560 is provided with the receiver 512 and the display device 513. As examples of an artificial satellite 562, a communication satellite (CS) and a broadcast satellite (BS) can be given. As examples of an antenna 564, a BS·110° CS antenna and a CS antenna can be given. Examples of the antenna 565 include an ultra-high frequency (UHF) antenna.

Radio waves 566A and 566B are broadcast signals for a satellite broadcast. The artificial satellite 562 transmits the radio wave 566B toward the ground when receiving the radio wave 566A. The antenna 564 of every household receives the radio wave 566B, and a satellite TV broadcast can be watched on the TV 560. Alternatively, the radio wave 566B is received by an antenna of another broadcast station, and a receiver in the broadcast station processes the radio wave 566B into a signal that can be transmitted to an optical cable. The broadcast station transmits the broadcast signal to the TV 560 of every household using an optical cable network. Radio waves 567A and 567B are broadcast signals for a terrestrial broadcast. A radio wave tower 563 amplifies the received radio wave 567A and transmits it as the radio wave 567B. A terrestrial TV broadcast can be watched on the TV 560 of every household when the antenna 565 receives the radio wave 567B.

A video distribution system of this embodiment is not limited to a system for a TV broadcast. Image data to be distributed may be either moving image data or still image data.

For example, the image data 541 of the camera 510 may be distributed via a high-speed IP network. The distribution system of the image data 541 can be used in, for example, the medical field for remote diagnosis and remote treatment. In medical practice, e.g., in accurate diagnostic imaging, high definition (8K, 4K, or 2K) images are required. FIG. 19 schematically illustrates an emergency medical system using the distribution system of the image data.

A high-speed network 605 performs communication between an emergency transportation vehicle (an ambulance) 600 and a medical institution 601 and between the medical institution 601 and a medical institution 602. The ambulance 600 is equipped with a camera 610, an encoder 611, and a communication device 612.

A patient taken to the medical institution 601 is photographed with the camera 610. Image data 615 obtained with the camera 610 can be transmitted in an uncompressed state by the communication device 612, so that the high-resolution image data 615 can be transmitted to the medical institution 601 with a short delay. In the case where the high-speed network 605 cannot be used for the communication between the ambulance 600 and the medical institution 601, the image data 615 can be encoded with the encoder 611 and encoded image data 616 can be transmitted.

In the medical institution 601, a communication device 620 receives the image data transmitted from the ambulance 600. When the received image data is uncompressed data, the data is transmitted via the communication device 620 and displayed on a display device 623. When the image data is compressed data, the data is decompressed with a decoder 621, transmitted to a server 622 and the display device 623, and then displayed on the display device 623. Judging from the image on the display device 623, doctors give instructions to crews of the ambulance 600 or staff members in the medical institution 601 who treat the patient. The doctors can check the condition of the patient in detail in the medical institution 601 while the patient is taken by the ambulance because the distribution system in FIG. 19 can transmit a high-definition image. Therefore, the doctors can give instructs to the ambulance crews or the staff members appropriately in a short time, resulting in improvement of a lifesaving rate of patients.

The communication of image data between the medical institution 601 and the medical institution 602 can be performed in the same way. A medical image obtained from an image diagnostic device (such as CT or MRI) of the medical institution 601 can be transmitted to the medical institution 602. Here, the ambulance 600 is given as an example of the means to transport patients; however, an aircraft such as a helicopter or a vessel may be used.

Figure 20A:
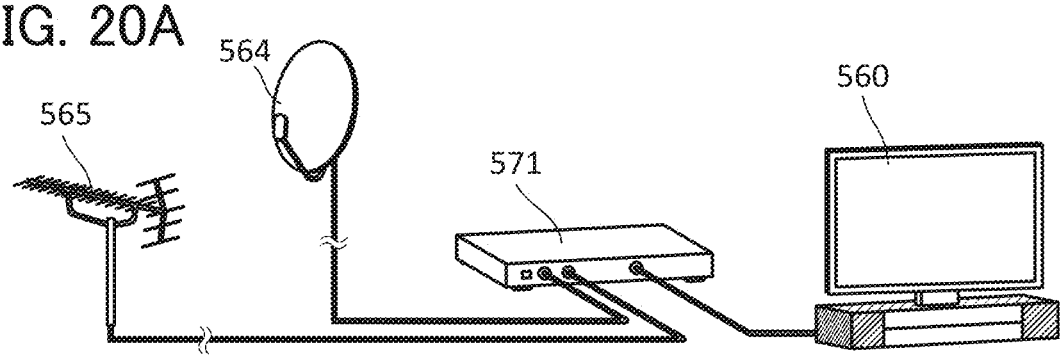
FIGS. 20A to 20D each illustrate an example of a receiver device.
Figure 20B:
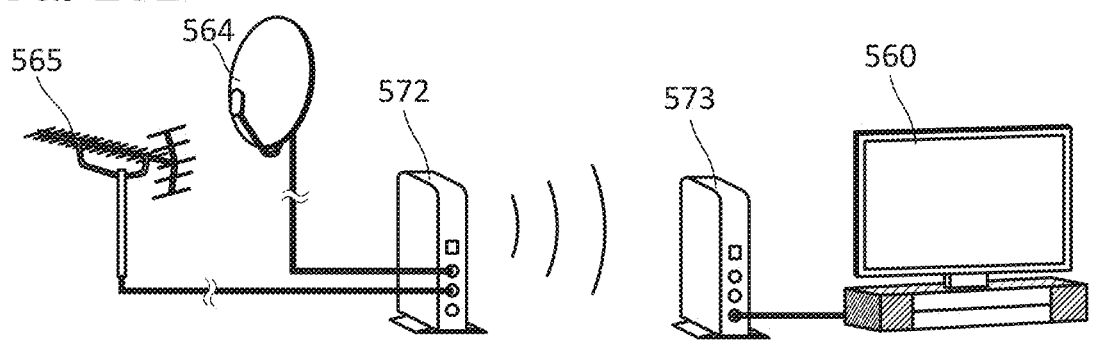
Figure 20C:
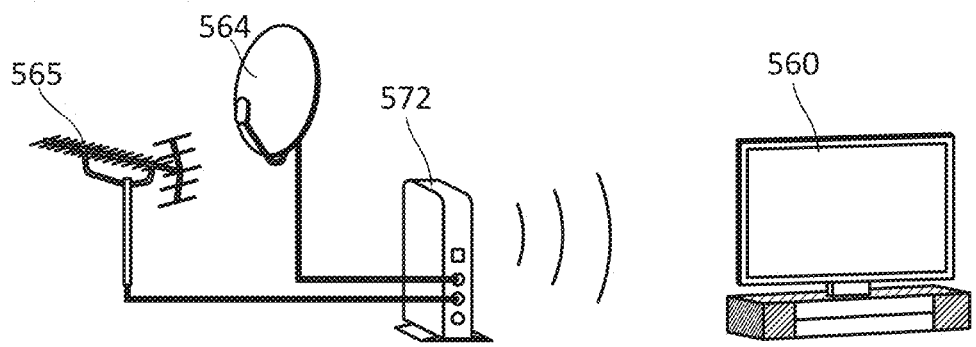
Figure 20D:
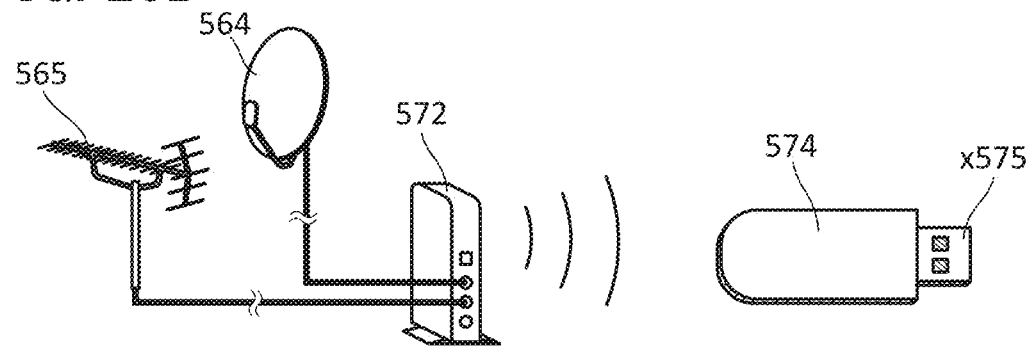

FIGS. 20A to 20D illustrate structure examples of a receiver. The TV 560 can receive a broadcast signal with a receiver and perform display. FIG. 20A illustrates a case where a receiver 571 is provided outside the TV 560. FIG. 20B illustrates another case where the antennas 564 and 565 and the TV 560 perform data transmission/reception through wireless devices 572 and 573. In this case, the wireless device 572 or 573 functions as a receiver. The wireless device 573 may be incorporated in the TV 560 as illustrated in FIG. 20C.

The size of a receiver can be reduced so that it can be portable. A receiver 574 illustrated in FIG. 20D includes a connector portion 575. If a display device and an electronic device such as an information terminal (e.g., a personal computer, a smartphone, a mobile phone, or a tablet terminal) include a terminal capable of being connected to the connector portion 575, they can be used to watch a satellite broadcast or a terrestrial broadcast.

The semiconductor device 100 described in Embodiment 1 can be used for the encoder 522 of the broadcast system 500 in FIG. 17. Alternatively, the encoder 522 can be formed by combining a dedicated IC, a processor (e.g., GPU or CPU), and the like. Alternatively, the encoder 522 can be integrated into one dedicated IC chip.

<Encoder>

FIG. 21 is a block diagram showing an example of the encoder 522. The encoder 522 includes circuits 591 to 594.

The circuit 591 performs source encoding, and includes an inter-frame prediction circuit 591*a*, a motion compensation prediction circuit 591*b*, and a DCT circuit 591*c*. The circuit 592 includes a video multiplex encoding processing circuit. The circuit 593 includes a low density parity check (LDPC) encoding circuit 593*a*, an authentication processing circuit 593*b*, and a scrambler 593*c*. The circuit 594 is a digital-analog conversion (DAC) portion.

The circuit 591 performs source encoding of the transmitted image data 541. The source encoding means processing by which a redundant component is removed from the image data. Note that the completely original image data cannot be obtained from data output from the circuit 591; the source encoding is irreversible processing.

The inter-frame prediction circuit 591*a* makes a prediction image of a frame to be encoded from the previous and/or subsequent frames to encode the prediction image. The motion compensation prediction circuit 591*b* detects a motion, a change in shape, or the like of an object in the image data 541, calculates the amount of the change, rotation, expansion/contraction, or the like, makes a prediction image of a frame including the object, and encodes the prediction image. The DCT circuit 591*c* uses discrete cosine transform to convert pixel region data of the image data into frequency domain information.

The circuit 591 has a function of quantization of the source-encoded image data 541 through the inter-frame prediction circuit 591*a*, the motion compensation prediction circuit 591*b*, and the DCT circuit 591*c*. The quantization means operation of matching frequency components obtained by the DCT circuit 591*c* with the respective discrete values. This operation can reduce the large data in the image data 541. To the circuit 592, the circuit 591 transmits the image data that is source-encoded and quantized and a data stream 551 including data obtained by motion-compensated prediction.

The circuit 592 changes the data in the data stream 551 into a variable-length code and compresses it to multiplex. To multiplex means operation of arranging a plurality of data so that they can be transmitted as one bit column or bite column. The data subjected to video multiplex coding is transmitted to the circuit 593 as a data stream 552.

The circuit 593 mainly performs error correction coding, authentication, and encryption of the data stream 552 transmitted from the circuit 592. The LDPC encoding circuit 593a performs error correction coding and transmits data through a communication channel with noise. The authentication processing circuit 593b gives an identification (ID) code, a password, and the like to data to be transmitted in order to prevent data recovery in an unintended receiver. The scrambler 593c converts a transmission data column of data to be transmitted into a random column irrelevant to a signal data column. The converted data can be restored to the original data by descrambling at a receiver. The circuit 593 performs error correction coding, authentication, and encryption of the data stream 552, and transmits the results as a data stream 553 to the circuit 594.

The circuit 594 performs digital-analog conversion of the data stream 553 to transmit the data stream 553 to the receiver 512. The data stream 553 subjected to digital-analog conversion is transmitted to the modulator 523 as encoded data 542.

(Embodiment 4)

Described in this embodiment are transistors of one embodiment of the disclosed invention.

A transistor in one embodiment of the present invention preferably includes an nc-OS or a CAAC-OS, which is described in Embodiment 5.

<Structure Example 1 of Transistor>

Figure 22A:
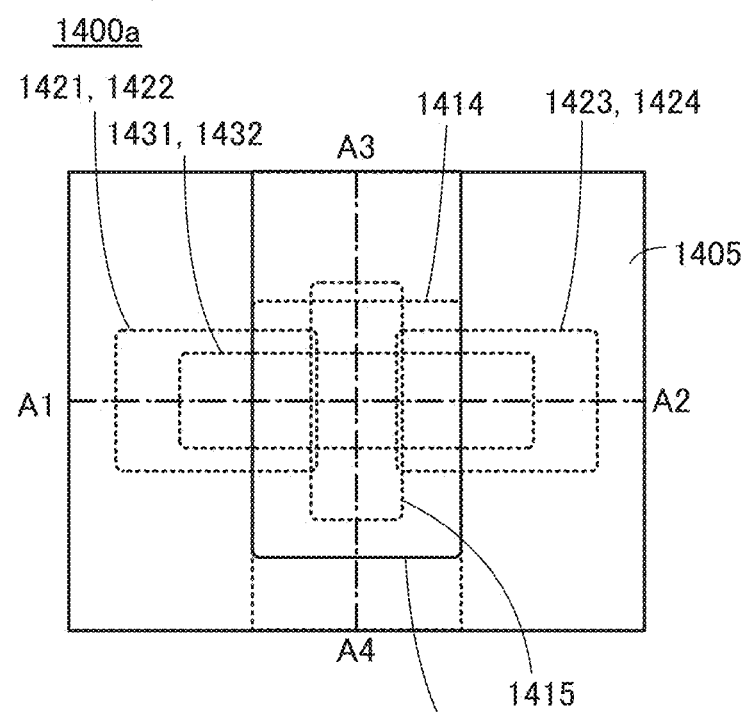
FIGS. 22A to 22C illustrate examples of a top view and cross-sectional views.
Figure 22B:
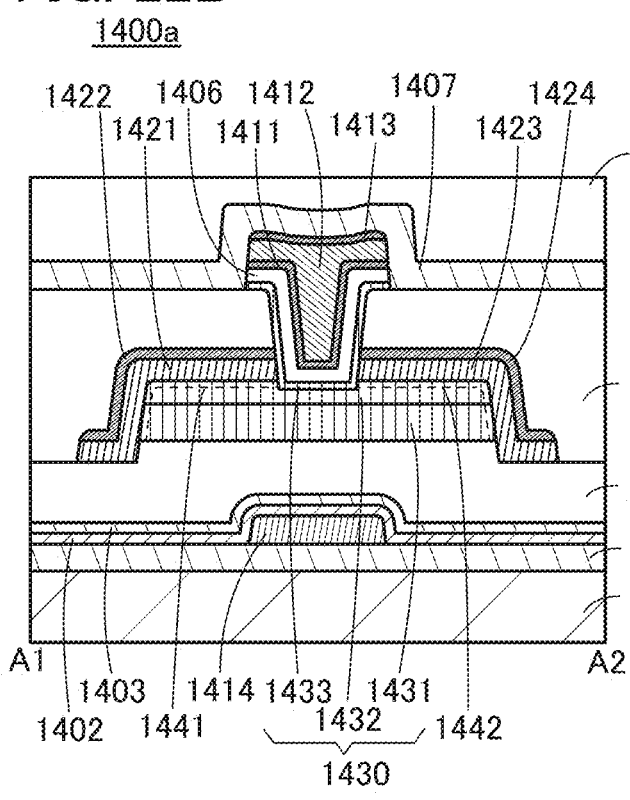
Figure 22C:
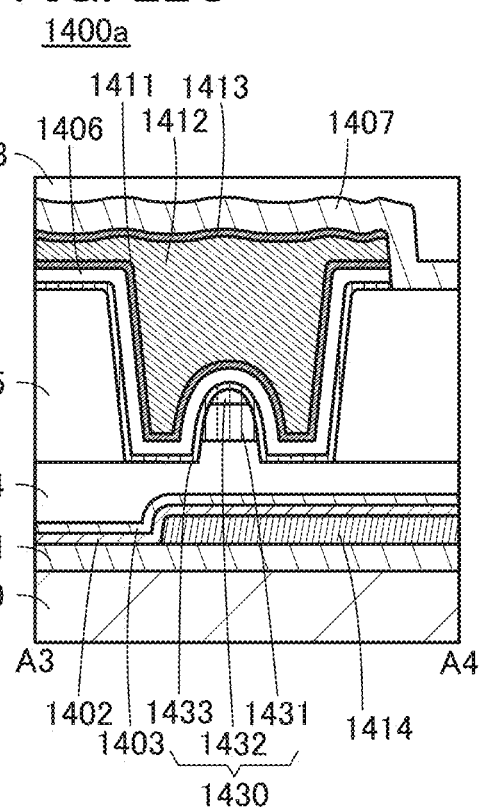

FIGS. 22A to 22C are a top view and cross-sectional views of a transistor 1400a. FIG. 22A is a top view. FIG. 22B is a cross-sectional view taken along dashed-dotted line A1-A2 in FIG. 22A and FIG. 22C is a cross-sectional view taken along dashed-dotted line A3-A4 in FIG. 22A. Note that for simplification of the drawing, some components are not illustrated in the top view in FIG. 22A. Note that the dashed-dotted line A1-A2 and the dashed-dotted line A3-A4 are sometimes referred to as a channel length direction of the transistor 1400a and a channel width direction of the transistor 1400a, respectively.

The transistor 1400a includes a substrate 1450, an insulating film 1401 over the substrate 1450, a conductive film 1414 over the insulating film 1401, an insulating film 1402 covering the conductive film 1414, an insulating film 1403 over the insulating film 1402, an insulating film 1404 over the insulating film 1403, a metal oxide 1431 and a metal oxide 1432 which are stacked in this order over the insulating film 1404, a conductive film 1421 in contact with top and side surfaces of the metal oxide 1432, a conductive film 1423 also in contact with the top and side surfaces of the metal oxide 1432, a conductive film 1422 over the conductive film 1421, a conductive film 1424 over the conductive film 1423, an insulating film 1405 over the conductive films 1422 and 1424, a metal oxide 1433 in contact with the metal oxides 1431 and 1432, the conductive films 1421 to 1424, and the insulating film 1405, an insulating film 1406 over the metal oxide 1433, a conductive film 1411 over the insulating film 1406, a conductive film 1412 over the conductive film 1411, a conductive film 1413 over the conductive film 1412, an insulating film 1407 covering the conductive film 1413, and an insulating film 1408 over the insulating film 1407. Note that the metal oxides 1431 to 1433 are collectively referred to as a metal oxide 1430.

The metal oxide 1432 is a semiconductor and serves as a channel of the transistor 1400a.

Furthermore, the metal oxides 1431 and 1432 include a region 1441 and a region 1442. The region 1441 is formed in the vicinity of a region where the conductive film 1421 is in contact with the metal oxides 1431 and 1432. The region 1442 is formed in the vicinity of a region where the conductive film 1423 is in contact with the metal oxides 1431 and 1432.

The regions 1441 and 1442 serve as low-resistance regions. The region 1441 contributes to a decrease in the contact resistance between the conductive film 1421 and the metal oxides 1431 and 1432. The region 1442 also contributes to a decrease in the contact resistance between the conductive film 1423 and the metal oxides 1431 and 1432.

The conductive films 1421 and 1422 serve as one of source and drain electrodes of the transistor 1400a. The conductive films 1423 and 1424 serve as the other of the source and drain electrodes of the transistor 1400a.

The conductive film 1422 is configured to allow less oxygen to pass therethrough than the conductive film 1421. It is thus possible to prevent a decrease in the conductivity of the conductive film 1421 due to oxidation.

The conductive film 1424 is also configured to allow less oxygen to pass therethrough than the conductive film 1423. It is thus possible to prevent a decrease in the conductivity of the conductive film 1423 due to oxidation.

The conductive films 1411 to 1413 serve as a first gate electrode of the transistor 1400a.

The conductive films 1411 and 1413 are configured to allow less oxygen to pass therethrough than the conductive film 1412. It is thus possible to prevent a decrease in the conductivity of the conductive film 1412 due to oxidation.

The insulating film 1406 serves as a first gate insulating film of the transistor 1400a.

The conductive film 1414 serves as a second gate electrode of the transistor 1400a.

The potential applied to the conductive films 1411 to 1413 may be the same as or different from that applied to the conductive film 1414. The conductive film 1414 may be omitted in some cases.

The insulating films 1401 to 1404 serve as a base insulating film of the transistor 1400a. The insulating films 1402 to 1404 also serve as a second gate insulating film of the transistor 1400a.

The insulating films 1405 to 1408 serve as a protective insulating film or an interlayer insulating film of the transistor 1400a.

As shown in FIG. 22C, the side surface of the metal oxide 1432 is surrounded by the conductive film 1411. With this structure, the metal oxide 1432 can be electrically surrounded by an electric field of the conductive film 1411. A structure in which a semiconductor is electrically surrounded by an electric field of a gate electrode is referred to as a surrounded channel (s-channel) structure. With such a structure, a channel is formed in the entire metal oxide 1432 (bulk). In the s-channel structure, a large amount of current can flow between a source and a drain of a transistor, increasing the on-state current of the transistor.

The s-channel structure, because of its high on-state current, is suitable for a semiconductor device such as large-scale integration (LSI) which requires a miniaturized transistor. A semiconductor device including the miniaturized transistor can have a high integration degree and high density.

In the transistor 1400a, a region serving as a gate electrode is formed so as to fill an opening 1415 formed in the insulating film 1405 or the like, that is, in a self-aligned manner.

As shown in FIG. 22B, the conductive films 1411 and 1422 have a region where they overlap with each other with the insulating film positioned therebetween. The conductive films 1411 and 1423 also have a region where they overlap with each other with the insulating film positioned therebetween. These regions serve as the parasitic capacitance caused between the gate electrode and the source or drain electrode and might decrease the operation speed of the transistor 1400a. This parasitic capacitance can be reduced by providing the insulating film 1405 in the transistor 1400a. The insulating film 1405 preferably contains a material with a low relative dielectric constant.

Figure 23A:
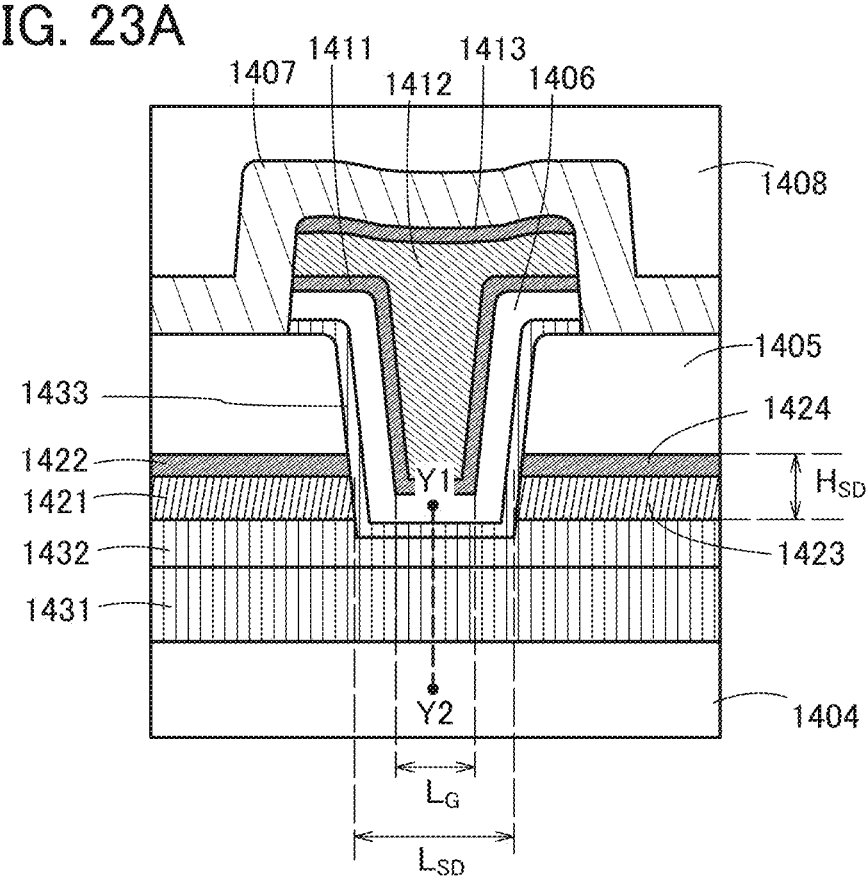
FIGS. 23A and 23B illustrate examples of a cross-sectional view and an energy band diagram.

FIG. 23A is an enlarged view of the center of the transistor 1400a. In FIG. 23A, a width $L_G$ denotes the length of the bottom surface of the conductive film 1411, which faces parallel to the top surface of the metal oxide 1432 with the insulating film 1406 and the metal oxide 1433 positioned therebetween. The width $L_G$ is the line width of the gate electrode. In FIG. 23A, a width $L_{SD}$ indicates the length between the conductive films 1421 and 1423. The width $L_{SD}$ is the length between the source electrode and the drain electrode.

The width $L_{SD}$ is generally determined by the minimum feature size. As shown in FIG. 23A, the width $L_G$ is narrower than the width $L_{SD}$. This means that in the transistor 1400a, the line width of the gate electrode can be made narrower than the minimum feature size; specifically, the width $L_G$ can be greater than or equal to 5 nm and less than or equal to 60 nm, preferably greater than or equal to 5 nm and less than or equal to 30 nm.

In FIG. 23A, a height $H_{SD}$ denotes the total thickness of the conductive films 1421 and 1422, or the total thickness of the conductive films 1423 and 1424.

The thickness of the insulating film 1406 is preferably less than or equal to the height $H_{SD}$, in which case the electric field of the gate electrode can be applied to the entire channel formation region. The thickness of the insulating film 1406 is less than or equal to 30 nm, preferably less than or equal to 10 nm.

The parasitic capacitance between the conductive films 1422 and 1411 and the parasitic capacitance between the conductive films 1424 and 1411 are inversely proportional to the thickness of the insulating film 1405. For example, the thickness of the insulating film 1405 is preferably three times or more, and further preferably five times or more the thickness of the insulating film 1406, in which case the parasitic capacitance is negligibly small. As a result, the transistor 1400a can operate at high frequencies.

Components of the transistor 1400a will be described below.

«Metal Oxide Layer»

First, a metal oxide that can be used as the metal oxides 1431 to 1433 will be described.

The transistor 1400a preferably has a low current (off-state current) flowing between a source and a drain in the non-conduction state. Examples of the transistor with a low off-state current include a transistor including an oxide semiconductor in a channel formation region.

The metal oxide 1432 is an oxide semiconductor containing indium (In), for example. The metal oxide 1432 can have high carrier mobility (electron mobility) by containing indium, for example. The metal oxide 1432 preferably contains an element M The element M is preferably aluminum (Al), gallium (Ga), yttrium (Y), tin (Sn), or the like. Other elements that can be used as the element M are boron (B), silicon (Si), titanium (Ti), iron (Fe), nickel (Ni), germanium (Ge), zirconium (Zr), molybdenum (Mo), lanthanum (La), cerium (Ce), neodymium (Nd), hafnium (Hf), tantalum (Ta), tungsten (W), magnesium (Mg), and the like. Note that two or more of the above elements may be used in combination as the element M. The element M is an element having a high bonding energy with oxygen, for example. The element M is an element whose bonding energy with oxygen is higher than that of indium, for example. The element M is an element that can increase the energy gap of the metal oxide, for example. Furthermore, the metal oxide 1432 preferably contains zinc (Zn). When containing zinc, the metal oxide is easily crystallized in some cases.

Note that the metal oxide 1432 is not limited to the oxide semiconductor containing indium. The metal oxide 1432 may be an oxide semiconductor that does not contain indium and contains at least one of zinc, gallium, and tin (e.g., a zinc tin oxide or a gallium tin oxide) or the like.

For the metal oxide 1432, an oxide semiconductor with a wide energy gap is used, for example. The energy gap of the metal oxide 1432 is, for example, greater than or equal to 2.5 eV and less than or equal to 4.2 eV, preferably greater than or equal to 2.8 eV and less than or equal to 3.8 eV, more preferably greater than or equal to 3 eV and less than or equal to 3.5 eV.

The metal oxide 1432 is preferably a CAAC-OS film which is described later in Embodiment 5.

The metal oxides 1431 and 1433 include, for example, one or more elements other than oxygen included in the metal oxide 1432. Since the metal oxides 1431 and 1433 include one or more elements other than oxygen included in the metal oxide 1432, an interface state is less likely to be formed at an interface between the metal oxides 1431 and 1432 and an interface between the metal oxides 1432 and 1433.

In the case of using an In-M-Zn oxide as the metal oxide 1431, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. When the metal oxide 1431 is formed by a sputtering method, a sputtering target with an atomic ratio of In:M:Zn=1:3:2, 1:3:4, or the like can be used.

In the case of using an In-M-Zn oxide as the metal oxide 1432, when the total proportion of In and M is assumed to be 100 atomic %, the proportions of In and M are preferably set to be higher than 25 atomic % and lower than 75 atomic %, respectively, more preferably higher than 34 atomic % and lower than 66 atomic %, respectively. When the metal oxide 1432 is formed by a sputtering method, a sputtering target with an atomic ratio of In:M:Zn=1:1:1, 1:1:1.2, 2:1:3, 3:1:2, 4:2:4.1, or the like can be used. In particular, when a sputtering target with an atomic ratio of In to Ga and Zn of 4:2:4.1 is used, the atomic ratio of In to Ga and Zn in the metal oxide 1432 may be 4:2:3 or in the neighborhood of 4:2:3.

In the case of using an In-M-Zn oxide as the metal oxide 1433, when the total proportion of In and M is assumed to be 100 atomic %, the proportions of In and M are preferably set to be lower than 50 atomic % and higher than 50 atomic %, respectively, more preferably lower than 25 atomic % and higher than 75 atomic %, respectively. For example, In:M:Zn is preferably 1:3:2, 1:3:4, or an atomic ratio in the neighborhood of either of the above atomic ratios. The metal oxide 1433 may be a metal oxide that is the same type as that of the metal oxide 1431.

The metal oxide 1431 or the metal oxide 1433 does not necessarily contain indium in some cases. For example, the metal oxide 1431 or the metal oxide 1433 may be gallium oxide.

Figure 23B:
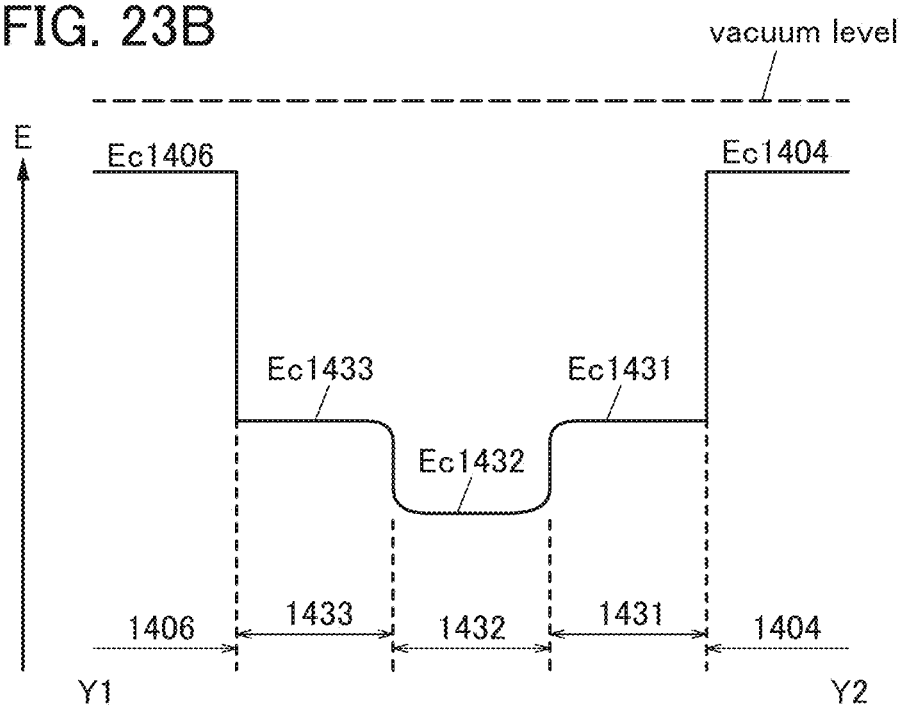

The function and effect of the metal oxide 1430, which includes a stack of the metal oxides 1431 to 1433, are described with reference to the energy band diagram of FIG. 23B. FIG. 23B shows an energy band structure of a portion taken along dashed line Y1-Y2 in FIG. 23A, that is, FIG. 23B shows the energy band structure of a channel formation region of the transistor 1400a and the vicinity thereof.

In FIG. 23B, Ec1404, Ec1431, Ec1432, Ec1433, and Ec1406 indicate the energy at the bottom of the conduction band of the insulating film 1404, the metal oxide 1431, the metal oxide 1432, the metal oxide 1433, and the insulating film 1406, respectively.

Here, a difference in energy between the vacuum level and the bottom of the conduction band (the difference is also referred to as "electron affinity") corresponds to a value obtained by subtracting an energy gap from a difference in energy between the vacuum level and the top of the valence band (the difference is also referred to as an ionization potential). Note that the energy gap can be measured using a spectroscopic ellipsometer. The energy difference between the vacuum level and the top of the valence band can be measured using an ultraviolet photoelectron spectroscopy (UPS) device.

Since the insulating films 1404 and 1406 are insulators, Ec1406 and Ec1404 are closer to the vacuum level (i.e., have a lower electron affinity) than Ec1431, Ec1432, and Ec1433.

The metal oxide 1432 is a metal oxide having higher electron affinity than those of the metal oxides 1431 and 1433. For example, as the metal oxide 1432, a metal oxide having an electron affinity higher than those of the metal oxides 1431 and 1433 by greater than or equal to 0.07 eV and less than or equal to 1.3 eV, preferably greater than or equal to 0.1 eV and less than or equal to 0.7 eV, more preferably greater than or equal to 0.15 eV and less than or equal to 0.4 eV is used. Note that the electron affinity refers to an energy gap between the vacuum level and the bottom of the conduction band.

An indium gallium oxide has a small electron affinity and a high oxygen-blocking property. Therefore, the metal oxide 1433 preferably includes an indium gallium oxide. The gallium atomic ratio [Ga/(In+Ga)] is, for example, higher than or equal to 70%, preferably higher than or equal to 80%, more preferably higher than or equal to 90%.

At this time, when gate voltage is applied, a channel is formed in the metal oxide 1432 having the highest electron affinity among the metal oxides 1431 to 1433.

Therefore, electrons move mainly in the metal oxide 1432, not in the metal oxides 1431 and 1433. Hence, the on-state current of the transistor hardly varies even when the density of interface states, which inhibit electron movement, is high at the interface between the metal oxide 1431 and the insulating film 1404 or at the interface between the metal oxide 1433 and the insulating film 1406. The metal oxides 1431 and 1433 function as an insulating film.

In some cases, there is a mixed region of the metal oxides 1431 and 1432 between the metal oxides 1431 and 1432. Furthermore, in some cases, there is a mixed region of the metal oxides 1432 and 1433 between the metal oxides 1432 and 1433. Because the mixed region has a low interface state density, a stack of the metal oxides 1431 to 1433 has a band structure where energy at each interface and in the vicinity of the interface is changed continuously (continuous junction).

As described above, the interface between the metal oxides 1431 and 1432 or the interface between the metal oxides 1432 and 1433 has a low interface state density. Hence, electron movement in the metal oxide 1432 is less likely to be inhibited and the on-state current of the transistor can be increased.

Electron movement in the transistor is inhibited, for example, in the case where physical unevenness in a channel formation region is large. To increase the on-state current of the transistor, for example, root mean square (RMS) roughness with a measurement area of 1 μm×1 μm of a top surface or a bottom surface of the metal oxide 1432 (a formation surface; here, the top surface of the metal oxide 1431) is less than 1 nm, preferably less than 0.6 nm, more preferably less than 0.5 nm, still more preferably less than 0.4 nm. The average surface roughness (also referred to as Ra) with the measurement area of 1 μm×1 μm is less than 1 nm, preferably less than 0.6 nm, more preferably less than 0.5 nm, still more preferably less than 0.4 nm. The maximum difference in height (P-V) with the measurement area of 1 μm×1 μm is less than 10 nm, preferably less than 9 nm, more preferably less than 8 nm, still more preferably less than 7 nm. RMS roughness, Ra, and P-V can be measured using a scanning probe microscope SPA-500 manufactured by SII Nano Technology Inc.

The electron movement is also inhibited, for example, in the case where the density of defect states is high in a region where a channel is formed. For example, in the case where the metal oxide 1432 contains oxygen vacancies ($V_O$), donor levels are formed by entry of hydrogen into sites of oxygen vacancies in some cases. A state in which hydrogen enters sites of oxygen vacancies is denoted by $V_OH$ in the following description in some cases. $V_OH$ is a factor of decreasing the on-state current of the transistor because $V_OH$ scatters electrons. Note that sites of oxygen vacancies become more stable by entry of oxygen than by entry of hydrogen. Thus, by decreasing oxygen vacancies in the metal oxide 1432, the on-state current of the transistor can be increased in some cases.

For example, at a certain depth in the metal oxide 1432 or in a certain region of the metal oxide 1432, the concentration of hydrogen measured by secondary ion mass spectrometry (SIMS) is set to be higher than or equal to $1\times10^{16}$ atoms/cm$^3$ and lower than or equal to $2\times10^{20}$ atoms/cm$^3$, preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$.

To decrease oxygen vacancies in the metal oxide 1432, for example, there is a method in which excess oxygen contained in the insulating film 1404 is moved to the metal oxide 1432 through the metal oxide 1431. In that case, the metal oxide 1431 is preferably a layer having an oxygen-transmitting property (a layer through which oxygen passes or is transmitted).

Note that in the case where the transistor has an s-channel structure, a channel is formed in the entire metal oxide 1432. Therefore, as the metal oxide 1432 has larger thickness, a channel region becomes larger. In other words, the thicker the metal oxide 1432 is, the larger the on-state current of the transistor is.

Moreover, the thickness of the metal oxide 1433 is preferably as small as possible to increase the on-state current of the transistor. For example, the metal oxide 1433 has a region with a thickness of less than 10 nm, preferably less than or equal to 5 nm, more preferably less than or equal to 3 nm. Meanwhile, the metal oxide 1433 has a function of blocking entry of elements other than oxygen (such as hydrogen and silicon) included in the adjacent insulator into the metal oxide 1432 where a channel is formed. Thus, the metal oxide 1433 preferably has a certain thickness. For example, the metal oxide 1433 may have a region with a thickness of greater than or equal to 0.3 nm, preferably greater than or equal to 1 nm, more preferably greater than or equal to 2 nm. The metal oxide 1433 preferably has an oxygen blocking property to inhibit outward diffusion of oxygen released from the insulating film 1404 and the like.

To improve reliability, preferably, the thickness of the metal oxide 1431 is large and the thickness of the metal oxide 1433 is small. For example, the metal oxide 1431 has a region with a thickness of greater than or equal to 10 nm, preferably greater than or equal to 20 nm, more preferably greater than or equal to 40 nm, still more preferably greater than or equal to 60 nm. An increase in the thickness of the metal oxide 1431 can increase the distance from the interface between the adjacent insulator and the metal oxide 1431 to the metal oxide 1432 where a channel is formed. Note that the metal oxide 1431 has a region with a thickness of, for example, less than or equal to 200 nm, preferably less than or equal to 120 nm, more preferably less than or equal to 80 nm, otherwise the productivity of the semiconductor device might be decreased.

For example, a region in which the concentration of silicon is higher than or equal to $1\times10^{16}$ atoms/cm$^3$ and lower than $1\times10^{19}$ atoms/cm$^3$ is provided between the metal oxides 1432 and 1431. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. A region in which the concentration of silicon is higher than or equal to $1\times10^{16}$ atoms/cm$^3$ and lower than $1\times10^{19}$ atoms/cm$^3$ is provided between the metal oxides 1432 and 1433. The concentration of silicon is preferably higher than or equal to $1\times10^{16}$ atoms/cm$^3$ and lower than $5\times10^{18}$ atoms/cm$^3$, more preferably higher than or equal to $1\times10^{16}$ atoms/cm$^3$ and lower than $2\times10^{18}$ atoms/cm$^3$. The concentration of silicon can be measured by SIMS.

It is preferable to reduce the concentration of hydrogen in the metal oxides 1431 and 1433 in order to reduce the concentration of hydrogen in the metal oxide 1432. The metal oxides 1431 and 1433 each have a region in which the concentration of hydrogen is higher than or equal to $1\times10^{16}$ atoms/cm$^3$ and lower than or equal to $2\times10^{20}$ atoms/cm$^3$. The concentration of hydrogen is preferably higher than or equal to $1\times10^{16}$ atoms/cm$^3$ and lower than or equal to $5\times10^{19}$ atoms/cm$^3$, more preferably higher than or equal to $1\times10^{16}$ atoms/cm$^3$ and lower than or equal to $1\times10^{19}$ atoms/cm$^3$, still more preferably higher than or equal to $1\times10^{16}$ atoms/cm$^3$ and lower than or equal to $5\times10^{18}$ atoms/cm$^3$. The concentration of hydrogen can be measured by SIMS. It is also preferable to reduce the concentration of nitrogen in the metal oxides 1431 and 1433 in order to reduce the concentration of nitrogen in the metal oxide 1432. The metal oxides 1431 and 1433 each have a region in which the concentration of nitrogen is higher than or equal to $1\times10^{16}$ atoms/cm$^3$ and lower than $5\times10^{19}$ atoms/cm$^3$. The concentration of nitrogen is preferably higher than or equal to $1\times10^{16}$ atoms/cm$^3$ and lower than or equal to $5\times10^{18}$ atoms/cm$^3$, more preferably higher than or equal to $1\times10^{16}$ atoms/cm$^3$ and lower than or equal to $1\times10^{18}$ atoms/cm$^3$, still more preferably higher than or equal to $1\times10^{16}$ atoms/cm$^3$ and lower than or equal to $5\times10^{17}$ atoms/cm$^3$. The concentration of nitrogen can be measured by SIMS.

The metal oxides 1431 to 1433 may be formed by a sputtering method, a chemical vapor deposition (CVD) method, a molecular beam epitaxy (MBE) method, a pulsed laser deposition (PLD) method, an atomic layer deposition (ALD) method, or the like.

After the metal oxides 1431 and 1432 are formed, first heat treatment is preferably performed. The first heat treatment can be performed at a temperature higher than or equal to 250° C. and lower than or equal to 650° C., preferably higher than or equal to 450° C. and lower than or equal to 600° C., further preferably higher than or equal to 520° C. and lower than or equal to 570° C. The first heat treatment is performed in an inert gas atmosphere or an atmosphere containing an oxidizing gas at 10 ppm or more, 1% or more, or 10% or more. The first heat treatment may be performed under a reduced pressure. Alternatively, the first heat treatment may be performed in such a manner that heat treatment is performed in an inert gas atmosphere, and then another heat treatment is performed in an atmosphere containing an oxidizing gas at 10 ppm or more, 1% or more, or 10% or more in order to compensate desorbed oxygen. The crystallinity of the metal oxides 1431 and 1432 can be increased by the first heat treatment. Furthermore, impurities such as hydrogen and water can be removed by the first heat treatment.

The above three-layer structure is an example. For example, a two-layer structure without one of the metal oxides 1431 and 1433 may be employed. Alternatively, any one of semiconductors illustrated as the metal oxides 1431 to 1433 may be additionally provided over or under the metal oxide 1431 or over or under the metal oxide 1433, i.e., a four-layer structure may be employed. Further alternatively, an n-layer structure (n is an integer number of 5 or more) in which any one of semiconductors illustrated as the metal oxides 1431 to 1433 is additionally provided at two or more of the following positions may be employed: over the metal oxide 1431, under the metal oxide 1431, over the metal oxide 1433, and under the metal oxide 1433.

«Substrate»

As the substrate 1450, for example, an insulator substrate, a semiconductor substrate, or a conductor substrate may be used. As the insulator substrate, a glass substrate, a quartz substrate, a sapphire substrate, a stabilized zirconia substrate (e.g., an yttria-stabilized zirconia substrate), or a resin substrate is used, for example. Examples of the semiconductor substrate include a semiconductor substrate of silicon, germanium, or the like, and a compound semiconductor substrate of silicon carbide, silicon germanium, gallium arsenide, indium phosphide, zinc oxide, or gallium oxide. A semiconductor substrate in which an insulator region is provided in the above semiconductor substrate, e.g., a silicon on insulator (SOI) substrate or the like can also be used. As the conductor substrate, a graphite substrate, a metal substrate, an alloy substrate, a conductive resin substrate, or the like is used. A substrate including a metal nitride, a substrate including a metal oxide, or the like can also be used. An insulator substrate provided with a conductor or a semiconductor, a semiconductor substrate provided with a conductor or an insulator, a conductor substrate provided with a semiconductor or an insulator, or the like can also be used. Alternatively, any of these substrates over which an element is provided may be used. Examples of the element provided over the substrate include a capacitor, a resistor, a switching element, a light-emitting element, a memory element, and the like.

A flexible substrate may be used as the substrate 1450. As a method for providing a transistor over a flexible substrate, there is a method in which a transistor is formed over a non-flexible substrate, and then the transistor is separated and transferred to the substrate 1450 which is a flexible substrate. In that case, a separation layer is preferably provided between the non-flexible substrate and the transistor. As the substrate 1450, a sheet, a film, or foil containing a fiber may be used. The substrate 1450 may have elasticity. The substrate 1450 may have a property of returning to its original shape when bending or pulling is stopped. Alternatively, the substrate 1450 may have a property of not returning to its original shape. The thickness of the substrate 1450 is, for example, greater than or equal to 5 μm and less than or equal to 700 μm, preferably greater than or equal to 10 μm and less than or equal to 500 μm, more preferably greater than or equal to 15 μm and less than or equal to 300 μm. When the substrate 1450 has a small thickness, the weight of the semiconductor device can be reduced. When the substrate 1450 has a small thickness, even in the case of using glass or the like, the substrate 1450 may have elasticity or a property of returning to its original shape when bending or pulling is stopped. Therefore, an impact applied to the semiconductor device over the substrate 1450, which is caused by dropping or the like, can be reduced. That is, a durable semiconductor device can be provided.

For the flexible substrate 1450, metal, an alloy, a resin, glass, or fiber thereof can be used, for example. The flexible substrate 1450 preferably has a lower coefficient of linear expansion because deformation due to an environment can be suppressed. The flexible substrate 1450 is preferably formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, acrylic, and polytetrafluoroethylene (PTFE). In particular, aramid is preferably used as the material of the flexible substrate 1450 because of its low coefficient of linear expansion.

«Base Insulating Film»

The insulating film 1401 has a function of electrically isolating the substrate 1450 from the conductive film 1414.

The insulating film 1401 or 1402 is formed using an insulating film having a single-layer structure or a layered structure. Examples of the material of an insulating film include aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide.

The insulating film 1402 may be formed using silicon oxide with high step coverage which is formed by reacting tetraethyl orthosilicate (TEOS), silane, or the like with oxygen, nitrous oxide, or the like.

After the insulating film 1402 is formed, the insulating film 1402 may be subjected to planarization treatment using a CMP method or the like to improve the planarity of the top surface thereof.

The insulating film 1404 preferably contains an oxide. In particular, the insulating film 1404 preferably contains an oxide material from which part of oxygen is released by heating. The insulating film 1404 preferably contains an oxide containing oxygen more than that in the stoichiometric composition. Part of oxygen is released by heating from an oxide film containing oxygen in excess of the stoichiometric composition. Oxygen released from the insulating film 1404 is supplied to the metal oxide 1430, so that oxygen vacancies in the metal oxide 1430 can be reduced. Consequently, changes in the electrical characteristics of the transistor can be reduced and the reliability of the transistor can be improved.

The oxide film containing oxygen more than that in the stoichiometric composition is an oxide film of which the amount of released oxygen converted into oxygen atoms is greater than or equal to $1.0\times10^{18}$ atoms/cm$^3$, preferably greater than or equal to $3.0\times10^{20}$ atoms/cm$^3$ in thermal desorption spectroscopy (TDS) analysis. Note that the temperature of the film surface in the TDS analysis is preferably higher than or equal to 100° C. and lower than or equal to 700° C., or higher than or equal to 100° C. and lower than or equal to 500° C.

The insulating film 1404 preferably contains an oxide that can supply oxygen to the metal oxide 1430. For example, a material containing silicon oxide or silicon oxynitride is preferably used.

Alternatively, a metal oxide such as aluminum oxide, aluminum oxynitride, gallium oxide, gallium oxynitride, yttrium oxide, yttrium oxynitride, hafnium oxide, or hafnium oxynitride may be used for the insulating film 1404.

To make the insulating film 1404 contain excess oxygen, the insulating film 1404 is formed in an oxygen atmosphere, for example. Alternatively, a region containing excess oxygen may be formed by introducing oxygen into the insulating film 1404 that has been formed. Both the methods may be combined.

For example, oxygen (at least including any of oxygen radicals, oxygen atoms, and oxygen ions) may be introduced into the insulating film 1404 that has been formed, so that a region containing excess oxygen is formed. Oxygen can be introduced by an ion implantation method, an ion doping method, a plasma immersion ion implantation method, plasma treatment, or the like.

A gas containing oxygen can be used in an oxygen introducing method. As the gas containing oxygen, oxygen, nitrous oxide, nitrogen dioxide, carbon dioxide, carbon monoxide, and the like can be used. Further, a rare gas may be included in the gas containing oxygen for the oxygen introduction treatment. Hydrogen or the like may be included. For example, a mixed gas of carbon dioxide, hydrogen, and argon may be used.

After the insulating film 1404 is formed, the insulating film 1404 may be subjected to planarization treatment using a CMP method or the like to improve the planarity of the top surface thereof.

The insulating film 1403 has a passivation function of preventing oxygen contained in the insulating film 1404 from decreasing by bonding to metal contained in the conductive film 1414.

The insulating film 1403 has a function of blocking oxygen, hydrogen, water, alkali metal, alkaline earth metal, and the like. Providing the insulating film 1403 can prevent outward diffusion of oxygen from the metal oxide 1430 and entry of hydrogen, water, or the like into the metal oxide 1430 from the outside.

The insulating film 1403 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

The threshold voltage of the transistor 1400a can be controlled by injecting electrons into a charge trap layer. The charge trap layer is preferably provided in the insulating film 1402 or the insulating film 1403. For example, when the insulating film 1403 is formed using hafnium oxide, aluminum oxide, tantalum oxide, aluminum silicate, or the like, the insulating film 1403 can function as a charge trap layer.

«Gate Electrode»

The conductive films 1411 to 1414 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductive film is preferably formed using a low-resistance conductive material such as aluminum or copper. The conductive film is preferably formed using a Cu—Mn alloy, since in that case, manganese oxide formed at the interface with an insulator containing oxygen has a function of preventing Cu diffusion.

«Source Electrode and Drain Electrode»

The conductive films 1421 to 1424 each preferably have a single-layer structure or a layered structure of a conductive film containing a low-resistance material selected from copper (Cu), tungsten (W), molybdenum (Mo), gold (Au), aluminum (Al), manganese (Mn), titanium (Ti), tantalum (Ta), nickel (Ni), chromium (Cr), lead (Pb), tin (Sn), iron (Fe), cobalt (Co), ruthenium (Ru), platinum (Pt), iridium (Ir), and strontium (Sr), an alloy of such a low-resistance material, or a compound containing such a material as its main component. It is particularly preferable to use a high-melting-point material that has both heat resistance and conductivity, such as tungsten or molybdenum. In addition, the conductive film is preferably formed using a low-resistance conductive material such as aluminum or copper. The conductive film is preferably formed using a Cu—Mn alloy, since in that case, manganese oxide formed at the interface with an insulator containing oxygen has a function of preventing Cu diffusion.

The conductive films 1421 to 1424 are preferably formed using a conductive oxide including noble metal, such as iridium oxide, ruthenium oxide, or strontium ruthenate. Such a conductive oxide hardly takes oxygen from an oxide semiconductor even when it is in contact with the oxide semiconductor and hardly generates oxygen vacancies in the oxide semiconductor.

«Low-resistance Region»

The regions 1441 and 1442 are formed when, for example, the conductive films 1421 and 1423 take oxygen from the metal oxides 1431 and 1432. Oxygen is more likely to be extracted as the temperature is higher. Oxygen vacancies are formed in the regions 1441 and 1442 through several heating steps in the manufacturing process of the transistor. In addition, hydrogen enters sites of the oxygen vacancies by heating, increasing the carrier concentration in the regions 1441 and 1442. As a result, the resistance of the regions 1441 and 1442 is reduced.

«Gate Insulating Film»

The insulating film 1406 preferably contains an insulator with a high relative dielectric constant. For example, the insulating film 1406 preferably contains gallium oxide, hafnium oxide, an oxide containing aluminum and hafnium, oxynitride containing aluminum and hafnium, an oxide containing silicon and hafnium, or oxynitride containing silicon and hafnium.

The insulating film 1406 preferably has a layered structure containing silicon oxide or silicon oxynitride and an insulator with a high relative dielectric constant. Because silicon oxide and silicon oxynitride have thermal stability, combination of silicon oxide or silicon oxynitride with an insulator with a high relative dielectric constant allows the layered structure to be thermally stable and have a high relative dielectric constant. For example, when aluminum oxide, gallium oxide, or hafnium oxide is closer to the metal oxide 1433, entry of silicon from silicon oxide or silicon oxynitride into the metal oxide 1432 can be suppressed.

When silicon oxide or silicon oxynitride is closer to the metal oxide 1433, for example, trap centers might be formed at the interface between aluminum oxide, gallium oxide, or hafnium oxide and silicon oxide or silicon oxynitride. The trap centers can shift the threshold voltage of the transistor in the positive direction by trapping electrons in some cases.

«Interlayer Insulating Film and Protective Insulating Film»

The insulating film 1405 preferably contains an insulator with a low relative dielectric constant. For example, the insulating film 1405 preferably contains silicon oxide, silicon oxynitride, silicon nitride oxide, silicon nitride, or a resin. Alternatively, the insulating film 1405 preferably has a layered structure containing silicon oxide or silicon oxynitride and a resin. Because silicon oxide and silicon oxynitride have thermal stability, combination of silicon oxide or silicon oxynitride with a resin allows the layered structure to be thermally stable and have a low relative dielectric constant. Examples of the resin include polyester, polyolefin, polyamide (e.g., nylon or aramid), polyimide, polycarbonate, and acrylic.

The insulating film 1407 has a function of blocking oxygen, hydrogen, water, alkali metal, alkaline earth metal, and the like. Providing the insulating film 1407 can prevent outward diffusion of oxygen from the metal oxide 1430 and entry of hydrogen, water, or the like into the metal oxide 1430 from the outside.

The insulating film 1407 can be, for example, a nitride insulating film. The nitride insulating film is formed using silicon nitride, silicon nitride oxide, aluminum nitride, aluminum nitride oxide, or the like. Note that instead of the nitride insulating film, an oxide insulating film having a blocking effect against oxygen, hydrogen, water, and the like, may be provided. As the oxide insulating film, an aluminum oxide film, an aluminum oxynitride film, a gallium oxide film, a gallium oxynitride film, an yttrium oxide film, an yttrium oxynitride film, a hafnium oxide film, and a hafnium oxynitride film can be given.

An aluminum oxide film is preferably used as the insulating film 1407 because it is highly effective in preventing transmission of both oxygen and impurities such as hydrogen and moisture.

When the insulating film 1407 is formed by a method using plasma containing oxygen, e.g., by a sputtering method or a CVD method, oxygen can be added to side and top surfaces of the insulating films 1405 and 1406. It is preferable to perform second heat treatment at any time after the formation of the insulating film 1407. Through the second heat treatment, oxygen added to the insulating films 1405 and 1406 is diffused in the insulating films to reach the metal oxide 1430, whereby oxygen vacancies in the metal oxide 1430 can be reduced.

Figure 24A:
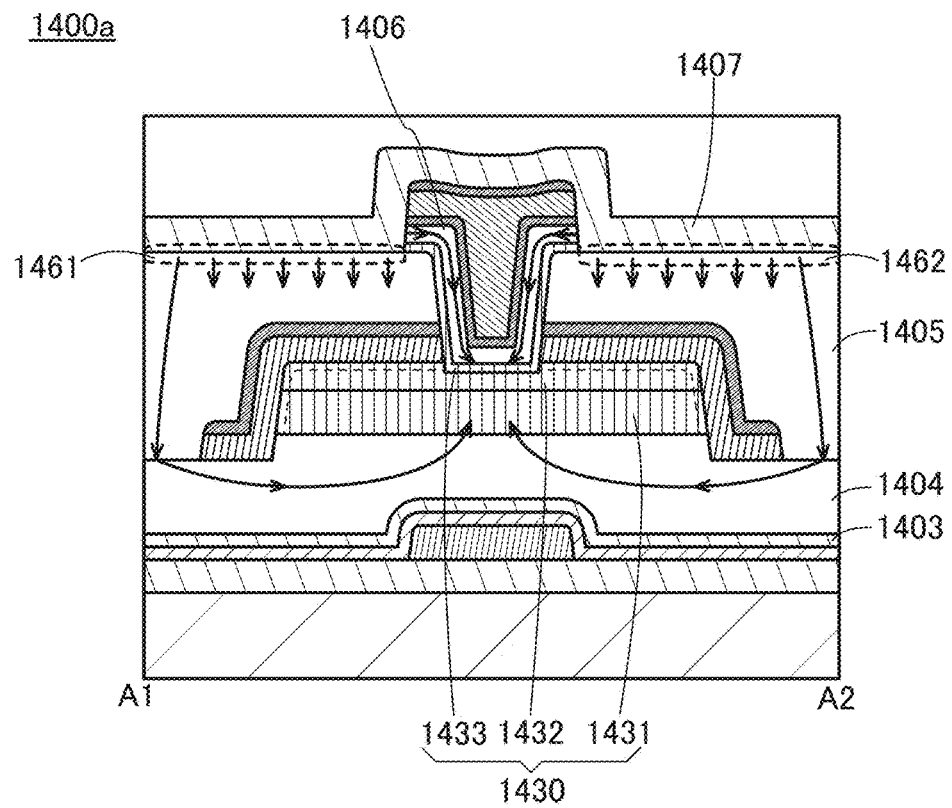
FIGS. 24A and 24B are cross-sectional views illustrating oxygen diffusion paths.
Figure 24B:
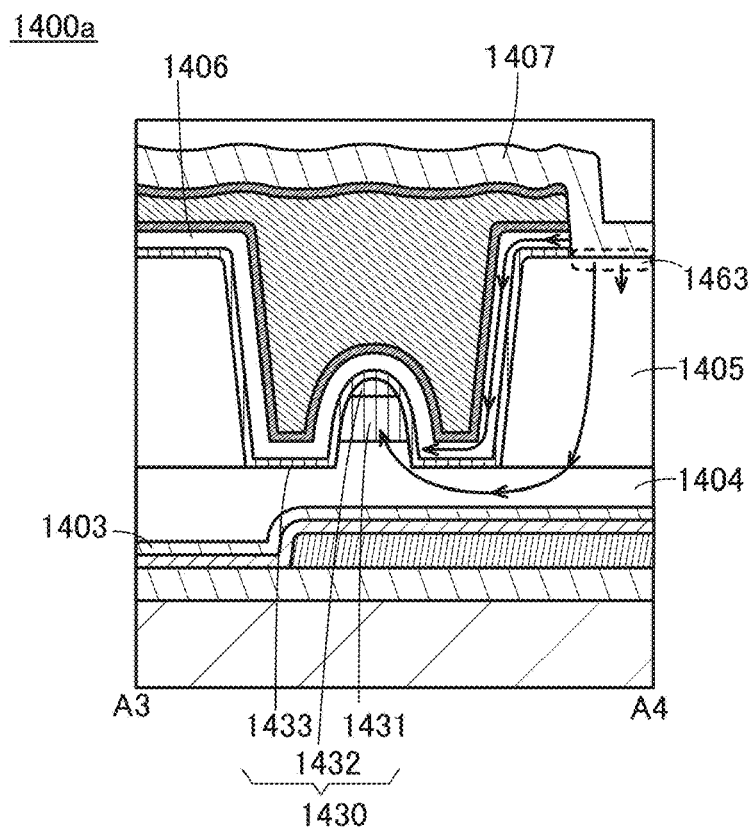

In schematic views of FIGS. 24A and 24B, oxygen added to the insulating films 1405 and 1406 in the formation of the insulating film 1407 is diffused in the insulating films through the second heat treatment and reaches the metal oxide 1430. In FIG. 24A, oxygen diffusion in the cross-sectional view of FIG. 22B is indicated by arrows. In FIG. 24B, oxygen diffusion in the cross-sectional view of FIG. 22C is indicated by arrows.

As shown in FIGS. 24A and 24B, oxygen added to the side surface of the insulating film 1406 is diffused in the insulating film 1406 and reaches the metal oxide 1430. In addition, a region 1461, a region 1462, and a region 1463 each containing excess oxygen are sometimes formed in the vicinity of the interface between the insulating films 1407 and 1405. Oxygen contained in the regions 1461 to 1463 reaches the metal oxide 1430 through the insulating films 1405 and 1404. In the case where the insulating film 1405 includes silicon oxide and the insulating film 1407 includes aluminum oxide, a mixed layer of silicon, aluminum, and oxygen is formed in the regions 1461 to 1463 in some cases.

The insulating film 1407 has a function of blocking oxygen and prevents oxygen from being diffused over the insulating film 1407. The insulating film 1403 also has a function of blocking oxygen and prevents oxygen from being diffused under the insulating film 1403.

Note that the second heat treatment may be performed at a temperature that allows oxygen added to the insulating films 1405 and 1406 to be diffused to the metal oxide 1430. For example, the description of the first heat treatment may be referred to for the second heat treatment. Alternatively, the temperature of the second heat treatment is preferably lower than that of the first heat treatment. The second heat treatment is performed at a temperature lower than that of the first heat treatment by higher than or equal to 20° C. and lower than or equal to 150° C., preferably higher than or equal to 40° C. and lower than or equal to 100° C. Accordingly, superfluous release of oxygen from the insulating film 1404 can be inhibited. Note that in the case where heating at the time of formation of the layers doubles as the second heat treatment, the second heat treatment is not necessarily performed.

As described above, oxygen can be supplied to the metal oxide 1430 from above and below through the formation of the insulating film 1407 and the second heat treatment.

Alternatively, oxygen can be added to the insulating films 1405 and 1406 by forming a film containing indium oxide, e.g., an In-M-Zn oxide, as the insulating film 1407.

The insulating film 1408 can be formed using an insulator including one or more kinds of materials selected from aluminum oxide, aluminum nitride oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, and tantalum oxide. Alternatively, for the insulating film 1408, a resin such as a polyimide resin, a polyamide resin, an acrylic resin, a siloxane resin, an epoxy resin, or a phenol resin can be used. The insulating film 1408 may be a stack including any of the above materials.

<Structure Example 2 of Transistor>

The conductive film 1414 and the insulating films 1402 and 1403 can be omitted from the transistor 1400*a* shown in FIGS. 22A to 22C. An example of such a structure is shown in FIGS. 25A to 25C.

Figure 25A:
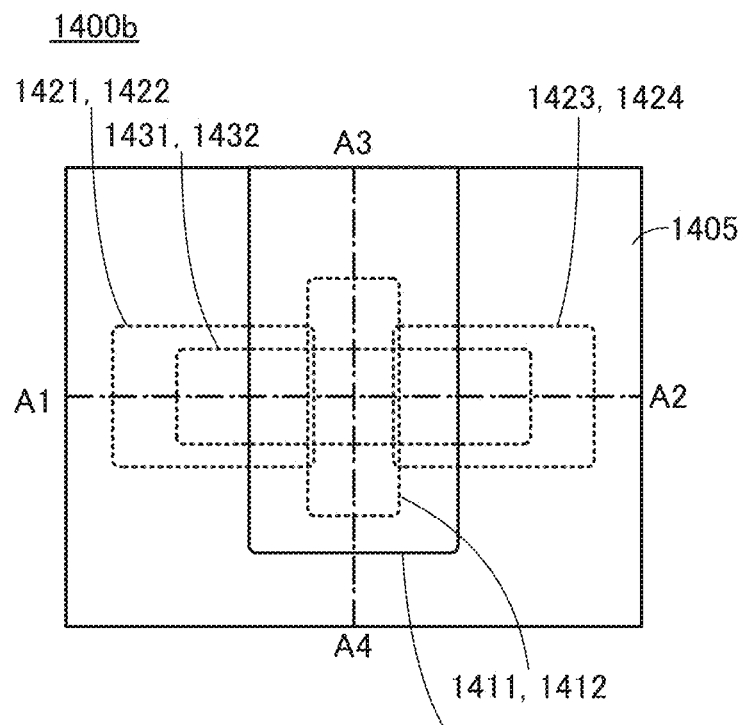
FIGS. 25A to 25C illustrate examples of a top view and cross-sectional views.
Figure 25B:
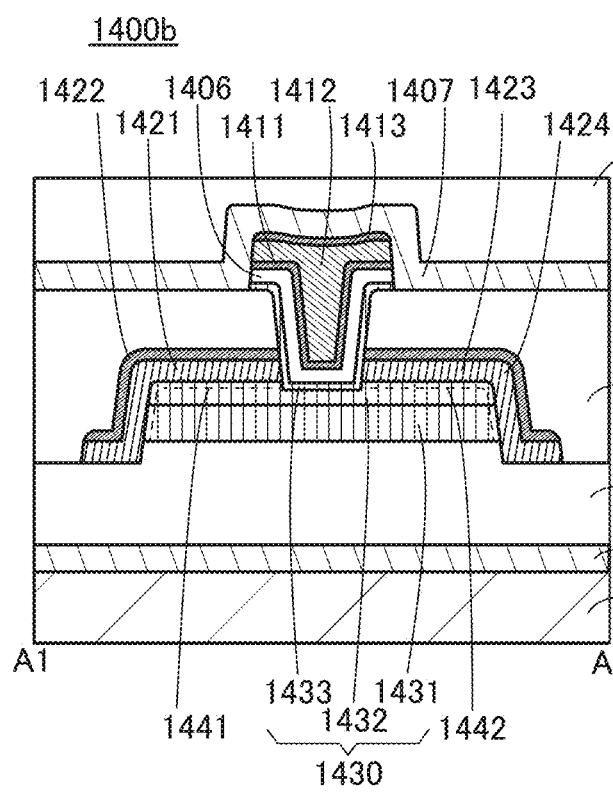
Figure 25C:
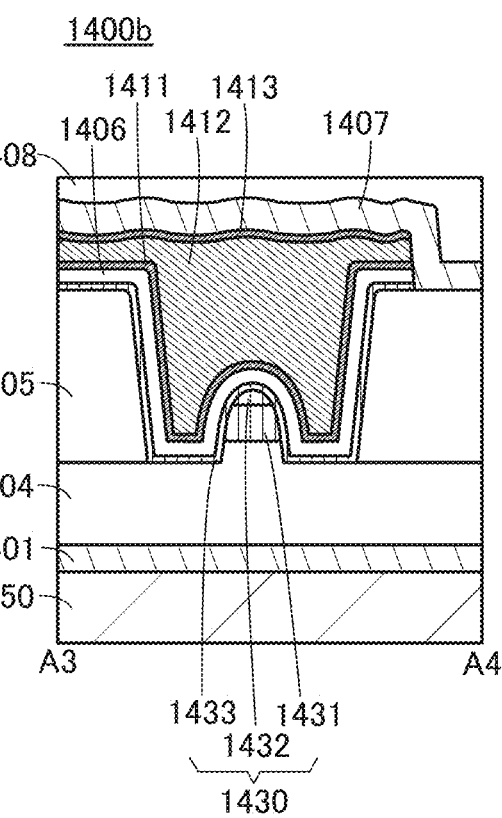

FIGS. 25A to 25C are a top view and cross-sectional views of a transistor 1400*b*. FIG. 25A is a top view. FIG. 25B is a cross-sectional view taken along dashed-dotted line A1-A2 in FIG. 25A and FIG. 25C is a cross-sectional view taken along dashed-dotted line A3-A4 in FIG. 25A. Note that for simplification of the drawing, some components are not illustrated in the top view of FIG. 25A. Note that the dashed-dotted line A1-A2 and the dashed-dotted line A3-A4 are sometimes referred to as a channel length direction of the transistor 1400*b* and a channel width direction of the transistor 1400*b*, respectively.

In the transistor 1400*a* shown in FIGS. 22A to 22C, parts of the conductive films 1421 and 1423 that overlap with the gate electrode (the conductive films 1411 to 1413) can be reduced in thickness. An example of such a structure is shown in FIGS. 26A to 26C.

Figure 26A:
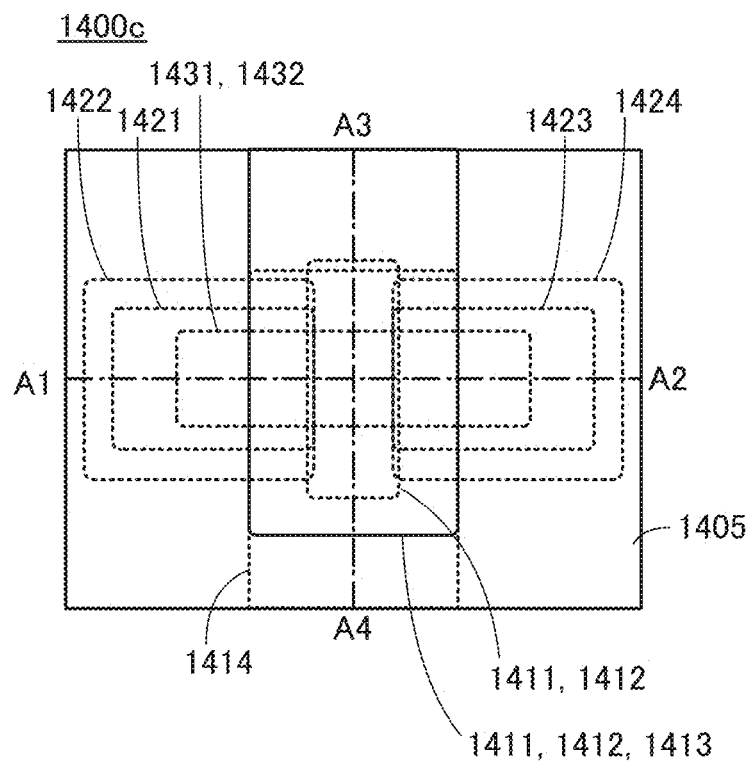
FIGS. 26A to 26C illustrate examples of a top view and cross-sectional views.
Figure 26B:
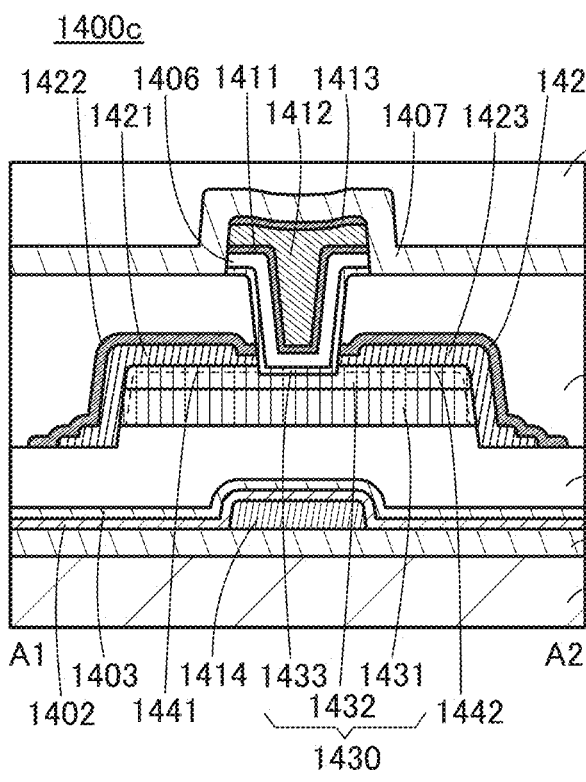
Figure 26C:
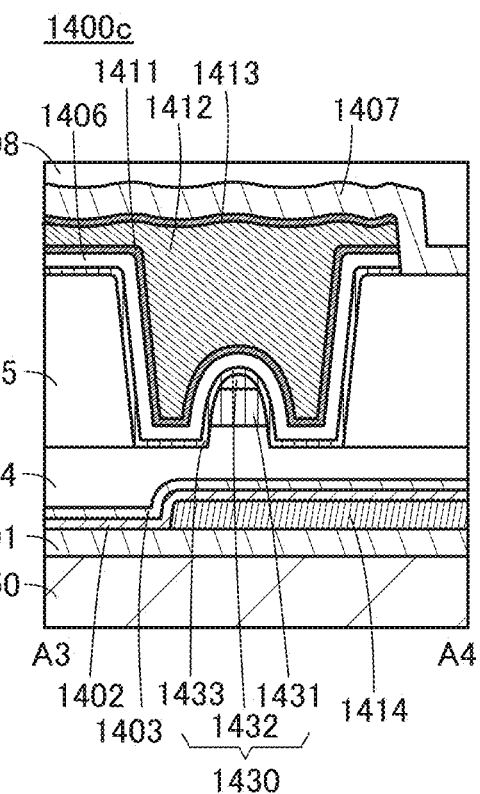

FIGS. 26A to 26C are a top view and cross-sectional views of a transistor 1400*c*. FIG. 26A is a top view. FIG. 26B is a cross-sectional view taken along dashed-dotted line A1-A2 in FIG. 26A and FIG. 26C is a cross-sectional view taken along dashed-dotted line A3-A4 in FIG. 26A. Note that for simplification of the drawing, some components in the top view in FIG. 26A are not illustrated. Note that the dashed-dotted line A1-A2 and the dashed-dotted line A3-A4 are sometimes referred to as a channel length direction of the transistor 1400*c* and a channel width direction of the transistor 1400*c*, respectively.

In the transistor 1400*c* shown in FIG. 26B, part of the conductive film 1421 that overlaps with the gate electrode is reduced in thickness, and the conductive film 1422 covers the conductive film 1421. Part of the conductive film 1423 that overlaps with the gate electrode is also reduced in thickness, and the conductive film 1424 covers the conductive film 1423.

The transistor 1400*c*, which has the structure shown in FIG. 26B, can have an increased distance between the gate and source electrodes or between the gate and drain electrodes. This results in a reduction in the parasitic capacitance formed between the gate electrode and the source and drain electrodes. As a result, the transistor can operate at high-speed.

<Structure Example 3 of Transistor>

In the transistor 1400*c* shown in FIGS. 26A to 26C, the width of the metal oxides 1431 and 1432 can be increased in the A3-A4 direction. An example of such a structure is shown in FIGS. 27A to 27C.

Figure 27A:
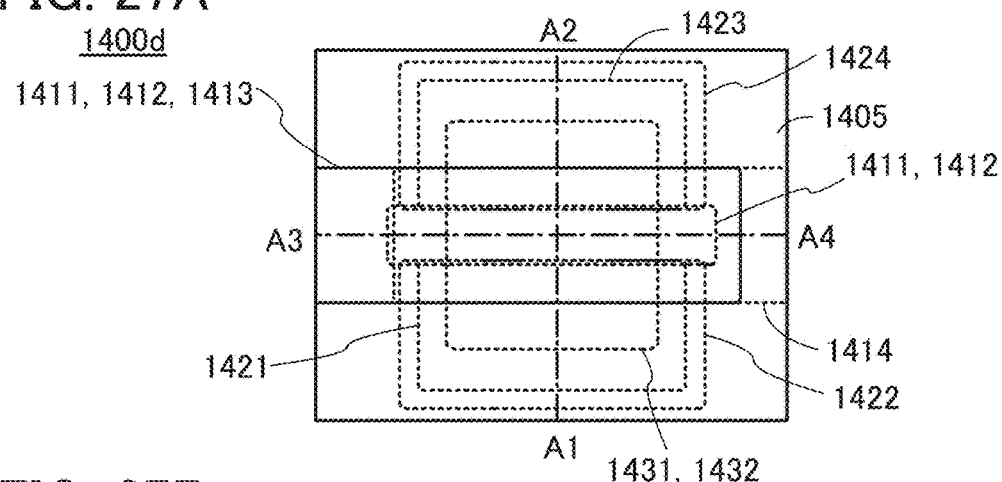
FIGS. 27A to 27C illustrate examples of a top view and cross-sectional views.
Figure 27B:
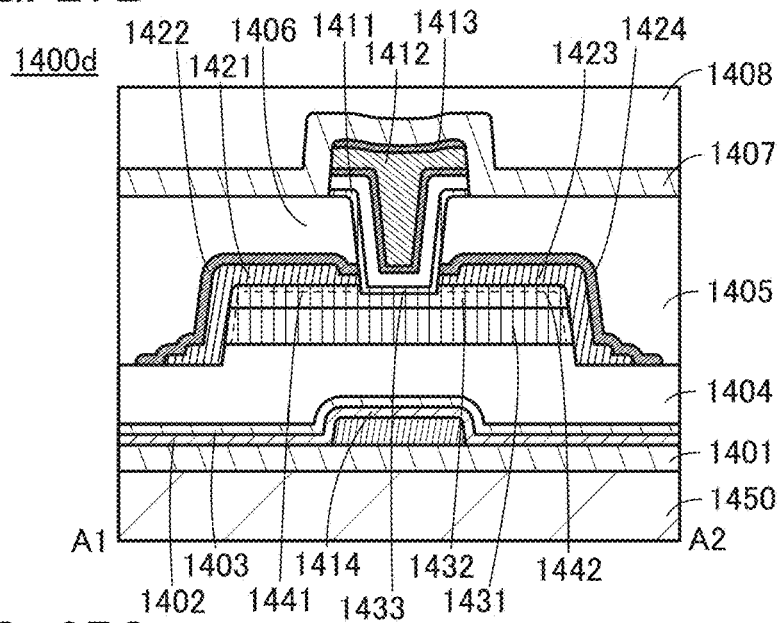
Figure 27C:
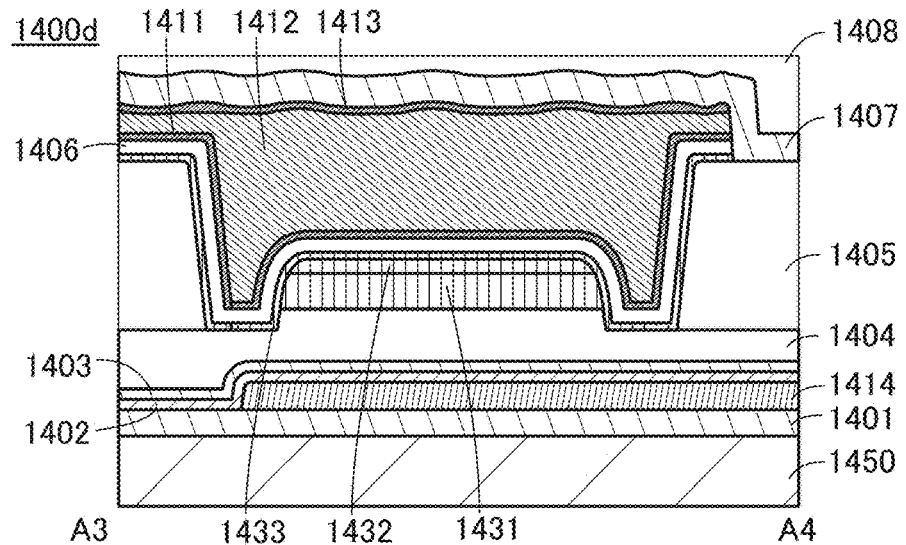

FIGS. 27A to 27C are a top view and cross-sectional views of a transistor 1400*d*. FIG. 27A is a top view. FIG. 27B is a cross-sectional view taken along dashed-dotted line A1-A2 in FIG. 27A and FIG. 27C is a cross-sectional view taken along dashed-dotted line A3-A4 in FIG. 27A. Note that for simplification of the drawing, some components are not illustrated in the top view in FIG. 27A. Note that the dashed-dotted line A1-A2 and the dashed-dotted line A3-A4 are sometimes referred to as a channel length direction of the transistor 1400*d* and a channel width direction of the transistor 1400*d*, respectively.

The transistor 1400*d*, which has the structure shown in FIGS. 27A to 27C, can have an increased on-state current.

<Structure Example 4 of Transistor>

In the transistor 1400*c* shown in FIGS. 26A to 26C, a plurality of regions (hereinafter referred to as fins) including the metal oxides 1431 and 1432 may be provided in the A3-A4 direction. An example of this case is shown in FIGS. 28A to 28C.

Figure 28A:
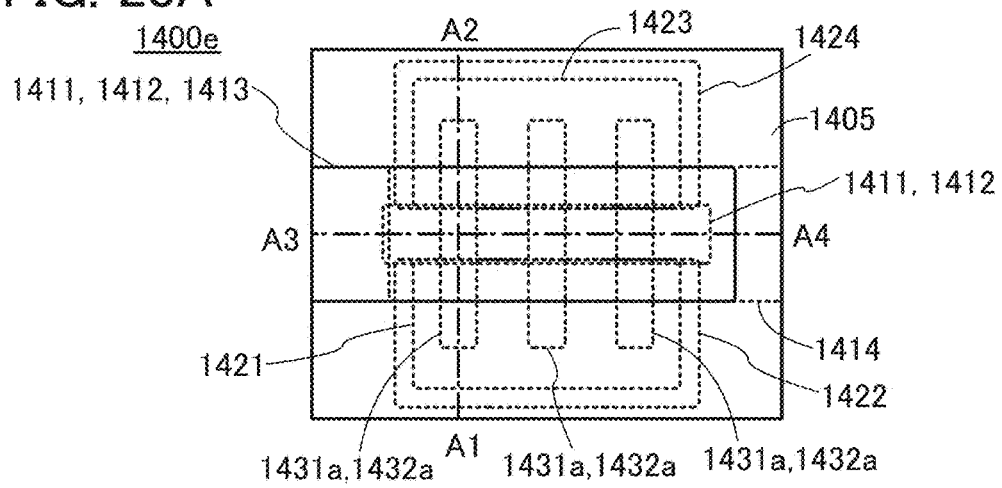
FIGS. 28A to 28C illustrate examples of a top view and cross-sectional views.
Figure 28B:
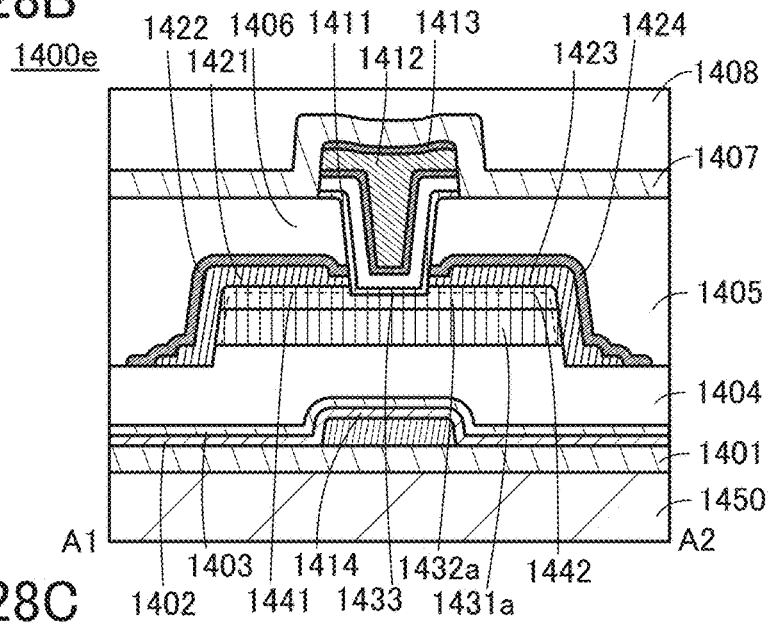
Figure 28C:
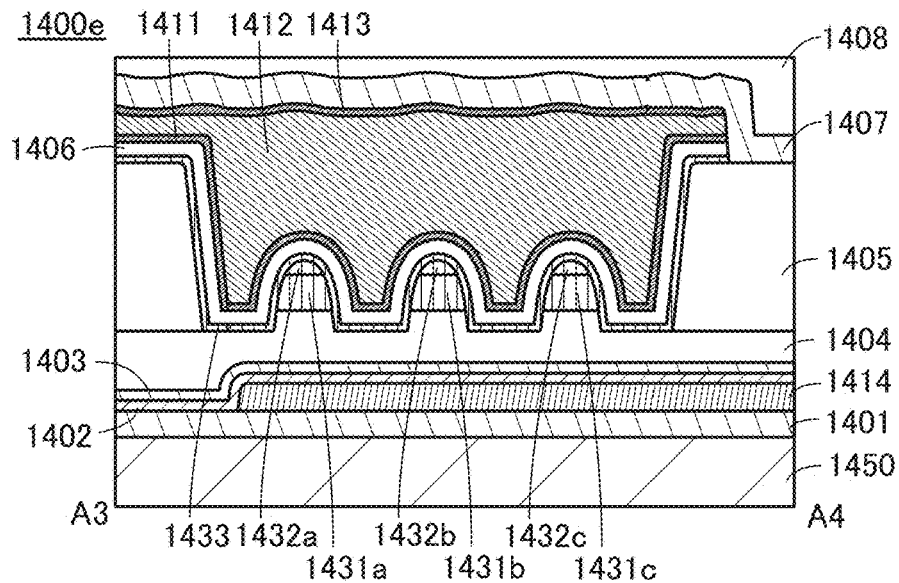

FIGS. 28A to 28C are a top view and cross-sectional views of a transistor 1400e. FIG. 28A is a top view. FIG. 28B is a cross-sectional view taken along dashed-dotted line A1-A2 in FIG. 28A and FIG. 28C is a cross-sectional view taken along dashed-dotted line A3-A4 in FIG. 28A. Note that for simplification of the drawing, some components are not illustrated in the top view in FIG. 28A. Note that the dashed-dotted line A1-A2 and the dashed-dotted line A3-A4 are sometimes referred to as a channel length direction of the transistor 1400e and a channel width direction of the transistor 1400e, respectively.

The transistor 1400e includes a first fin consisting of metal oxides 1431a and 1432a, a second fin consisting of metal oxides 1431b and 1432b, and a third fin consisting of metal oxides 1431c and 1432c.

In the transistor 1400e, the metal oxides 1432a to 1432c where a channel is formed are surrounded by the gate electrode. Hence, a gate electric field can be applied to the entire channel, so that the transistor can have a high on-state current.

<Structure Example 5 of Transistor>

FIGS. 29A to 29D are a top view and cross-sectional views of a transistor 1400f. FIG. 29A is a top view of the transistor 1400f. FIG. 29B is a cross-sectional view taken along dashed-dotted line A1-A2 in FIG. 29A and FIG. 29C is a cross-sectional view taken along dashed-dotted line A3-A4 in FIG. 29A. Note that the dashed-dotted line A1-A2 and the dashed-dotted line A3-A4 are sometimes referred to as a channel length direction and a channel width direction, respectively. The transistor 1400f has the s-channel structure like the transistor 1400a and the like. In the transistor 1400f, an insulating film 1409 is provided in contact with the side surface of the conductive film 1412 used as a gate electrode. The insulating film 1409 and the conductive film 1412 are covered with the insulating film 1407 and the insulating film 1408. The insulating film 1409 serves as a sidewall insulating film of the transistor 1400f. As in the transistor 1400a, the gate electrode may be a stack of the conductive films 1411 to 1413.

The insulating film 1406 and the conductive film 1412 overlap with the conductive film 1414 and the metal oxide 1432 at least partly. The side edge of the conductive film 1412 in the channel length direction is preferably approximately aligned with the side edge of the insulating film 1406 in the channel length direction. Here, the insulating film 1406 serves as a gate insulating film of the transistor 1400f, and the conductive film 1412 serves as a gate electrode of the transistor 1400f.

The metal oxide 1432 has a region that overlaps with the conductive film 1412 with the metal oxide 1433 and the insulating film 1406 positioned therebetween. Preferably, the outer edge of the metal oxide 1431 is approximately aligned with the outer edge of the metal oxide 1432, and the outer edge of the metal oxide 1433 is outside of the outer edges of the metal oxides 1431 and 1432. However, the shape of the transistor in this embodiment is not limited to the shape where the outer edge of the metal oxide 1433 is outside of the outer edge of the metal oxide 1431. For example, the outer edge of the metal oxide 1431 may be outside of the outer edge of the metal oxide 1433, or the side edge of the metal oxide 1431 may be approximately aligned with the side edge of the metal oxide 1433.

FIG. 29D is an enlarged view of part of FIG. 29B. As shown in FIG. 29D, regions 1461a to 1461e are formed in the metal oxide 1430. The regions 1461b to 1461e have a higher concentration of dopant and therefore have a lower resistance than the region 1461a. Furthermore, the regions 1461b and 1461c have a higher concentration of hydrogen and therefore have an even lower resistance than the regions 1461d and 1461e. The concentration of a dopant in the region 1461a is, for example, less than or equal to 5%, less than or equal to 2%, or less than or equal to 1% of the maximum concentration of a dopant in the region 1461b or 1461c. Note that the dopant may be rephrased as a donor, an acceptor, an impurity, or an element.

As shown in FIG. 29D, in the metal oxide 1430, the region 1461a substantially overlaps with the conductive film 1412, and the regions 1461b to 1461e are the regions other than the region 1461a. In the regions 1461b and 1461c, the top surface of the metal oxide 1433 is in contact with the insulating film 1407. In the regions 1461d and 1461e, the top surface of the metal oxide 1433 is in contact with the insulating film 1409 or 1406. That is, as shown in FIG. 29D, the boundary between the regions 1461b and 1461d overlaps with the boundary between the side edges of the insulating films 1407 and 1409. The same applies to the boundary between the regions 1461c and 1461e. Here, part of the regions 1461d and 1461e preferably overlaps with part of a region (a channel formation region) of the metal oxide 1432 that overlaps with the conductive film 1412. For example, preferably, the side edges of the regions 1461d and 1461e in the channel length direction are inside of the conductive film 1412 and the distance between the side edge of the conductive film 1412 and each of the side edges of the regions 1461d and 1461e is d. In that case, the thickness $t_{406}$ of the insulating film 1406 and the distance d preferably satisfy $0.25t_{406} < d < t_{406}$.

In the above manner, the regions 1461d and 1461e are formed in part of the region where the metal oxide 1430 and the conductive film 1412 overlap with each other. Accordingly, the channel formation region of the transistor 1400f is in contact with the low-resistance regions 1461d and 1461e and a high-resistance offset region is not formed between the region 1461a and each of the regions 1461d and 1461e, so that the on-state current of the transistor 1400f can be increased. Furthermore, since the side edges of the regions 1461d and 1461e in the channel length direction are formed so as to satisfy the above range, the regions 1461d and 1461e can be prevented from being formed too deeply in the channel formation region and always conducted.

The regions 1461b to 1461e are formed by ion doping treatment such as an ion implantation method. Therefore, as illustrated in FIG. 29D, the positions of the side edges of the regions 1461d and 1461e in the channel length direction are sometimes shifted to the side edge of the metal oxide 1430 in the channel length direction in a deeper area from the top surface of the metal oxide 1433. The distance din that case is the distance between the side edge of the conductive film 1412 in the channel length direction and each of the side edges of the regions 1461d and 1461e that are closest to the inner part of the conductive film 1412.

In some cases, for example, the regions 1461d and 1461e in the metal oxide 1431 do not overlap with the conductive film 1412. In that case, at least part of the regions 1461d and 1461e in the metal oxide 1431 or 1432 is preferably formed in a region overlapping with the conductive film 1412.

In addition, low-resistance regions 1451 and 1452 are preferably formed in the metal oxide 1431, the metal oxide 1432, and the metal oxide 1433 in the vicinity of the interface with the insulating film 1407. The low-resistance regions 1451 and 1452 contain at least one of elements included in the insulating film 1407. Preferably, part of the low-resistance regions 1451 and 1452 is substantially in contact with or overlaps partly with the region (the channel formation region) of the metal oxide 1432 that overlaps with the conductive film 1412.

Since a large part of the metal oxide 1433 is in contact with the insulating film 1407, the low-resistance regions 1451 and 1452 are likely to be formed in the metal oxide 1433. The low-resistance regions 1451 and 1452 in the metal oxide 1433 contain a higher concentration of elements included in the insulating film 1407 than the other regions of the metal oxide 1433 (e.g., the region of the metal oxide 1433 that overlaps with the conductive film 1412).

The low-resistance regions 1451 and 1452 are formed in the regions 1461b and 1461c, respectively. Ideally, the metal oxide 1430 has a structure in which the concentration of added elements is the highest in the low-resistance regions 1451 and 1452, the second highest in the regions 1461b to 1461e other than the low-resistance regions 1451 and 1452, and the lowest in the region 1461a. The added elements refer to a dopant for forming the regions 1461b and 1461c and an element added from the insulating film 1407 to the low-resistance regions 1451 and 1452.

Although the low-resistance regions 1451 and 1452 are formed in the transistor 1400f, the semiconductor device shown in this embodiment is not limited to this structure. For example, the low-resistance regions 1451 and 1452 are not necessarily formed in the case where the regions 1461b and 1461c have a sufficiently low resistance.

<Structure Example 6 of Transistor>

Figure 30A:
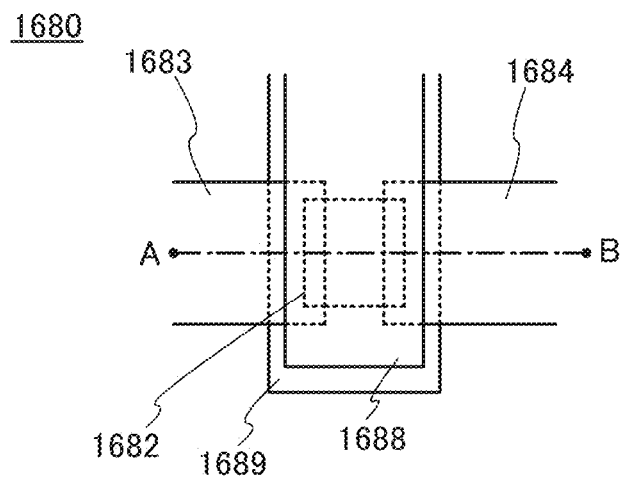
FIGS. 30A and 30B illustrate examples of a top view and a cross-sectional view.
Figure 30B:
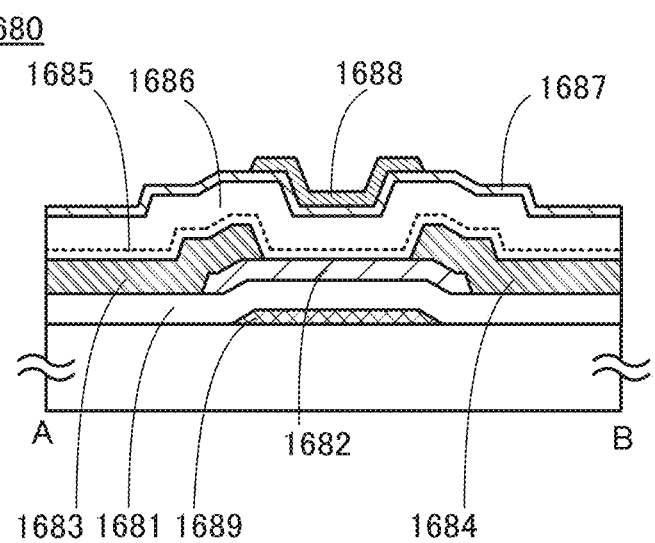

FIGS. 30A and 30B are a top view and a cross-sectional view of a transistor 1680. FIG. 30A is a top view, and FIG. 30B is a cross-sectional view taken along dashed-dotted line A-B in FIG. 30A. Note that for simplification of the drawing, some components are increased or reduced in size, or omitted in FIGS. 30A and 30B. The dashed-dotted line A-B direction may be referred to as a channel length direction.

The transistor 1680 shown in FIG. 30B includes a conductive film 1689 serving as a first gate, a conductive film 1688 serving as a second gate, a semiconductor 1682, a conductive film 1683 and a conductive film 1684 serving as a source and a drain, an insulating film 1681, an insulating film 1685, an insulating film 1686, and an insulating film 1687.

The conductive film 1689 is on an insulating surface. The conductive film 1689 overlaps with the semiconductor 1682 with the insulating film 1681 provided therebetween. The conductive film 1688 overlaps with the semiconductor 1682 with the insulating films 1685, 1686, and 1687 provided therebetween. The conductive films 1683 and 1684 are connected to the semiconductor 1682.

The description of the conductive films 1411 to 1414 in FIGS. 22A to 22C can be referred to for the details of the conductive films 1689 and 1688.

The conductive films 1689 and 1688 may be supplied with different potentials, or may be supplied with the same potential at the same time. Owing to the conductive film 1688 serving as the second gate electrode in the transistor 1680, the threshold voltage can be stable. Note that the conductive film 1688 is not necessarily provided.

The description of the metal oxide 1432 in FIGS. 22A to 22C can be referred to for the details of the semiconductor 1682. The semiconductor 1682 may be a single layer or a stack including a plurality of semiconductor layers.

The description of the conductive films 1421 to 1424 in FIGS. 22A to 22C can be referred to for the details of the conductive films 1683 and 1684.

The description of the insulating film 1406 in FIGS. 22A to 22C can be referred to for the details of the insulating film 1681.

The insulating films 1685 to 1687 are sequentially stacked over the semiconductor 1682 and the conductive films 1683 and 1684 in FIG. 30B; however, an insulating film provided over the semiconductor 1682 and the conductive films 1683 and 1684 may be a single layer or a stack including a plurality of insulating films.

In the case of using an oxide semiconductor as the semiconductor 1682, the insulating film 1686 preferably contains oxygen at a proportion higher than or equal to that in the stoichiometric composition and has a function of supplying part of oxygen to the semiconductor 1682 by heating. Note that in the case where the semiconductor 1682 is damaged at the time of formation of the insulating film 1686 when the insulating film 1686 is directly formed on the semiconductor 1682, the insulating film 1685 is preferably provided between the semiconductor 1682 and the insulating film 1686, as shown in FIG. 30B. The insulating film 1685 preferably allows oxygen to pass therethrough, and causes little damage to the semiconductor 1682 when the insulating film 1685 is formed compared with the case of the insulating film 1686. If the insulating film 1686 can be formed directly on the semiconductor 1682 while damage to the semiconductor 1682 is reduced, the insulating film 1685 is not necessarily provided.

For the insulating films 1685 and 1686, a material containing silicon oxide or silicon oxynitride is preferably used, for example. Alternatively, a metal oxide such as aluminum oxide, aluminum oxynitride, gallium oxide, gallium oxynitride, yttrium oxide, yttrium oxynitride, hafnium oxide, or hafnium oxynitride can be used.

The insulating film 1687 preferably has an effect of blocking diffusion of oxygen, hydrogen, and water. Alternatively, the insulating film 1687 preferably has an effect of blocking diffusion of hydrogen and water.

As an insulating film has higher density and becomes denser or has a fewer dangling bonds and becomes more chemically stable, the insulating film has a higher blocking effect. An insulating film that has an effect of blocking diffusion of oxygen, hydrogen, and water can be formed using, for example, aluminum oxide, aluminum oxynitride, gallium oxide, gallium oxynitride, yttrium oxide, yttrium oxynitride, hafnium oxide, or hafnium oxynitride. An insulating film that has an effect of blocking diffusion of hydrogen and water can be formed using, for example, silicon nitride or silicon nitride oxide.

In the case where the insulating film 1687 has an effect of blocking diffusion of water, hydrogen, and the like, impurities such as water and hydrogen that exist in a resin in a panel or exist outside the panel can be prevented from entering the semiconductor 1682. In the case where an oxide semiconductor is used as the semiconductor 1682, part of water or hydrogen that enters the oxide semiconductor serves as an electron donor (donor). Thus, the use of the insulating film 1687 having the blocking effect can prevent a shift in the threshold voltage of the transistor 1680 due to generation of donors.

In addition, in the case where an oxide semiconductor is used as the semiconductor 1682, the insulating film 1687 has an effect of blocking diffusion of oxygen, so that diffusion of oxygen from the oxide semiconductor to the outside can be prevented. Accordingly, oxygen vacancies in the oxide semiconductor that serve as donors are reduced, so that a shift in the threshold voltage of the transistor 1680 due to generation of donors can be prevented.

This embodiment can be combined with any of the other embodiments in this specification as appropriate.

(Embodiment 5)

Described in this embodiment is a structure of an oxide semiconductor film capable of being used for the OS transistors described in the above embodiments.

<Structure of Oxide Semiconductor>

An oxide semiconductor is classified into a single crystal oxide semiconductor and a non-single-crystal oxide semiconductor. Examples of a non-single-crystal oxide semiconductor include a c-axis-aligned and a-b-plane anchored crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS is close to an amorphous oxide semiconductor in terms of physical properties.

<CAAC-OS>

First, a CAAC-OS is described.

A CAAC-OS is one of oxide semiconductors having a plurality of c-axis aligned crystal parts (also referred to as pellets).

Figure 31A:
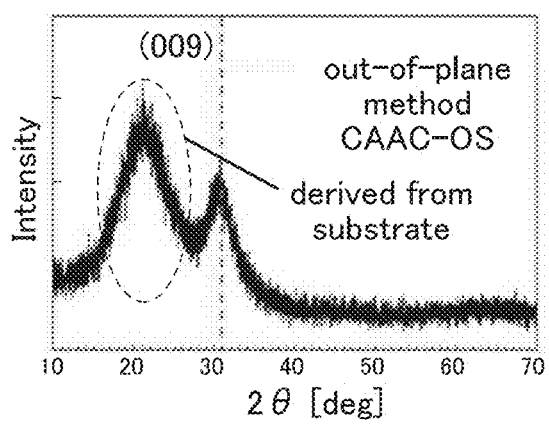
FIGS. 31A to 31E show structural analysis of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 31A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at 2θ of around 36° is attributed to a crystal structure classified into the space group Fd-3m; thus, this peak is preferably not exhibited in the CAAC-OS.

Figure 31B:
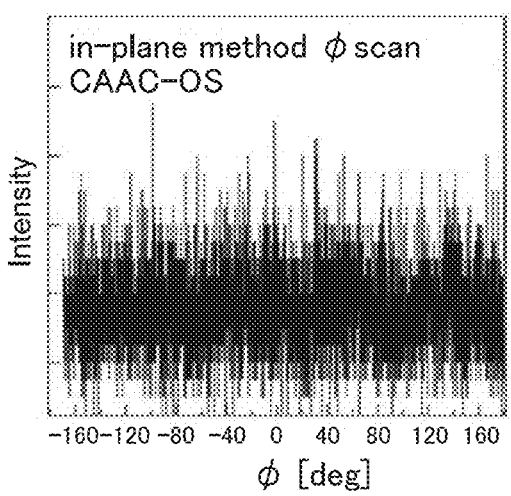
Figure 31C:
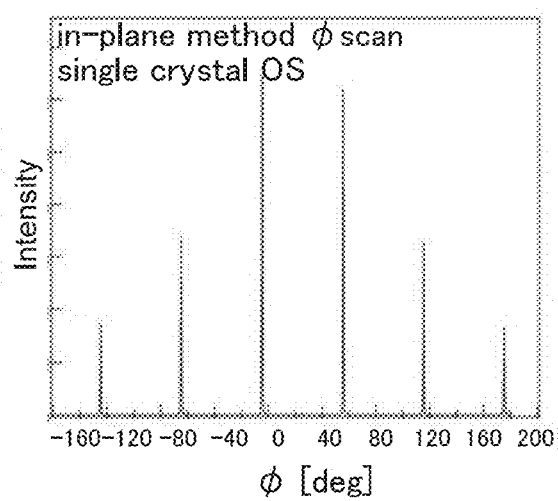

On the other hand, in structural analysis of the CAAC-OS by an in-plane method in which an X-ray is incident on the CAAC-OS in a direction parallel to the formation surface, a peak appears at a 2θ of around 56°. This peak is derived from the (110) plane of the $InGaZnO_4$ crystal. When analysis (φ scan) is performed with 2θ fixed at around 56° and with the sample rotated using a normal vector to the sample surface as an axis (φ axis), as shown in FIG. 31B, a peak is not clearly observed. In contrast, in the case where single crystal $InGaZnO_4$ is subjected to φ scan with 2θ fixed at around 56°, as shown in FIG. 31C, six peaks which are derived from crystal planes equivalent to the (110) plane are observed. Accordingly, the structural analysis using XRD shows that the directions of a-axes and b-axes are irregularly oriented in the CAAC-OS.

Figure 31D:
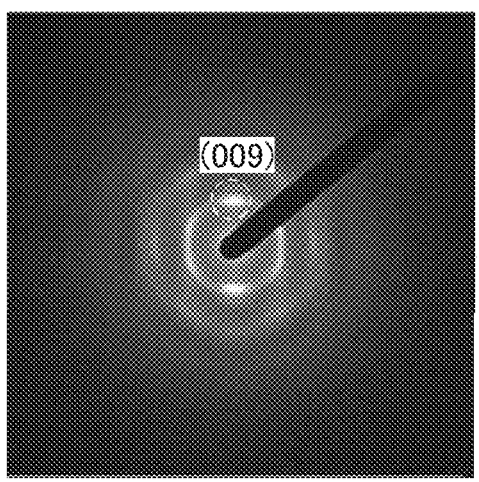
Figure 31E:
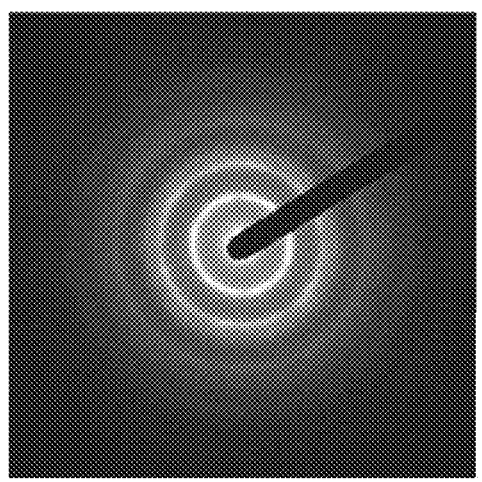

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 31D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 31E shows a diffraction pattern obtained in such a manner that an electron beam with a probe diameter of 300 nm is incident on the same sample in a direction perpendicular to the sample surface. As shown in FIG. 31E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 31E is considered to be derived from the (010) plane, the (100) plane, and the like of the $InGaZnO_4$ crystal. The second ring in FIG. 31E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 32A:
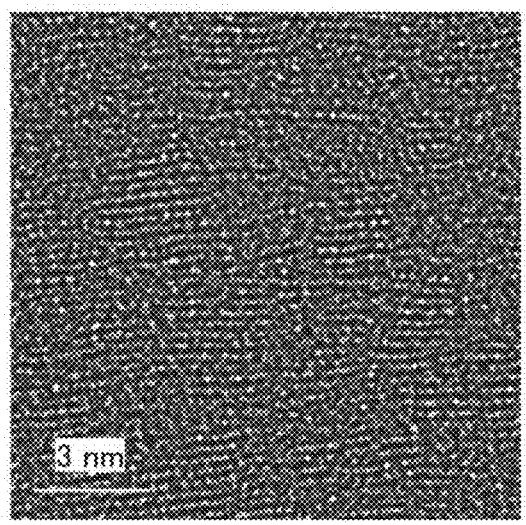
FIGS. 32A to 32E show a cross-sectional TEM image and plan-view TEM images of a CAAC-OS and images obtained through analysis thereof.

FIG. 32A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 32A shows pellets in which metal atoms are arranged in a layered manner. FIG. 32A shows that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 32B:
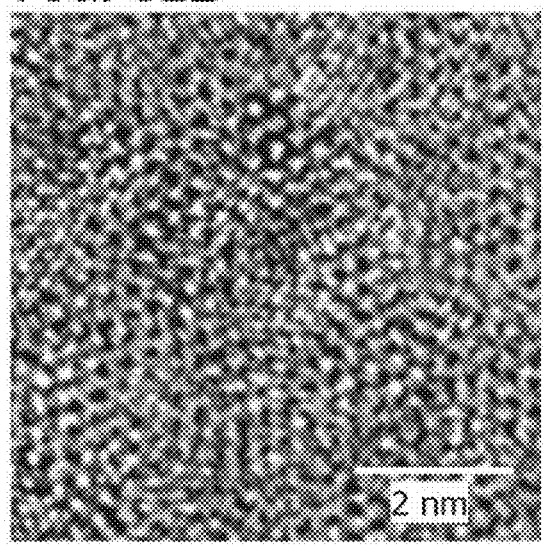
Figure 32C:
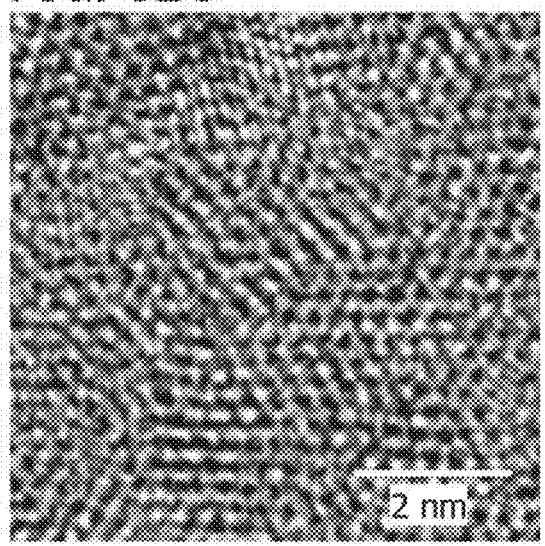
Figure 32D:
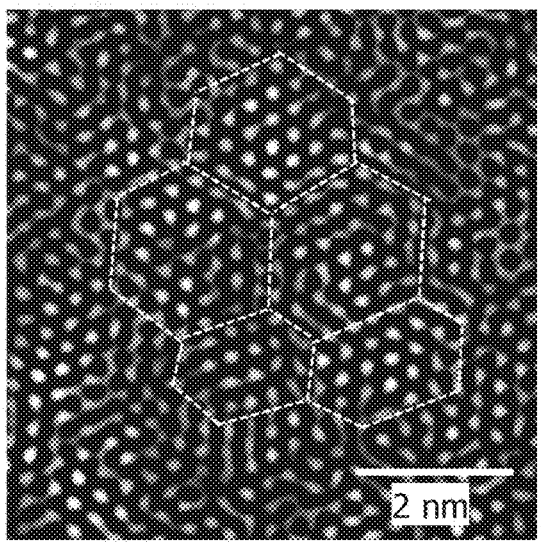
Figure 32E:
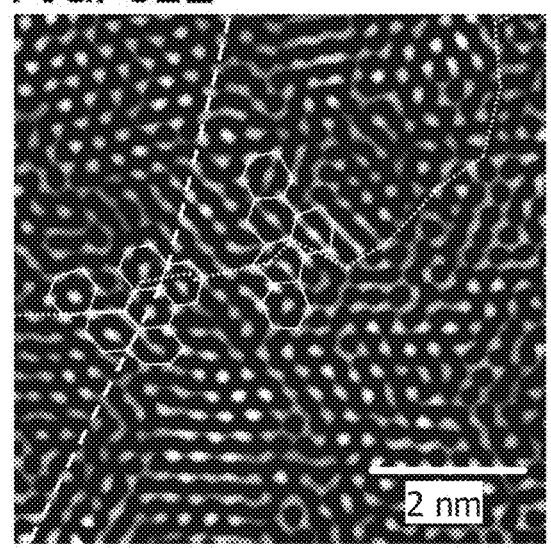

FIGS. 32B and 32C show Cs-corrected high-resolution TEM images of a plane of the CAAC-OS observed from a direction substantially perpendicular to the sample surface. FIGS. 32D and 32E are images obtained through image processing of FIGS. 32B and 32C. The method of image processing is as follows. The image in FIG. 32B is subjected to fast Fourier transform (FFT), so that an FFT image is obtained. Then, mask processing is performed such that a range of from 2.8 nm$^{-1}$ to 5.0 nm$^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 32D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 32E, a dotted line denotes a portion between a region where a lattice arrangement is well aligned and another region where a lattice arrangement is well aligned, and a dashed line denotes the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8\times10^{11}$/cm$^3$, preferably lower than $1\times10^{11}$/cm$^3$, and further preferably lower than $1\times10^{10}$/cm$^3$ and higher than or equal to $1\times10^{-9}$/cm$^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 33A:
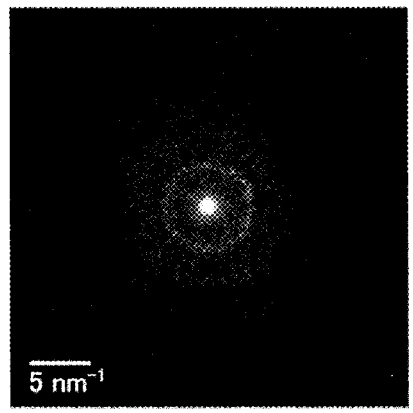
FIGS. 33A to 33D show electron diffraction patterns and a cross-sectional TEM image of an nc-OS.
Figure 33B:
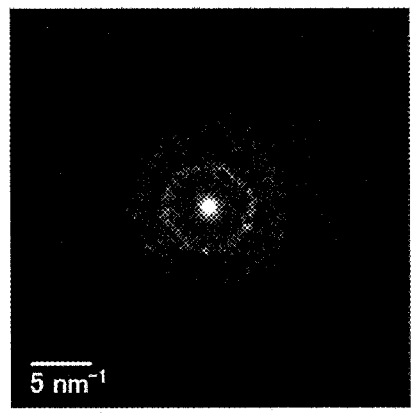

For example, when an electron beam with a probe diameter of 50 nm is incident on a 34-nm-thick region of thinned nc-OS including an InGaZnO$_4$ crystal in a direction parallel to the formation surface, a ring-shaped diffraction pattern (a nanobeam electron diffraction pattern) shown in FIG. 33A is observed. FIG. 33B shows a diffraction pattern obtained when an electron beam with a probe diameter of 1 nm is incident on the same sample. As shown in FIG. 33B, a plurality of spots are observed in a ring-like region. In other words, ordering in an nc-OS is not observed with an electron beam with a probe diameter of 50 nm but is observed with an electron beam with a probe diameter of 1 nm.

Figure 33C:
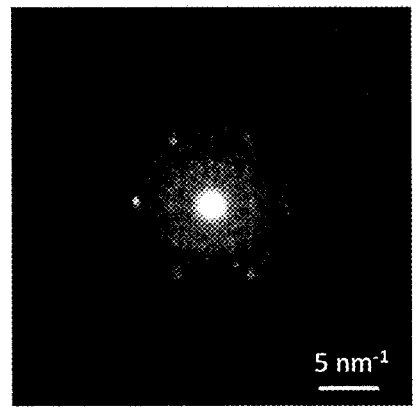

Furthermore, an electron diffraction pattern in which spots are arranged in an approximately regular hexagonal shape is observed in some cases as shown in FIG. 33C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 33D:
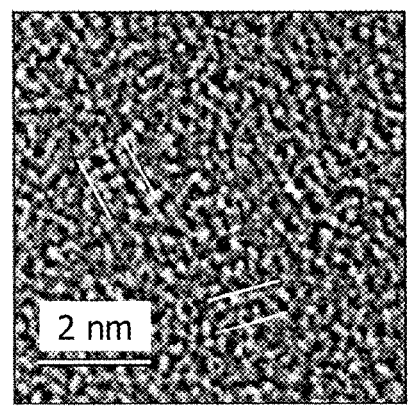

FIG. 33D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 33D, and a region in which a crystal part is not clearly observed. In most cases, the size of a crystal part included in the nc-OS is greater than or equal to 1 nm and less than or equal to 10 nm, or specifically, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. For example, in a high-resolution TEM image of the nc-OS film, a grain boundary is not always found clearly. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure between those of the nc-OS and the amorphous oxide semiconductor.

Figure 34A:
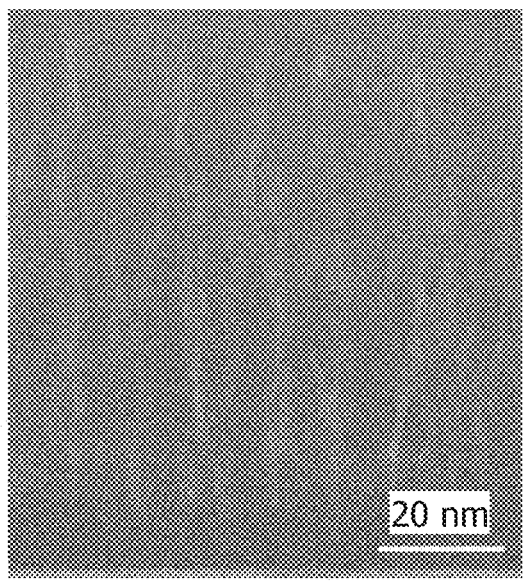
FIGS. 34A and 34B show cross-sectional TEM images of an a-like OS.
Figure 34B:
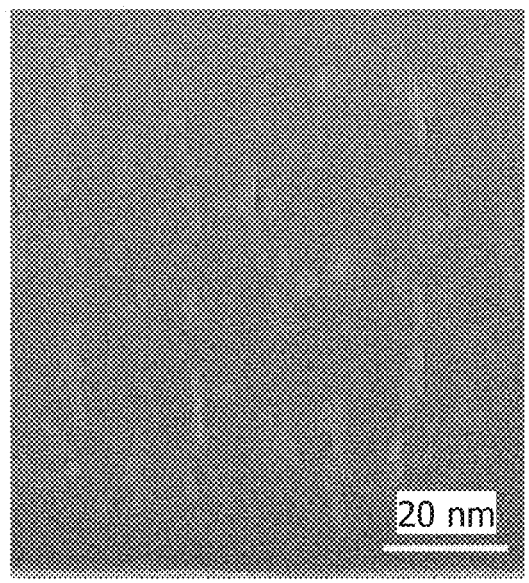

FIGS. 34A and 34B are high-resolution cross-sectional TEM images of an a-like OS. FIG. 34A is the high-resolution cross-sectional TEM image of the a-like OS at the start of the electron irradiation. FIG. 34B is the high-resolution cross-sectional TEM image of a-like OS after the electron ($e^-$) irradiation at $4.3 \times 10^8$ $e^-/nm^2$. FIGS. 34A and 34B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it includes a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 35:
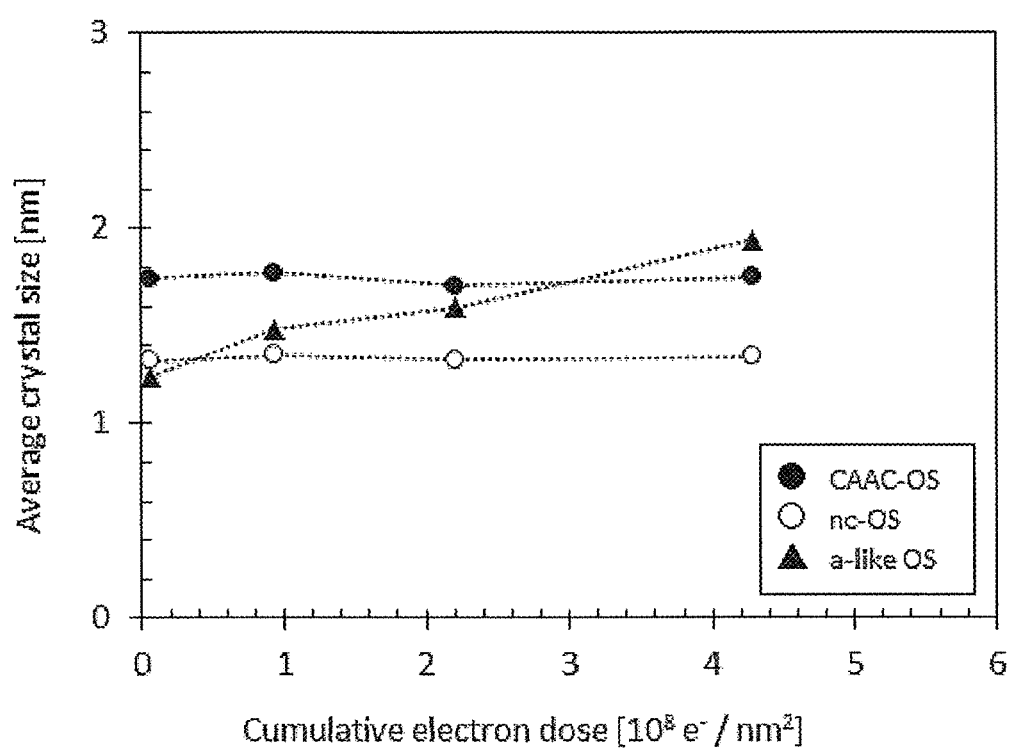
FIG. 35 shows a change in crystal part of an In—Ga—Zn oxide induced by electron irradiation.

FIG. 35 shows change in the average size of crystal parts (at 22 points to 30 points) in each sample. Note that the crystal part size corresponds to the length of a lattice fringe. FIG. 35 indicates that the crystal part size in the a-like OS increases with an increase in the cumulative electron dose in obtaining TEM images, for example. As shown in FIG. 35, a crystal part of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. As shown in FIG. 35, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of electron beam irradiations were as follows: the accelerating voltage was 300 kV; the current density was $6.7 \times 10^5 e^-/(nm^2 \cdot s)$; and the diameter of irradiation region was 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it includes a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

(Supplementary Notes on the Description in this Specification and the Like)

The following are notes on the description of the structures in the above embodiments.

<Notes on One Embodiment of the Present Invention Described in Embodiments>

One embodiment of the present invention can be constituted by appropriately combining the structure described in an embodiment with any of the structures described in the other embodiments. In addition, in the case where a plurality of structural examples is given in one embodiment, any of the structure examples can be combined as appropriate.

Note that what is described (or part thereof) in an embodiment can be applied to, combined with, or replaced with another content in the same embodiment and/or what is described (or part thereof) in another embodiment or other embodiments.

Note that in each embodiment, a content described in the embodiment is a content described with reference to a variety of diagrams or a content described with a text described in this specification.

Note that by combining a diagram (or may be part of the diagram) illustrated in one embodiment with another part of the diagram, a different diagram (or may be part of the different diagram) illustrated in the embodiment, and/or a diagram (or may be part of the diagram) illustrated in one or a plurality of different embodiments, much more diagrams can be formed.

<Notes on the Description for Drawings>

In this specification and the like, terms for explaining arrangement, such as over and under, are used for convenience to describe the positional relation between components with reference to drawings. Furthermore, the positional relation between components is changed as appropriate in accordance with a direction in which the components are described. Therefore, the terms for explaining arrangement are not limited to those used in this specification and may be changed to other terms as appropriate depending on the situation.

The term "over" or "under" does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Furthermore, in a block diagram in this specification and the like, components are functionally classified and shown by blocks that are independent from each other. However, in an actual circuit and the like, such components are sometimes hard to classify functionally, and there is a case in which one circuit is concerned with a plurality of functions or a case in which a plurality of circuits are concerned with one function. Therefore, the segmentation of a block in the block diagrams is not limited by any of the components described in the specification, and can be differently determined as appropriate depending on situations.

In drawings, the size, the layer thickness, or the region is determined arbitrarily for description convenience. Therefore, embodiments of the present invention are not limited to such a scale. Note that the drawings are schematically shown for clarity, and embodiments of the present invention are not limited to shapes or values shown in the drawings. For example, the following can be included: variation in signal, voltage, or current due to noise or difference in timing.

<Notes on Expressions that can be Rephrased>

In this specification or the like, the terms "one of a source and a drain" (or a first electrode or a first terminal) and "the other of the source and the drain" (or a second electrode or a second terminal) are used to describe the connection relation of a transistor. This is because a source and a drain of a transistor are interchangeable depending on the structure, operation conditions, or the like of the transistor. Note that the source or the drain of the transistor can also be referred to as a source (or drain) terminal, a source (or drain) electrode, or the like as appropriate depending on the situation.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

In this specification and the like, "voltage" and "potential" can be replaced with each other. The term "voltage" refers to a potential difference from a reference potential. When the reference potential is a ground potential, for example, "voltage" can be replaced with "potential." The ground potential does not necessarily mean 0 V. Potentials are relative values, and the potential applied to a wiring or the like is changed depending on the reference potential, in some cases.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

<Notes on Definitions of Terms>

The following are definitions of the terms that are not mentioned in the above embodiments.

«Switch»

In this specification and the like, a switch is in a conductive state (on state) or in a non-conductive state (off state) to determine whether current flows therethrough or not. Alternatively, a switch has a function of selecting and changing a current path.

For example, an electrical switch, a mechanical switch, or the like can be used as a switch. That is, any element can be used as a switch as long as it can control current, without limitation to a certain element.

Examples of the electrical switch are a transistor (e.g., a bipolar transistor or a MOS transistor), a diode (e.g., a PN diode, a PIN diode, a Schottky diode, a metal-insulator-metal (MIM) diode, a metal-insulator-semiconductor (MIS) diode, or a diode-connected transistor), and a logic circuit in which such elements are combined.

In the case of using a transistor as a switch, an "on state" of the transistor refers to a state in which a source electrode and a drain electrode of the transistor are electrically short-circuited. Furthermore, an "off state" of the transistor refers to a state in which the source electrode and the drain electrode of the transistor are electrically disconnected. In the case where a transistor operates just as a switch, the polarity (conductivity type) of the transistor is not particularly limited to a certain type.

An example of a mechanical switch is a switch formed using a technology of micro electro mechanical systems (MEMS), such as a digital micromirror device (DMD). Such a switch includes an electrode which can be moved mechanically, and operates by controlling conduction and non-conduction in accordance with movement of the electrode.

«Channel Length»

In this specification and the like, the channel length refers to, for example, a distance between a source and a drain in a region where a semiconductor (or a portion where a current flows in a semiconductor when a transistor is on) and a gate overlap with each other or a region where a channel is formed in a plan view of the transistor.

In one transistor, channel lengths in all regions are not necessarily the same. In other words, the channel length of one transistor is not limited to one value in some cases. Therefore, in this specification, the channel length is any one of values, the maximum value, the minimum value, or the average value, in a region where a channel is formed.

«Channel Width»

In this specification and the like, the channel width refers to, for example, the length of a portion where a source and a drain face each other in a region where a semiconductor (or a portion where current flows in a semiconductor when a transistor is on) and a gate electrode overlap with each other, or a region where a channel is formed in a plan view of the transistor.

In one transistor, channel widths in all regions do not necessarily have the same value. In other words, a channel width of one transistor is not fixed to one value in some cases. Therefore, in this specification, the channel width is any one of values, the maximum value, the minimum value, or the average value, in a region where a channel is formed.

Note that depending on transistor structures, a channel width in a region where a channel is formed actually (hereinafter referred to as an effective channel width) is different from a channel width shown in a top view of a transistor (hereinafter referred to as an apparent channel width) in some cases. For example, in a transistor having a three-dimensional structure, an effective channel width is greater than an apparent channel width shown in a top view of the transistor, and its influence cannot be ignored in some cases. For example, in a miniaturized transistor having a three-dimensional structure, the proportion of a channel region formed in a side surface of a semiconductor is high in some cases. In that case, an effective channel width obtained when a channel is actually formed is greater than an apparent channel width shown in the top view.

In a transistor having a three-dimensional structure, an effective channel width is difficult to measure in some cases. For example, to estimate an effective channel width from a design value, it is necessary to assume that a semiconductor has a known shape. Therefore, in the case where the shape of a semiconductor is unclear, it is difficult to measure an effective channel width accurately.

Therefore, in this specification, in a top view of a transistor, an apparent channel width that is a length of a portion where a source and a drain face each other in a region where a semiconductor and a gate electrode overlap with each other is referred to as a surrounded channel width (SCW) in some cases. Furthermore, in this specification, in the case where the term "channel width" is simply used, it may represent a surrounded channel width or an apparent channel width. Alternatively, in this specification, in the case where the term "channel width" is simply used, it may represent an effective channel width in some cases. Note that the values of a channel length, a channel width, an effective channel width, an apparent channel width, a surrounded channel width, and the like can be determined by obtaining and analyzing a cross-sectional TEM image and the like.

Note that in the case where electric field mobility, a current value per channel width, and the like of a transistor are obtained by calculation, a surrounded channel width may be used for the calculation. In that case, a value different from one in the case where an effective channel width is used for the calculation is obtained in some cases.

«Connection»

In this specification and the like, when it is described that "A and B are connected to each other", the case where A and B are electrically connected to each other is included in addition to the case where A and B are directly connected to each other. Here, the expression "A and B are electrically connected" means the case where electric signals can be transmitted and received between A and B when an object having any electric action exists between A and B.

EXPLANATION OF REFERENCE

A1-A2: dashed-dotted line, A3-A4: dashed-dotted line, AM1: analog memory, AM2: analog memory, DV1: differentiating circuit, DV2: differentiating circuit, MUL1: multiplier circuit, MUL2: multiplier circuit, MUL3: multiplier circuit, MUL4: multiplier circuit, MUL5: multiplier circuit, MUL6: multiplier circuit, MUL7: multiplier circuit, Tr01-Tr15: transistor, 10: image data, 11: triangle, 12: circle, 20: image data, 30: image data, 31: region, 40: image data, 41: region, 101: amplifier, 102: unity gain buffer, 103: amplifier circuit, 104: buffer, 121: resistance, 122: amplifier, 123: unity gain buffer, 125: buffer, 126: operational amplifier, 141: resistance, 142: amplifier, 143: amplifier, 144: unity gain buffer, 145: amplifier circuit, 146: buffer, 147: operational amplifier, 151: resistance, 152: amplifier, 155: unity gain buffer, 156: amplifier circuit, 161: resistance, 162: amplifier, 163: resistance, 164: amplifier, 165: unity gain buffer, 166: unity gain buffer, 167: amplifier circuit, 168: amplifier circuit, 169: buffer, 170: buffer, 171: operational amplifier, 172: operational amplifier, 173: multiplier circuit, 500: broadcast system, 510: camera, 511: transmitter, 512: receiver, 513: display device, 520: image sensor, 521: image processor, 522: encoder, 523: modulator, 525: demodulator, 526: decoder, 527: image processor, 528: display portion, 540: Raw data, 541: image data, 542: encoded data, 543: broadcast signal, 544: image data, 545: data signal, 551: data stream, 552: data stream, 553: data stream, 560: TV, 561: broadcast station, 562: artificial satellite, 563: radio wave tower, 564: antenna, 565: antenna, 566A: radio wave, 566B: radio wave, 567A: radio wave, 567B: radio wave, 571: receiver, 572: wireless device, 573: wireless device, 574: receiver, 575: connector portion, 591: circuit, 591$a$: inter-frame prediction circuit, 591$b$: compensation prediction circuit, 591$c$: DCT circuit, 592: circuit, 593: circuit, 593$a$: LDPC encoding circuit, 593$b$: authentication processing circuit, 593$c$: scrambler, 594: circuit, 600: ambulance, 601: medical institution, 602: medical institution, 605: high-speed network, 610: camera, 611: encoder, 612: communication device, 615: image data, 616: image data, 620: communication device, 621: decoder, 623: display device, 1400$a$: transistor, 1400$b$: transistor, 1400$c$: transistor, 1400$d$: transistor, 1400$e$: transistor, 1400$f$: transistor, 1401: insulating film, 1402: insulating film, 1403: insulating film, 1404: insulating film, 1405: insulating film, 1406: insulating film, 1407: insulating film, 1408: insulating film, 1409: insulating film, 1411: conductive film, 1412: conductive film, 1413: conductive film, 1414: conductive film, 1415: opening, 1421: conductive film, 1422: conductive film, 1423: conductive film, 1424: conductive film, 1430: metal oxide, 1431: metal oxide, 1431$a$: metal oxide, 1431$b$: metal oxide, 1431$c$: metal oxide, 1432: metal oxide, 1432$a$: metal oxide, 1432$b$: metal oxide, 1432$c$: metal oxide, 1433: metal oxide, 1441: region, 1442: region, 1450: substrate, 1451: low-resistance region, 1452: low-resistance region, 1461: region, 1461$a$: region, 1461$b$: region, 1461$c$: region, 1461$d$: region, 1461$e$: region, 1462: region, 1463: region, 1680: transistor, 1681: insulating film, 1682: semiconductor, 1683: conductive film, 1684: conductive film, 1685: insulating film, 1686: insulating film, 1687: insulating film, 1688: conductive film, 1689: conductive film, This application is based on Japanese Patent Application serial no. 2015-208504 filed with Japan Patent Office on Oct. 23, 2015 and Japanese Patent Application serial no. 2015-228379 filed with Japan Patent Office on Nov. 24, 2015, the entire contents of which are hereby incorporated by reference.

The invention claimed is:
1. A semiconductor device comprising:
an encoder comprising:
an input neuron circuit;
a hidden synapse circuit;
a hidden error circuit;
a hidden neuron circuit;

an output synapse circuit;
an output error circuit; and
an output neuron circuit,
wherein each of the hidden synapse circuit and the output synapse circuit comprises an analog memory including a transistor and a capacitor,
wherein the transistor comprises a first gate electrode, a second gate electrode and a metal oxide,
wherein the metal oxide is over the first gate electrode,
wherein an insulating film is over the metal oxide,
wherein an opening of the insulating film overlaps the metal oxide,
wherein the second gate electrode is in the opening of the insulating film,
wherein the second gate electrode faces a side surface of the metal oxide when seen in a channel width direction of the transistor,
wherein the input neuron circuit is electrically connected to the hidden synapse circuit,
wherein the hidden synapse circuit is electrically connected to the hidden error circuit,
wherein the hidden error circuit is electrically connected to the hidden neuron circuit,
wherein the hidden neuron circuit is electrically connected to the output synapse circuit, and
wherein the output synapse circuit is electrically connected to the hidden error circuit, the output error circuit and the output neuron circuit.

2. The semiconductor device according to claim 1, wherein the metal oxide comprises indium, gallium, and zinc.

3. A semiconductor device comprising:
an encoder comprising:
  an input neuron circuit;
  a plurality of hidden layers comprising:
    a hidden synapse circuit;
    a hidden error circuit; and
    a hidden neuron circuit;
  an output synapse circuit;
  an output error circuit; and
  an output neuron circuit,
wherein each of the hidden synapse circuit and the output synapse circuit comprises an analog memory including a transistor and a capacitor,
wherein the transistor comprises a first gate electrode, a second gate electrode and a metal oxide,
wherein the metal oxide is over the first gate electrode,
wherein an insulating film is over the metal oxide,
wherein an opening of the insulating film overlaps the metal oxide,
wherein the second gate electrode is in the opening of the insulating film,
wherein the second gate electrode faces a side surface of the metal oxide when seen in a channel width direction of the transistor,
wherein the input neuron circuit is electrically connected to the plurality of hidden layers,
wherein the hidden synapse circuit is electrically connected to the hidden error circuit,
wherein the hidden error circuit is electrically connected to the hidden neuron circuit,
wherein the plurality of hidden layers is electrically connected to the output synapse circuit, and
wherein the output synapse circuit is electrically connected to the output error circuit and the output neuron circuit.

4. The semiconductor device according to claim 3, wherein the metal oxide comprises indium, gallium, and zinc.

5. A semiconductor device comprising:
an encoder comprising:
  an input neuron circuit;
  a plurality of hidden layers comprising:
    a hidden synapse circuit;
    a hidden error circuit; and
    a hidden neuron circuit;
  an output synapse circuit;
  an output error circuit; and
  an output neuron circuit,
wherein each of the hidden synapse circuit and the output synapse circuit comprises an analog memory including a transistor and a capacitor,
wherein the transistor comprises a gate electrode and a channel formation region including an oxide semiconductor,
wherein the gate electrode is formed to fill an opening in an insulating film,
wherein the input neuron circuit is electrically connected to the plurality of hidden layers,
wherein the hidden synapse circuit is electrically connected to the hidden error circuit,
wherein the hidden error circuit is electrically connected to the hidden neuron circuit,
wherein the plurality of hidden layers is electrically connected to the output synapse circuit, and
wherein the output synapse circuit is electrically connected to the output error circuit and the output neuron circuit.

6. The semiconductor device according to claim 5, wherein the oxide semiconductor comprises indium, gallium, and zinc.

* * * * *